(12) United States Patent
Sako et al.

(10) Patent No.: US 8,816,794 B2
(45) Date of Patent: Aug. 26, 2014

(54) SIGNAL BRANCHING FILTER, ELECTRONIC DEVICE USING THE SAME, ANTENNA APPARATUS, AND SIGNAL TRANSMISSION SYSTEM USED IN ALL OF THE ABOVE

(75) Inventors: Motohiko Sako, Osaka (JP); Susumu Fukushima, Osaka (JP); Hidenori Kitamura, Osaka (JP); Yuta Yamamoto, Osaka (JP); Takuya Hayashi, Kyoto (JP)

(73) Assignee: Panasonic Corporation, Osaka (JP)

( * ) Notice: Subject to any disclaimer, the term of this patent is extended or adjusted under 35 U.S.C. 154(b) by 882 days.

(21) Appl. No.: 12/921,577

(22) PCT Filed: Mar. 12, 2009

(86) PCT No.: PCT/JP2009/001107
§ 371 (c)(1),
(2), (4) Date: Sep. 9, 2010

(87) PCT Pub. No.: WO2009/113307
PCT Pub. Date: Sep. 17, 2009

(65) Prior Publication Data
US 2011/0038429 A1 Feb. 17, 2011

(30) Foreign Application Priority Data

Mar. 13, 2008 (JP) ................................ 2008-063672
Mar. 13, 2008 (JP) ................................ 2008-063675
Mar. 13, 2008 (JP) ................................ 2008-063676

(51) Int. Cl.
*H01P 5/12* (2006.01)

(52) U.S. Cl.
USPC .......................... 333/126; 333/129; 333/132

(58) Field of Classification Search
USPC .................................. 333/124–129, 132, 134
See application file for complete search history.

(56) References Cited

U.S. PATENT DOCUMENTS 4,761,826 A    8/1988    Kropielnicki et al.
5,247,269 A *   9/1993    Boulouard et al. ........... 333/126
(Continued)

FOREIGN PATENT DOCUMENTS

CN           1675834 A       9/2005
JP            57-136828        8/1982

(Continued)

OTHER PUBLICATIONS

International Search Report for International Application No. PCT/JP2009/001107, Jun. 23, 2009, Panasonic Corporation.

*Primary Examiner* — Robert Pascal
*Assistant Examiner* — Kimberly Glenn
(74) *Attorney, Agent, or Firm* — RatnerPrestia

(57) ABSTRACT

A signal branching filter according to the invention is a signal branching filter connected to a network having at least four terminals. The signal branching filter includes a first line one end of which is connected to a first terminal of the network, a second line one end of which is connected to a second terminal of the network, a third line one end of which is connected to a third terminal of network, and a fourth line one end of which is connected to a fourth terminal of the network. The other end of the first line and the other end of the second line are connected to each other at a first node, and the other end of the third line and the other end of the fourth line are connected to each other at a second node. When a signal is received from the first node, a phase difference between a phase of a signal appearing on a second node side of the third line and a phase of a signal appearing on a second node side of the fourth line is almost 180°±360°*n is an integer equal to or larger than 0).

12 Claims, 31 Drawing Sheets

(56) References Cited

U.S. PATENT DOCUMENTS

| | | |
|---|---|---|
| 6,381,334 B1 * | 4/2002 | Alexander .................. 381/99 |
| 7,646,262 B2 * | 1/2010 | Kannell ..................... 333/125 |
| 8,026,775 B2 * | 9/2011 | Meharry ..................... 333/132 |
| 2005/0285693 A1 | 12/2005 | Wasaki et al. |
| 2007/0298716 A1 | 12/2007 | Takei |

FOREIGN PATENT DOCUMENTS

| | | |
|---|---|---|
| JP | 57-136828 A | 9/1982 |
| JP | 61-270903 | 12/1986 |
| JP | 2007-274358 A | 10/2007 |
| WO | WO 01/45285 A1 | 6/2001 |

* cited by examiner m1
freq=473.5MHz
dB(S(3,1))=-0.799
m2
freq=766.0MHz
dB(S(3,1))=-0.333
m3
freq=473.5MHz
dB(S(3,2))=-11.649
m4
freq=766.0MHz
dB(S(3,2))=-12.968
m15
freq=473.5MHz
dB(S(2,1))=-9.632
m16
freq=766.0MHz
dB(S(2,1))=-11.924 m17
freq=473.5MHz
dB(S(6,4))=-13.325
m18
freq=766.0MHz
dB(S(6,4))=-13.493
m19
freq=473.5MHz
dB(S(6,5))=-0.220
m20
freq=766.0MHz
dB(S(6,5))=-0.715
m21
freq=473.5MHz
dB(S(5,4))=-13.170
m22
freq=766.0MHz
dB(S(5,4))=-16.332 m13
freq=473.5MHz
S(3,3)=0.316/55.086
impedance=Z0*(1.219+j0.702)

m14
freq=766.0MHz
S(3,3)=0.153/-40.663
impedance=Z0*(1.234-j0.252)

m5
freq=473.5MHz
S(4,4)=0.951/79.219
impedance=Z0*(0.061+j1.207)

m6
freq=766.0MHz
S(4,4)=0.965/-55.548
impedance=Z0*(0.081-j1.896)

m1
freq=473.5MHz
dB(S(3,1))=-0.799
m2
freq=766.0MHz
dB(S(3,1))=-0.333
m3
freq=473.5MHz
dB(S(3,2))=-11.649
m4
freq=766.0MHz
dB(S(3,2))=-12.968
m15
freq=473.5MHz
dB(S(2,1))=-9.632
m16
freq=766.0MHz
dB(S(2,1))=-11.924 m17
freq=473.5MHz
dB(S(6,4))=-13.325
m18
freq=766.0MHz
dB(S(6,4))=-13.493
m19
freq=473.5MHz
dB(S(6,5))=-0.220
m20
freq=766.0MHz
dB(S(6,5))=-0.715
m21
freq=473.5MHz
dB(S(5,4))=-13.170
m22
freq=766.0MHz
dB(S(5,4))=-16.332 m13
freq=473.5MHz
S(3,3)=0.316/55.086
impedance=Z0*(1.219+j0.702)

m14
freq=766.0MHz
S(3,3)=0.153/-40.663
impedance=Z0*(1.234-j0.252)

m5
freq=473.5MHz
S(4,4)=0.951/79.219
impedance=Z0*(0.061+j1.207)

m6
freq=766.0MHz
S(4,4)=0.965/-55.548
impedance=Z0*(0.081-j1.896)

US 8,816,794 B2

SIGNAL BRANCHING FILTER, ELECTRONIC DEVICE USING THE SAME, ANTENNA APPARATUS, AND SIGNAL TRANSMISSION SYSTEM USED IN ALL OF THE ABOVE

THIS APPLICATION IS A U.S. NATIONAL PHASE APPLICATION OF PCT INTERNATIONAL APPLICATION PCT/JP2009/001107.

TECHNICAL FIELD

The present invention, for example, a signal branching filter or a signal coupler used in an electronic part such as a cellular phone which transmits, receives, and transfers a high-frequency signal, and an electronic appliance using the signal branching filter and the signal coupler.

BACKGROUND ART

FIG. 43 is a block diagram of a conventional switch duplexer. A circuit configuration of an antenna switch duplexer in a composite terminal of a system called a 900-MHz-band GSM which is a cellular phone system serving in Europe and a system called a 1.8-GHz-band DCS will be explained as an example.

In FIG. 43, reference symbols 1001 to 1005 denote input/output ports, 1006 and 1007 denote control terminals, 1008 to 1011 denote diodes, 1012 and 1013 denote transmission lines, 1014 and 1015 denote bandpass filters, and 1016 denotes a diplexer. Diplexer 1016 is generally configured by a circuit obtained by combining low-pass filter 1016a and high-pass filter 1016b. Reference symbol HPF denotes a high-pass filter, LPF denotes a low-pass filter, and BPF denotes a bandpass filter.

An antenna (not shown) is connected to input/output port 1005. A signal caught by the antenna is distributed into a GSM-band signal and a DCS-band signal by diplexer 1016 first. Transmission lines 1012 and 1013 are set to ¼ of wavelengths in a GSM band and a DSC band. When a positive voltage is applied to control terminal 1006 to cause a current to flow, diodes 1008 and 1010 are turned on, and input/output ports 1005 and input/output port 1001 are connected to each other. Similarly, when a positive voltage is applied to control terminal 1007 to cause a current to flow, diodes 1009 and 1011 are turned on, and input/output port 1005 and input/output port 1003 are connected to each other. When no voltage is applied to control terminals 1006 and 1007, diodes 1008 to 1011 are turned off, input/output port 1005 and input/output ports 1002 and 1004 are connected to each other consequently.

In general, input/output ports 1001 and 1003 serve as ports for transmission, bandpass filters 1014 and 1015 serve as filters for limiting a reception band, and input/output ports 1002 and 1004 are used as input/output ports for reception. As prior art document information related to the invention of the application, for example, Patent Document 1 is known.

In the conventional switch duplexer, since diplexer 1016 is constituted by a circuit obtained by combining low-pass filter 1016a and high-pass filter 1016b, although diplexer 1016 can separate signals in different frequency bands from each other, diplexer 1016 cannot separate two signals each having the same frequency from each other. Since the switch duplexer constituted by control terminals 1006 and 1007, diodes 1008 to 1011, and transmission lines 1012 and 1013 can temporally select an input/output port connected to diplexer 1016 depending on the states of diodes 1008 to 1011, two signals each having the same frequency can be used while being temporally switched. However, a problem in which the two signals each having the same frequency cannot be transmitted or received at the same time is posed. This, for example, in a cellular phone system, makes a data transmission/reception speed low.

[Patent Document 1] International Publication No. 01/045285 booklet

DISCLOSURE OF THE INVENTION

The present invention provides a signal branching filter which can transmit/receive two signals each having the same frequency at the same time.

A signal branching filter according to the present invention is a signal branching filter connected to a network having at least four terminals, including a first line one end of which is connected to a first terminal of the network, a second line one end of which is connected to a second terminal of the network, a third line one end of which is connected to a third terminal of network, and a fourth line one end of which is connected to a fourth terminal of the network, wherein the other end of the first line and the other end of the second line are connected to each other at a first node, and the other end of the third line and the other end of the fourth line are connected to each other at a second node. When the signal branching filter according to the present invention receives a signal from the first node, a phase difference between a phase of a signal appearing on a second node side of the third line and a phase of a signal appearing on a second node side of the fourth line is almost $180°\pm360°*n$ (n is an integer equal to or larger than 0).

In the signal branching filter according to the present invention, when a signal is received from the first node, a phase difference between a phase of a signal appearing on the second node side of the third line and a phase of a signal appearing on the second node side of the fourth line is almost $180°\pm360°*n$ (n is an integer equal to or larger than 0), isolation between the first node and the second node can be approximately obtained. For this reason, signal exchanges between the first and second nodes and the network can be mutually independently performed. In this manner, a signal branching filter which can transmit/receive two signals each having the same frequency at the same time can be provided.

REFERENCE MARKS IN THE DRAWINGS

Figure 1:
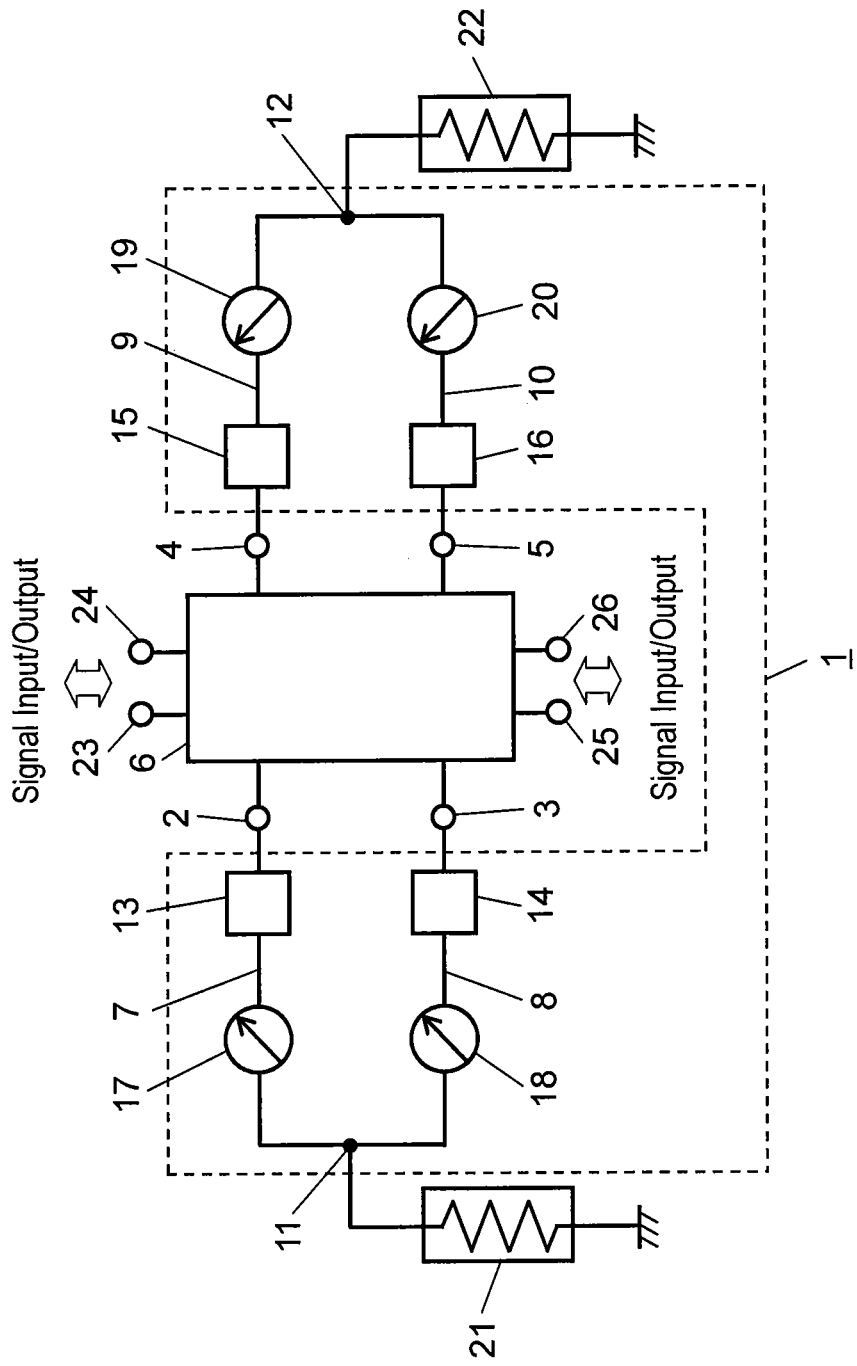
FIG. 1 is a block diagram of a signal branching filter according to Embodiment 1 of the present invention.

1 Signal branching filter
2 First terminal
3 Second terminal
4 Third terminal
5 Fourth terminal
6 Network
7 First line
8 Second line
9 Third line
10 Fourth line
11 First node
12 Second node
13 First matching circuit
14 Second matching circuit
15 Third matching circuit
16 Fourth matching circuit
17 First phase shifter
18 Second phase shifter
19 Third phase shifter
20 Fourth phase shifter
21 First load circuit
22 Second load circuit
501 Antenna apparatus
834 Ground plate
835 First element
836 Second element
837 Third element
838 Fourth element
927 Two-terminal-pair line

PREFERRED EMBODIMENTS FOR CARRYING OUT OF THE INVENTION

Embodiment 1

FIG. 1 is a block diagram of a signal branching filter according to Embodiment 1 of the present invention. In FIG.

1, signal branching filter 1 according to Embodiment 1 is signal branching filter 1 connected to network 6 having at least four terminals including first terminal 2, second terminal 3, third terminal 4, and fourth terminal 5. Signal branching filter 1 has first line 7 one end of which is connected to first terminal 2 of network 6, second line 8 one end of which is connected to second terminal 3 of network 6, third line 9 one end of which is connected to third terminal 4 of network 6, and fourth line 10 one end of which is connected to fourth terminal 5 of network 6. The other end of first line 7 and the other end of second line 8 are connected to each other at first node 11, and the other end of third line 9 and the other end of fourth line 10 are connected to each other at second node 12.

Furthermore, signal branching filter 1 according to Embodiment 1 has first matching circuit 13 and first phase shifter 17 which are connected to the middle of first line 7, second matching circuit 14 and second phase shifter 18 which are connected to the middle of second line 8, third matching circuit 15 and third phase shifter 19 which are connected to the middle of third line 9, and fourth matching circuit 16 and fourth phase shifter 20 which are connected to the middle of fourth line 10. First load circuit 21 is connected to a point between first node 11 and the ground, and second load circuit 22 is connected to a point between second node 12 and the ground.

Furthermore, network 6 has fifth terminal 23, sixth terminal 24, seventh terminal 25, and eighth terminal 26. In this case, when a signal is received from first node 11, a phase difference between a phase of a signal appearing on the second node 12 side of third line 9 and a phase of a signal appearing on the second node 12 side of fourth line 10 is almost $180°\pm360°*n$ (n is an integer equal to or larger than 0). As a matter of course, when a signal is received from second node 12, a phase difference between a phase of a signal appearing on the first node 11 side of first line 7 and a phase of a signal appearing on the first node 11 side of second line 8 is almost $180°\pm360°*n$ (n is an integer equal to or larger than 0). In order to satisfy the above conditions, line lengths of first line 7, second line 8, third line 9, and fourth line 10, first matching circuit 13, second matching circuit 14, third matching circuit 15, and fourth matching circuit 16, and first phase shifter 17, second phase shifter 18, third phase shifter 19, and fourth phase shifter 20 are designed to have appropriate values.

For this reason, for example, a signal transmitted from first load circuit 21 is not generally propagated from second node 12 to second load circuit 22 because the phase difference between the phase of the signal appearing on the second node 12 side of third line 9 and the phase of the signal appearing on the second node 12 side of fourth line 10 is almost $180°\pm360°*n$ (n is an integer equal to or larger than 0).

In contrast to this, a signal transmitted from second load circuit 22 is not generally propagated from first node 11 to first load circuit 21 because the phase difference between the phase of the signal appearing on the first node 11 side of first line 7 and the phase of the signal appearing on the first node 11 side of second line 8 is almost $180°\pm360°*n$ (n is an integer equal to or larger than 0).

Therefore, no signal is propagated between first load circuit 21 and second load circuit 22, and isolation can be assured between first load circuit 21 and second load circuit 22. For this reason, first load circuit 21 and second load circuit 22 can mutually independently perform signal exchanges with network 6. More specifically, first load circuit 21 and second load circuit 22 need not be selected with respect to time and frequency and can mutually independently perform signal exchanges.

The line lengths of first line 7, second line 8, third line 9, and fourth line 10, first matching circuit 13, second matching circuit 14, third matching circuit 15, and fourth matching circuit 16, and first phase shifter 17, second phase shifter 18, third phase shifter 19, and fourth phase shifter 20 are designed such that, when a signal is received from first node 11, an absolute value of an amplitude of a signal appearing on the second node 12 side of third line 9 and an absolute value of an amplitude of a signal appearing on the second node 12 side of fourth line 10 are almost equal to each other. Similarly, the line lengths of first line 7, second line 8, third line 9, and fourth line 10, first matching circuit 13, second matching circuit 14, third matching circuit 15, and fourth matching circuit 16, and first phase shifter 17, second phase shifter 18, third phase shifter 19, and fourth phase shifter 20 may be designed such that, when a signal is received from second node 12, an absolute value of an amplitude of the signal appearing on the first node 11 side of first line 7 and an absolute value of an amplitude of the signal appearing on the first node 11 side of second line 8 are almost equal to each other. For this reason, an advantage in which isolation between first load circuit 21 and second load circuit 22 can be made higher can be obtained.

The line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost $180°\pm360°*n$ (n is an integer equal to or larger than 0). In this case, for example, when common mode signals are inputted across first terminal 2 and second terminal 3, a phase difference between currents of the common mode signals is zero between first terminal 2 and second terminal 3. Therefore, when the signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost $180°\pm360°*n$ (n is an integer equal to or larger than 0). For this reason, at first node 11, the currents of the common mode signals are canceled out, and a common mode signal is not generally propagated from first node 11 to the first load circuit side.

In contrast to this, for example, when differential mode signals are inputted across first terminal 2 and second terminal 3, a phase difference between the differential mode signals is $\pm180°$. Therefore, when signals having a phase difference of $\pm180°$ and equal absolute values of amplitudes are inputted to first terminal 2 and second terminal 3, respectively, the difference between the phase of the signal appearing on the first node 11 side of first line 7 and the phase of the signal appearing on the first node 11 side of second line 8 is almost $0°\pm360°*n$ (n is an integer equal to or larger than 0). For this reason, at first node 11, the currents of the differential mode signals are summed up, and the signal is generally propagated from first node 11 to the first load circuit side.

As described above, when signal branching filter 1 is designed such that, when signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost $180°\pm360°*n$ (n is an integer equal to or larger than 0), only differential mode signals generated between first terminal 2 and second terminal 3 can be selected and propagated to first load circuit 21.

Furthermore, when the condition in which the difference between the phase of the signal appearing on the first node 11 side of first line 7 and the phase of the signal appearing on the first node 11 side of second line 8 is almost $180°\pm360°*n$ (n is an integer equal to or larger than 0) when signals each having the same phase and the same amplitude are inputted to first terminal 2 and second terminal 3, respectively and the condition in which the phase difference between the phase of the signal appearing on the second node 12 side of third line 9 and the phase of the signal appearing on the second node 12 side of fourth line 10 is almost 180° when a signal is received from first node 11 are considered, a difference between a change in phase from first terminal 2 to second node 12 and a change in phase from second terminal 3 to second node 12 becomes zero. More specifically, currents of common mode signals generated between first terminal 2 and second terminal 3 are summed up in the same phase at second node 12, and the signals are generally propagated from second node 12 to the second load circuit 22 side.

In contrast to this, the currents of the differential mode signals generated between first terminal 2 and second terminal 3 are summed up in reversed phases at second node 12 and canceled out, and the signals are not generally propagated from second node 12 to the second load circuit 22 side. Therefore, the differential mode signals generated between first terminal 2 and second terminal 3 are generally propagated to only the first load circuit 21 side, and the common mode signals generated between first terminal 2 and second terminal 3 are generally propagated to only the second load circuit 22 side.

More specifically, signal branching filter 1 according to Embodiment 1 can independently extract the signals of the two modes generated between first terminal 2 and second terminal 3. In this case, the line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the absolute value of the amplitude of the signal appearing on the first node 11 side of first line 7 and the absolute value of the amplitude of the signal appearing on the first node 11 side of second line 8 are almost equal to each other. For this reason, currents of common mode signals appearing at first node 11 can be accurately canceled out, and a ratio of differential mode signal components of signals propagated from first node 11 to the first load circuit 21 side can be improved.

Similarly, the line lengths of third line 9 and fourth line 10, third matching circuit 15 and fourth matching circuit 16, and third phase shifter 19 and fourth phase shifter 20 may be designed such that, when signals having a phase difference of 180° and equal absolute values of amplitudes are inputted to first terminal 2 and second terminal 3, respectively, the absolute value of the amplitude of the signal appearing on the second node 12 side of third line 9 and the absolute value of the amplitude of the signal appearing on the second node 12 side of fourth line 10 are almost equal to each other. For this reason, currents of differential mode signals appearing at second node 12 can be accurately canceled out, and a ratio of common mode signal components of signals propagated from second node 12 to the second load circuit 22 side can be improved.

The line lengths of first line 7 and second line 8, first matching circuit 13 and second matching circuit 14, and first phase shifter 17 and second phase shifter 18 may be designed such that a change in phase from first terminal 2 to first node 11 is almost $90°\pm360°*n$ (n is an integer equal to or larger than 0) and a change in phase from second terminal 3 to first node 11 is almost $-90°\pm360°*n$ (n is an integer equal to or larger than 0).

For example, when common mode signals are generated between first terminal 2 and second terminal 3, the change in phase from first terminal 2 to first node 11 is $90°\pm360°*n$ (n is an integer equal to or larger than 0) and the change in phase from second terminal 3 to first node 11 is almost $-90°\pm360°*n$ (n is an integer equal to or larger than 0). For this reason, the common mode signals are canceled out at first node 11.

More specifically, for the common mode signals, first node 11 is an imaginably grounded place. The changes in phase from imaginably grounded first node 11 to first terminal 2 and second terminal 3 are 90° and -90°, respectively, so that input impedances obtained when the first node 11 side is viewed from first terminal 2 and second terminal 3 become infinite.

Therefore, the common mode signals generated between first terminal 2 and second terminal 3 are generally propagated to the second node 12 side but not generally propagated to the first node 11 side. In this manner, a ratio of common mode signals to differential mode signals propagated to second load circuit 22 can be more improved, and a ratio of differential mode signals to common mode signals propagated to first load circuit 21 can be more improved.

Furthermore, in this condition, the line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the absolute value of the amplitude of the signal appearing on the first node 11 side of first line 7 and the absolute value of the amplitude of the signal appearing on the first node 11 side of second line 8 are almost equal to each other. For this reason, currents of common mode signals appearing at first node 11 can be accurately canceled out, and a ratio of differential mode signal components of signals propagated from first node 11 to the first load circuit 21 side can be improved.

The line lengths of third line 9 and fourth line 10, third matching circuit 15 and fourth matching circuit 16, and first phase shifter 17 and second phase shifter 18 may be designed such that the change in phase from first terminal 2 to second node 12 is almost $+90°\pm180°*n$ (n is an integer equal to or larger than 0) and the change in phase from second terminal 3 to second node 12 is almost $+90°\pm180°*n$ (n is an integer equal to or larger than 0).

In this manner, for example, when differential mode signals are generated between first terminal 2 and second terminal 3, the change in phase from first terminal 2 to second node 12 and the change in phase from second terminal 3 to second node 12 are equal to each other. For this reason, differential mode signals are canceled out at second node 12. More specifically, for the differential mode signals, second node 12 is an imaginably grounded place.

The changes in phase from imaginably grounded second node 12 to first terminal 2 and second terminal 3 are 90° each, so that input impedances obtained when the second node 12 side is viewed from first terminal 2 and second terminal 3 become infinite. Therefore, the differential mode signals generated between first terminal 2 and second terminal 3 are generally propagated to the first node 11 side but not generally propagated to the second node 12 side. In this manner, a ratio of differential mode signals to common mode signals propagated to first load circuit 21 can be improved, and a ratio of common mode signals to differential mode signals propagated to second load circuit 22 can be improved.

Furthermore, in this condition, the line lengths of third line 9 and fourth line 10, third matching circuit 15 and fourth matching circuit 16, and third phase shifter 19 and fourth phase shifter 20 may be designed such that, when signals having a phase difference of 180° and equal absolute values of amplitudes are inputted to first terminal 2 and second terminal 3, respectively, the absolute value of the amplitude of the signal appearing on the second node 12 side of third line 9 and the absolute value of the amplitude of the signal appearing on the second node 12 side of fourth line 10 are almost equal to each other. For this reason, currents of differential mode signals appearing at second node 12 can be accurately canceled out, and a ratio of common mode signals to differential mode signals propagated from second node 12 to the second load circuit 22 side can be improved.

The line lengths of third line 9 and fourth line 10, third matching circuit 15 and fourth matching circuit 16, and third phase shifter 19 and fourth phase shifter 20 may be designed such that a change in phase from third terminal 4 to second node 12 is almost +90°±180°*n (n is an integer equal to or larger than 0) and a difference in phase from fourth terminal 5 to second node 12 is almost +90°±180°*n (n is an integer equal to or larger than 0).

For this reason, for example, when differential mode signals are generated between third terminal 4 and fourth terminal 5, a change in phase from third terminal 4 to second node 12 and a change in phase from fourth terminal 5 to second node 12 are equal to each other. For this reason, the differential mode signals are canceled out at second node 12. More specifically, for the differential mode signals, second node 12 is an imaginably grounded place. The changes in phase from imaginably grounded second node 12 to third terminal 4 and fourth terminal 5 are 90°, so that input impedances obtained when the second node 12 side is viewed from third terminal 4 and fourth terminal 5 become infinite. Therefore, the differential mode signals generated between third terminal 4 and fourth terminal 5 are generally propagated to the first node 11 side but not generally propagated to the second node 12 side. In this manner, a ratio of differential mode signals to common mode signals propagated to first load circuit 21 can be improved, and a ratio of common mode signals to differential mode signals propagated to second load circuit 22 can be improved.

Furthermore, in this condition, the line lengths of third line 9 and fourth line 10, third matching circuit 15 and fourth matching circuit 16, and third phase shifter 19 and fourth phase shifter 20 may be designed such that, when signals having a phase difference of 180° and equal absolute values of amplitudes are inputted to third terminal 4 and fourth terminal 5, respectively, the absolute value of the amplitude of the signal appearing on the second node 12 side of third line 9 and the absolute value of the amplitude of the signal appearing on the second node 12 side of fourth line 10 are almost equal to each other. For this reason, currents of differential mode signals appearing at second node 12 can be accurately canceled out, and a ratio of common mode signals to differential mode signals propagated from second node 12 to the second load circuit 22 side can be improved.

In FIG. 1, at least one of first matching circuit 13, second matching circuit 14, third matching circuit 15, fourth matching circuit 16, first phase shifter 17, second phase shifter 18, third phase shifter 19, and fourth phase shifter 20 may be eliminated. In this manner, transmission losses on first line 7, second line 8, third line 9, and fourth line 10 can be reduced, the number of required parts can be reduced, and reductions in size and weight can be achieved. If necessary, a matching circuit may be connected to at least one of a line between first node 11 and first load circuit 21 and a line between second node 12 and second load circuit 22. Therefore, matching states between signal branching filter 1 and first load circuit 21 according to the embodiment and between signal branching filter 1 and second load circuit 22 according to the embodiment can be made preferable, and reflection losses therebetween can be reduced. As a result, communication quality of the electronic appliance can be made preferable.

First matching circuit 13, second matching circuit 14, third matching circuit 15, fourth matching circuit 16, first phase shifter 17, second phase shifter 18, third phase shifter 19, and fourth phase shifter 20 are basically designed as circuits of reactance elements. However, when a signal is received from first node 11, in order to satisfy a condition in which an absolute value of an amplitude of a signal appearing on the second node 12 side of third line 9 and an absolute value of an amplitude of a signal appearing on the second node 12 side of fourth line 10 are equal to each other, the matching circuits and the phase shifters may be designed as circuits including a resistance element and an amplifying circuit (for example, a configuration or the like in which first line 7 has a transmission path and a reception path which have a transmission amplifying circuit and a reception amplifying circuit, respectively). For this reason, a high isolation characteristic between first load circuit 21 and second load circuit 22 can be realized, and a transmission/reception characteristic of an electronic appliance (not shown) using signal branching filter 1 can be improved.

In FIG. 1, although signals are inputted and outputted from/to fifth terminal 23, sixth terminal 24, seventh terminal 25, and eighth terminal 26, the number of input/output terminals is not limited to this. A signal may only be inputted/outputted from at least one input/output terminal.

Embodiment 2

Figure 2:
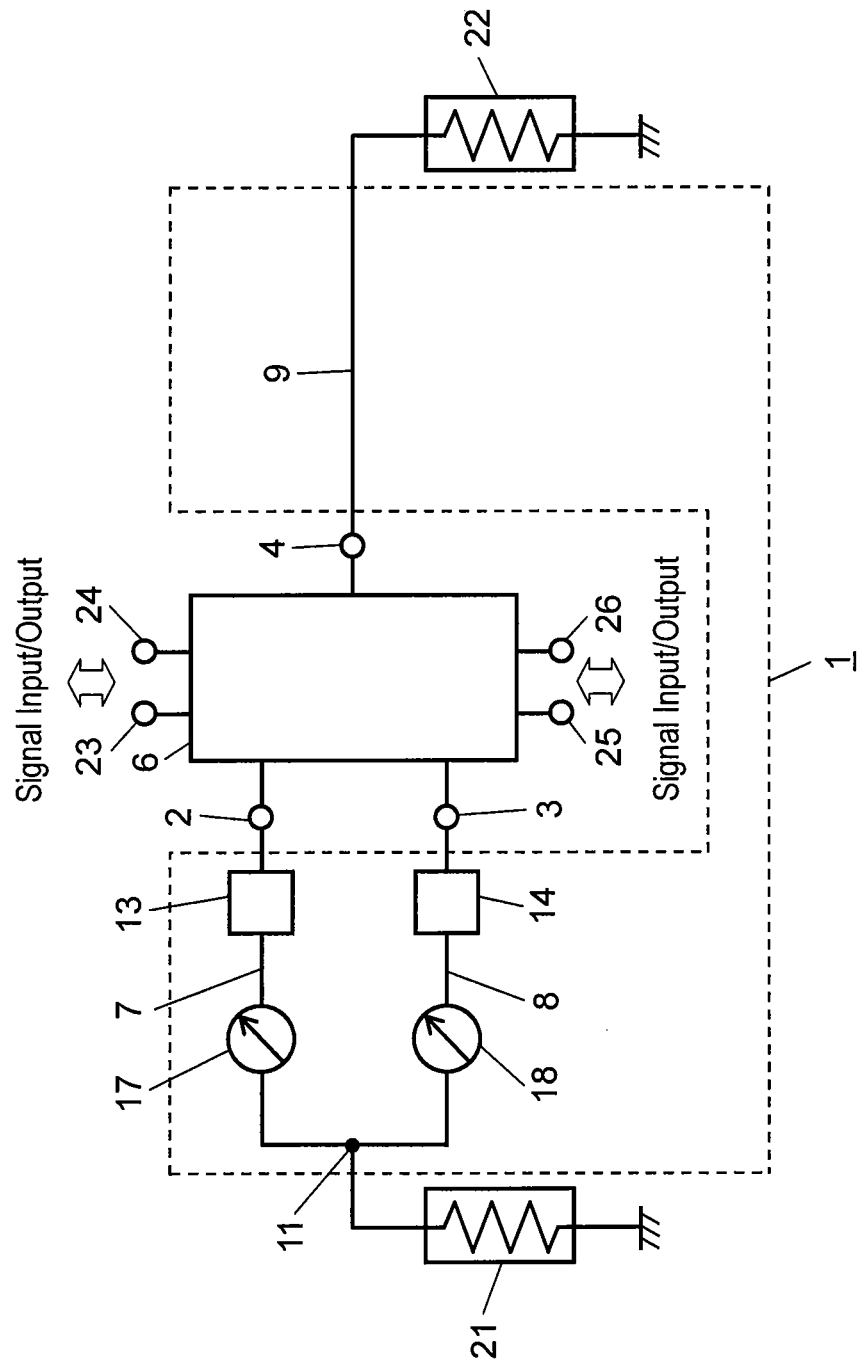
FIG. 2 is a block diagram of a signal branching filter according to Embodiment 2 of the present invention.

FIG. 2 is a block diagram of a signal branching filter according to Embodiment 2 of the present invention. With respect to the same configuration as that of Embodiment 1, only the same reference numerals are described, and a different configuration will be mainly described below.

In FIG. 2, signal branching filter 1 according to Embodiment 2 is signal branching filter 1 connected to network 6 having at least three terminals. Signal branching filter 1 has first line 7 one end of which is connected to first terminal 2 of network 6, second line 8 one end of which is connected to second terminal 3 of network 6, and third line 9 one end of which is connected to third terminal 4 of network 6. The other end of first line 7 and the other end of second line 8 are connected to first node 11.

The line lengths of first line 7, second line 8, and third line 9, first matching circuit 13, second matching circuit 14, and third matching circuit 15, and first phase shifter 17, second phase shifter 18, and third phase shifter 19 may be designed such that, when signals are received from the other end of third line 9, a difference between a phase of a signal appearing on a first node 11 side of first line 7 and a phase of a signal appearing on the first node 11 side of second line 8 is almost 180°±360°*n (n is an integer equal to or larger than 0).

For this reason, for example, a signal transmitted from first load circuit 21 is not generally propagated to the second load circuit 22 side because the signal is canceled out on the other end side of third line 9 and third terminal. In contrast to this, a signal transmitted from second load circuit 22 is not generally propagated from first node 11 to the first load circuit 21 side because the phase difference between the phase of the signal appearing on the first node 11 side of first line 7 and the phase of the signal appearing on the first node 11 side of second line 8 is almost 180°±360°*n (n is an integer equal to or larger than 0).

Therefore, no signal is propagated between first load circuit 21 and second load circuit 22, and isolation can be assured between first load circuit 21 and second load circuit 22. For this reason, first load circuit 21 and second load circuit 22 can mutually independently perform signal exchanges with network 6. More specifically, first load circuit 21 and second load circuit 22 can mutually independently exchange signals without being selected with respect to time and frequency. Since signal branching filter 1 according to Embodiment 2, in comparison with signal branching filter 1 according to Embodiment 1, can reduce the number of lines which connect third terminal 4 and second load circuit 22, the number of matching circuits, and the number of phase shifters, reductions in size and weight can be achieved.

The line lengths of first line 7 and second line 8, first matching circuit 13 and second matching circuit 14, and first phase shifter 17 and second phase shifter 18 may be designed such that, when signals are received from the other end of third line 9, a difference between the phase of the signal appearing on the first node 11 side of first line 7 and the phase of the signal appearing on the first node 11 side of second line 8 is almost equal to each other. For this reason, an advantage in which isolation between first load circuit 21 and second load circuit 22 can be made higher can be obtained.

The line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost 180°±360°*n (n is an integer equal to or larger than 0). In this case, for example, when common mode signals are inputted across first terminal 2 and second terminal 3, a phase difference between currents of the common mode signals is zero between first terminal 2 and second terminal 3. Therefore, when the signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost 180°±360°*n (n is an integer equal to or larger than 0). For this reason, at first node 11, the currents of the common mode signals are canceled out, and a common mode signal is not generally propagated from first node 11 to the first load circuit side.

In contrast to this, for example, when differential mode signals are inputted across first terminal 2 and second terminal 3, a phase difference between currents of the differential mode signals is ±180° between first terminal 2 and second terminal 3. Therefore, when signals having a phase difference of ±180° and each having the same amplitude are inputted to first terminal 2 and second terminal 3, respectively, the difference between the phase of the signal appearing on the first node 11 side of first line 7 and the phase of the signal appearing on the first node 11 side of second line 8 is almost 0°±360°*n (n is an integer equal to or larger than 0). For this reason, at first node 11, the currents of the differential mode signals are summed up, and the differential mode signals are generally propagated from first node 11 to the first load circuit side.

As described above, when signal branching filter 1 is designed such that, when signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost 180°±360°*n (n is an integer equal to or larger than 0), only differential mode signals generated between first terminal 2 and second terminal 3 can be selected and propagated to first load circuit 21.

Furthermore, when the condition in which the difference between the phase of the signal appearing on the first node 11 side of first line 7 and the phase of the signal appearing on the first node 11 side of second line 8 is almost 180°±360°*n (n is an integer equal to or larger than 0) when signals each having the same phase and the same amplitude are inputted to first terminal 2 and second terminal 3, respectively and the condition in which the phase difference between the phase of the signal appearing on the first node 11 side of first line 7 and the phase of the signal appearing on the first node 11 side of second line 8 is almost 180° when a signal is received from the other of the third line are considered, a difference between a change in phase from first terminal 2 to second node 12 and a change in phase from second terminal 3 to second node 12 becomes zero. More specifically, currents of common mode signals generated between first terminal 2 and second terminal 3 are summed up in the same phase at third terminal 4, and the signals are generally propagated to the second load circuit 22 side. In contrast to this, the currents of the differential mode signals generated between first terminal 2 and second terminal 3 are summed up in reversed phases at third terminal 4 and canceled out, and the signals are not generally propagated to the second load circuit 22 side. Therefore, the differential mode signals generated between first terminal 2 and second terminal 3 are generally propagated to only the first load circuit 21 side, and the common mode signals generated between first terminal 2 and second terminal 3 are generally propagated to only the second load circuit 22 side.

More specifically, signal branching filter 1 according to Embodiment 2 can independently extract the signals of the two modes generated between first terminal 2 and second terminal 3. In this case, the line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the absolute value of the amplitude of the signal appearing on the first node 11 side of first line 7 and the absolute value of the amplitude of the signal appearing on the first node 11 side of second line 8 are almost equal to each other.

For this reason, currents of common mode signals appearing at first node 11 can be accurately canceled out, and a ratio of differential mode signals to common mode signals propagated from first node 11 to the first load circuit 21 side to can be improved.

The line lengths of first line 7 and second line 8, first matching circuit 13 and second matching circuit 14, and first phase shifter 17 and second phase shifter 18 may be designed such that a change in phase from first terminal 2 to first node 11 is almost 90°±360°*n (n is an integer equal to or larger than 0) and a change in phase from second terminal 3 to first node 11 is −90°±360°*n (n is an integer equal to or larger than 0).

For example, when common mode signals are generated between first terminal 2 and second terminal 3, the change in phase from first terminal 2 to first node 11 is almost 90°±360°*n (n is an integer equal to or larger than 0) and the change in phase from second terminal 3 to first node 11 is −90°±360°*n (n is an integer equal to or larger than 0). For this reason, at first node 11, the common mode signals are canceled out. More specifically, for the common mode signals, first node 11 is an imaginably grounded place. The changes in phase from imaginably grounded first node 11 to first terminal 2 and second terminal 3 are 90° and −90°, respectively, so that input impedances obtained when the first node 11 side is viewed from first terminal 2 and second terminal 3 become infinite. Therefore, the common mode signals generated between first terminal 2 and second terminal 3 are generally propagated to the second node 12 side but not generally propagated to the first node 11 side.

In this manner, a ratio of differential mode signals to common mode signals propagated to first load circuit 21 can be improved, and a ratio of common mode signals to differential mode signals propagated to second load circuit 22 can be improved.

Furthermore, in this conditions, the line lengths of first line 7 and second line 8, first matching circuit 13 and second matching circuit 14, and first phase shifter 17 and second phase shifter 18 may be designed such that, when signals having the same phase and the same amplitude are inputted to first terminal 2 and second terminal 3, respectively, the absolute value of the amplitude of the signal appearing on the first node 11 side of first line 7 and the absolute value of the amplitude of the signal appearing on the first node 11 side of second line 8 are almost equal to each other. For this reason, currents of common mode signals appearing at first node 11 can be accurately canceled out, and a ratio of differential mode signal components to signals propagated from first node 11 to the first load circuit 21 side can be improved.

In FIG. 2, at least one of first matching circuit 13, second matching circuit 14, first phase shifter 17, and second phase shifter 18 may be eliminated. In this manner, transmission losses on first line 7 and second line 8 can be reduced, the number of required parts can be reduced, and reductions in size and weight can be achieved.

If necessary, a matching circuit may be connected to at least one of a line between first node 11 and first load circuit 21 and a line between third terminal 4 and second load circuit 22. Therefore, matching states between signal branching filter 1 and first load circuit 21 according to the embodiment and between signal branching filter 1 and second load circuit 22 according to the embodiment can be made preferable, and reflection losses therebetween can be reduced. As a result, communication quality of the electronic appliance can be made preferable.

First matching circuit 13, second matching circuit 14, first phase shifter 17, and second phase shifter 18 are basically designed as circuits of reactance elements. However, when a signal is received from the other end of third line 9, in order to satisfy a condition in which an absolute value of an amplitude of a signal appearing on the first node 11 side of first line 7 and an absolute value of an amplitude of a signal appearing on the first node 11 side of second line 8 are equal to each other, the matching circuits and the phase shifters may be designed as circuits including a resistance element and an amplifying circuit (for example, a configuration or the like in which first line 7 has a transmission path and a reception path which have a transmission amplifying circuit and a reception amplifying circuit, respectively). For this reason, a high isolation characteristic between first load circuit 21 and second load circuit 22 can be realized, and a transmission/reception characteristic of an electronic appliance using signal branching filter 1 can be improved.

In FIG. 2, although signals are inputted and outputted from/to fifth terminal 23, sixth terminal 24, seventh terminal 25, and eighth terminal 26, the number of input/output terminals is not limited to this. A signal may only be inputted/outputted from at least one input/output terminal.

Embodiment 3

Figure 3:
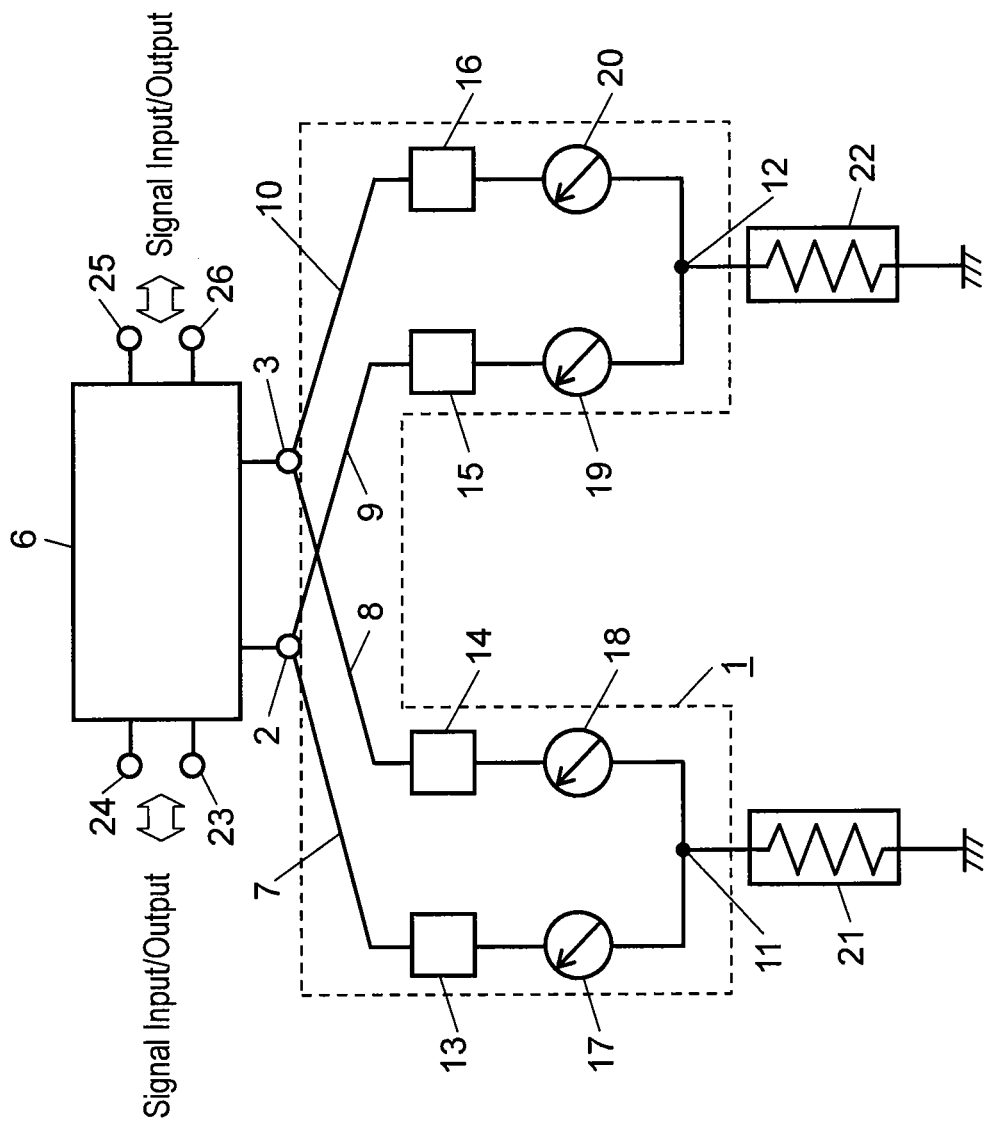
FIG. 3 is a block diagram of signal branching filter 1 according to Embodiment 3 of the present invention.

FIG. 3 is a block diagram of signal branching filter 1 according to Embodiment 3 of the present invention. With respect to the same configuration as that of Embodiment 1, only the same reference numerals are described, and a different configuration will be mainly described below.

In FIG. 3, signal branching filter 1 according to Embodiment 3 has first line 7 one end of which is connected to first terminal 2, third line 9 one end of which is connected to first terminal 2, second line 8 one end of which is connected to second terminal 3, and fourth line 10 one end of which is connected to second terminal 3. The other end of first line 7 and the other end of second line 8 are connected to first node 11, and the other end of third line 9 and the other end of fourth line 10 are connected to second node 12.

The line lengths of first line 7, second line 8, third line 9, and fourth line 10, first matching circuit 13, second matching circuit 14, third matching circuit 15, and fourth matching circuit 16, and first phase shifter 17, second phase shifter 18, third phase shifter 19, and fourth phase shifter 20 may be designed such that, when a signal is received from first node 11, a phase difference between a phase of a signal appearing on the second node 12 side of third line 9 and a phase of a signal appearing on the second node 12 side of fourth line 10 is almost 180°±360*n (n is an integer equal to or larger than 0).

For this reason, for example, a signal transmitted from first load circuit 21 is not generally propagated from second node 12 to the second load circuit 22 side because the phase difference between the phase of the signal appearing on the second node 12 side of third line 9 and the phase of the signal appearing on the second node 12 side of fourth line 10 is almost 180°±360°*n (n is an integer equal to or larger than 0).

In contrast to this, a signal transmitted from second load circuit 22 is not generally propagated from first node 11 to the first load circuit 21 side because the phase difference between the phase of the signal appearing on the first node 11 side of first line 7 and the phase of the signal appearing on the first node 11 side of second line 8 is almost 180°±360°*n (n is an integer equal to or larger than 0).

Therefore, no signal is propagated between first load circuit 21 and second load circuit 22, and isolation can be assured between first load circuit 21 and second load circuit 22.

For this reason, first load circuit 21 and second load circuit 22 can mutually independently perform signal exchanges with network 6. More specifically, first load circuit 21 and second load circuit 22 need not be selected with respect to time and frequency and can mutually independently perform signal exchanges. Signal branching filter 1 according to Embodiment 3 can be connected to network 6 with only two connection terminals. In comparison with signal branching filter 1 according to Embodiment 1 or 2, a structure can be simplified.

The line lengths of first line 7, second line 8, third line 9, and fourth line 10, first matching circuit 13, second matching circuit 14, third matching circuit 15, and fourth matching circuit 16, first phase shifter 17, second phase shifter 18, third phase shifter 19, and fourth phase shifter 20 may be designed such that, when a signal is received from first node 11, an absolute value of an amplitude of a signal appearing on the second node 12 side of third line 9 and an absolute value of an amplitude of a signal appearing on the second node 12 side of fourth line 10 are almost equal to each other.

Similarly, the line lengths of first line 7, second line 8, third line 9, and fourth line 10, first matching circuit 13, second matching circuit 14, third matching circuit 15, and fourth matching circuit 16, and first phase shifter 17, second phase shifter 18, third phase shifter 19, and fourth phase shifter 20 may be designed such that, when a signal is received from second node 12, an absolute value of an amplitude of the signal appearing on the first node 11 side of first line 7 and an absolute value of the amplitude of the signal appearing on the first node 11 side of second line 8 are almost equal to each other. For this reason, an advantage in which isolation between first load circuit 21 and second load circuit 22 can be made higher can be obtained.

The line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost $180°\pm360°*n$ (n is an integer equal to or larger than 0). In this case, for example, when common mode signals are inputted across first terminal 2 and second terminal 3, a phase difference between currents of the common mode signals is zero between first terminal 2 and second terminal 3.

Therefore, when the signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost $180°\pm360°*n$ (n is an integer equal to or larger than 0). For this reason, at first node 11, the currents of the common mode signals are canceled out, and a common mode signal is not generally propagated from first node 11 to the first load circuit side.

In contrast to this, for example, when differential mode signals are inputted across first terminal 2 and second terminal 3, a phase difference between currents of the differential mode signals is $\pm180°$ between first terminal 2 and second terminal 3. Therefore, when signals having a phase difference of $\pm180°$ and each having the same amplitude value of an amplitude are inputted to first terminal 2 and second terminal 3, respectively, the difference between the phase of the signal appearing on the first node 11 side of first line 7 and the phase of the signal appearing on the first node 11 side of second line 8 is almost $0°\pm360°*n$ (n is an integer equal to or larger than 0). For this reason, at first node 11, the currents of the differential mode signals are summed up, and the differential mode signals are generally propagated from first node 11 to the first load circuit side.

As described above, when signal branching filter 1 is designed such that, when signals each having the same phase and the same amplitude are inputted to first terminal 2 and second terminal 3, respectively, the difference between the phase of the signal appearing on the first node 11 side of first line 7 and the phase of the signal appearing on the first node 11 side of second line 8 is almost $180°\pm360°*n$ (n is an integer equal to or larger than 0), only differential mode signals generated between first terminal 2 and second terminal 3 can be selected and propagated to first load circuit 21.

Furthermore, when the condition in which the difference between the phase of the signal appearing on the first node 11 side of first line 7 and the phase of the signal appearing on the first node 11 side of second line 8 is almost $180°\pm360°*n$ (n is an integer equal to or larger than 0) when signals each having the same phase and the same amplitude are inputted to first terminal 2 and second terminal 3, respectively and the condition in which the phase difference between the phase of the signal appearing on the second node 12 side of third line 9 and the phase of the signal appearing on the second node 12 side of fourth line 10 is almost $180°$ when a signal is received from first node 11 are considered, a difference between a change in phase from first terminal 2 to second node 12 and a change in phase from second terminal 3 to second node 12 becomes zero.

More specifically, currents of common mode signals generated between first terminal 2 and second terminal 3 are summed up in the same phase at second node 12, and the signals are generally propagated from second node 12 to the second load circuit 22 side.

In contrast to this, the currents of the differential mode signals generated between first terminal 2 and second terminal 3 are summed up in reversed phases at second node 12 and canceled out, and the signals are not generally propagated from second node 12 to the second load circuit 22 side.

Therefore, the differential mode signals generated between first terminal 2 and second terminal 3 are generally propagated to only the first load circuit 21 side, and the common mode signals generated between first terminal 2 and second terminal 3 are generally propagated to only the second load circuit 22 side. More specifically, signal branching filter 1 according to Embodiment 3 can independently extract the signals of the two modes generated between first terminal 2 and second terminal 3.

In this case, the line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the absolute value of the amplitude of the signal appearing on the first node 11 side of first line 7 and the absolute value of the amplitude of the signal appearing on the first node 11 side of second line 8 are almost equal to each other. For this reason, currents of common mode signals appearing at first node 11 can be accurately canceled out, and a ratio of differential mode signals to common mode signals propagated from first node 11 to the first load circuit 21 side to can be improved.

Similarly, the line lengths of third line 9 and fourth line 10, third matching circuit 15 and fourth matching circuit 16, and third phase shifter 19 and fourth phase shifter 20 may be designed such that, when signals having a phase difference of $180°$ and the same amplitudes are inputted to first terminal 2 and second terminal 3, respectively, the absolute value of the amplitude of the signal appearing on the second node 12 side of third line 9 and the absolute value of the amplitude of the signal appearing on the second node 12 side of fourth line 10 are almost equal to each other. For this reason, currents of differential mode signals appearing at second node 12 can be more accurately canceled out, and a ratio of common mode signals to differential mode signals propagated from second node 12 to the second load circuit 22 side can be improved.

The line lengths of first line 7 and second line 8, first matching circuit 13 and second matching circuit 14, and first phase shifter 17 and second phase shifter 18 may be designed such that a change in phase from first terminal 2 to first node 11 is almost $90°\pm360°*n$ (n is an integer equal to or larger than 0) and a change in phase from second terminal 3 to first node 11 is almost −90°±360°*n (n is an integer equal to or larger than 0).

For example, when common mode signals are generated between first terminal 2 and second terminal 3, the change in phase from first terminal 2 to first node 11 is 90°±360°*n (n is an integer equal to or larger than 0) and the change in phase from second terminal 3 to first node 11 is almost −90°±360°*n (n is an integer equal to or larger than 0). For this reason, the common mode signals are canceled out at first node 11.

More specifically, for the common mode signals, first node 11 is an imaginably grounded place. The changes in phase from imaginably grounded first node 11 to first terminal 2 and second terminal 3 are 90° and −90°, respectively, so that input impedances obtained when the first node 11 side is viewed from first terminal 2 and second terminal 3 become infinite.

Therefore, the common mode signals generated between first terminal 2 and second terminal 3 are generally propagated to the second node 12 side but not generally propagated to the first node 11 side. In this manner, a ratio of common mode signals to differential mode signals propagated to second load circuit 22 can be more improved, and a ratio of differential mode signals to common mode signals propagated to first load circuit 21 can be more improved.

Furthermore, in this condition, the line lengths of first line 7 and second line 8, first matching circuit 13 and second matching circuit 14, and first phase shifter 17 and second phase shifter 18 may be designed such that, when signals each having the same phase and the same amplitude are inputted to first terminal 2 and second terminal 3, respectively, the absolute value of the amplitude of the signal appearing on the first node 11 side of first line 7 and the absolute value of the amplitude of the signal appearing on the first node 11 side of second line 8 are almost equal to each other. For this reason, currents of common mode signals appearing at first node 11 can be more accurately canceled out, and a ratio of differential mode signals to common mode signals propagated from first node 11 to the first load circuit 21 side can be improved.

The line lengths of third line 9 and fourth line 10, third matching circuit 15 and fourth matching circuit 16, and third phase shifter 19 and fourth phase shifter 20 may be designed such that the change in phase from first terminal 2 to second node 12 is almost +90°±180°*n (n is an integer equal to or larger than 0) and the change in phase from second terminal 3 to second node 12 is almost +90°±180°*n (n is an integer equal to or larger than 0).

In this manner, for example, when differential mode signals are generated between first terminal 2 and second terminal 3, the change in phase from first terminal 2 to second node 12 and the change in phase from second terminal 3 to second node 12 are equal to each other. For this reason, differential mode signals are canceled out at second node 12.

More specifically, for the differential mode signals, second node 12 is an imaginably grounded place. The changes in phase from imaginably grounded second node 12 to first terminal 2 and second terminal 3 are 90° each, so that input impedances obtained when the second node 12 side is viewed from first terminal 2 and second terminal 3 become infinite.

Therefore, the differential mode signals generated between first terminal 2 and second terminal 3 are generally propagated to the first node 11 side but not generally propagated to the second node 12 side. In this manner, a ratio of differential mode signals to common mode signals propagated to first load circuit 21 can be improved, and a ratio of common mode signals to differential mode signals propagated to second load circuit 22 can be more improved.

Furthermore, in this condition, the line lengths of third line 9 and fourth line 10, third matching circuit 15 and fourth matching circuit 16, and third phase shifter 19 and fourth phase shifter 20 may be designed such that, when signals having a phase difference of 180° and equal absolute values of amplitudes are inputted to first terminal 2 and second terminal 3, respectively, the absolute value of the amplitude of the signal appearing on the second node 12 side of third line 9 and the absolute value of the amplitude of the signal appearing on the second node 12 side of fourth line 10 are almost equal to each other. For this reason, currents of differential mode signals appearing at second node 12 can be accurately canceled out, and a ratio of common mode signals to differential mode signals propagated from second node 12 to the second load circuit 22 side can be improved.

In FIG. 3, at least one of first matching circuit 13, second matching circuit 14, third matching circuit 15, fourth matching circuit 16, first phase shifter 17, second phase shifter 18, third phase shifter 19, and fourth phase shifter 20 may be eliminated. In this manner, transmission losses on first line 7, second line 8, third line 9, and fourth line 10 can be reduced, the number of required parts can be reduced, and reductions in size and weight can be achieved.

If necessary, a matching circuit may be connected to at least one of a line between first node 11 and first load circuit 21 and a line between second node 12 and second load circuit 22. Therefore, matching states between signal branching filter 1 and first load circuit 21 according to the embodiment and between signal branching filter 1 and second load circuit 22 according to the embodiment can be made preferable, and reflection losses therebetween can be reduced. As a result, communication quality of the electronic appliance can be made preferable.

First matching circuit 13, second matching circuit 14, third matching circuit 15, fourth matching circuit 16, first phase shifter 17, second phase shifter 18, third phase shifter 19, and fourth phase shifter 20 are basically designed as circuits of reactance elements. However, when a signal is received from first node 11, in order to satisfy a condition in which an absolute value of an amplitude of a signal appearing on the second node 12 side of third line 9 and an absolute value of an amplitude of a signal appearing on the second node 12 side of fourth line 10 are equal to each other, the matching circuits and the phase shifters may be designed as circuits including a resistance element and an amplifying circuit (for example, a configuration or the like in which first line 7 has a transmission path and a reception path which have a transmission amplifying circuit and a reception amplifying circuit, respectively). For this reason, a high isolation characteristic between first load circuit 21 and second load circuit 22 can be realized, and a transmission/reception characteristic of an electronic appliance can be improved.

In FIG. 3, although signals are inputted and outputted from/to fifth terminal 23, sixth terminal 24, seventh terminal 25, and eighth terminal 26, the number of input/output terminals is not limited to this. A signal may only be inputted/outputted from at least one input/output terminal.

Embodiment 4

In Embodiment 4, an antenna apparatus serving as an example of an electronic appliance using a signal branching filter according to the present invention will be described below. In order to facilitate understanding, a diversity antenna used in a wireless terminal such as a general cellular phone will be described first with reference to FIG. 4. Thereafter, an antenna apparatus using the signal branching filter according to the present invention will be described.

Figure 4:
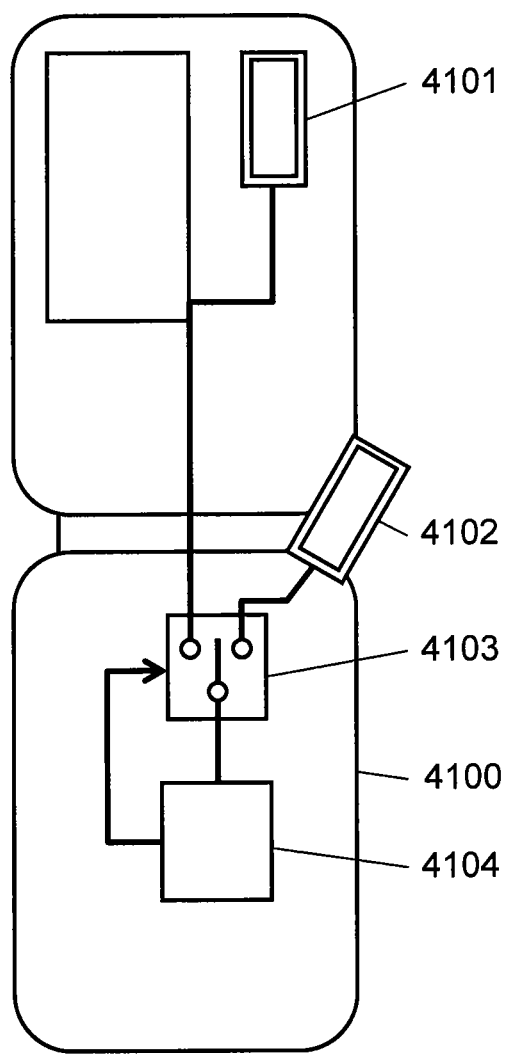
FIG. 4 is a conceptual diagram of a general diversity antenna.

FIG. 4 is a conceptual diagram of a general diversity antenna. In FIG. 4, cellular phone 4100 has first antenna 4101 and second antenna 4102 which are arranged with a predetermined distance. First antenna 4101 and second antenna 4102 are connected to switch 4103. Furthermore, switch 4103 and a signal processing unit 4104 are connected to each other. Signals received by first antenna 4101 and second antenna 4102 are transmitted to signal processing unit 4104 through switch 4103. In signal processing unit 4104, frequency conversion, noise reduction, signal amplification, and the like are performed to the signals, and demodulation is performed to the signals. Signal processing unit 4104 derives a signal quality value (for example, BER or the like) of the demodulated signal and then control a state of switch 4103 on the basis of the derived signal quality value. More specifically, signal processing unit 4104 compares the signal quality values of the signals received from first antenna 4101 and second antenna 4102 with each other, and an antenna which can realize higher signal quality is selected by switching the state of switch 4103.

In the above general diversity antenna, first antenna 4101 and second antenna 4102 must be arranged with a predetermined space to assure isolation between the antennas, and a signal line which connects first antenna 4101 and switch 4103 to each other and a signal line which connects second antenna 4102 and switch 4103 to each other must be led in cellular phone 4100 for a long distance. The two antennas constituting the diversity antenna must be arranged in the cellular phone to deteriorate production efficiency.

Therefore, the antenna apparatus according to Embodiment 4 of the present invention provides a diversity antenna which can cause one antenna to input/output two isolated signals.

The antenna apparatus according to Embodiment 4 of the present invention has an antenna element having a first terminal, a second terminal, a third terminal, and a fourth terminal and an antenna device connected to the antenna element. The antenna apparatus includes a first line one end of which is connected to the first terminal, a second line one end of which is connected to the second terminal, a third line one end of which is connected to the third terminal, and a fourth line one end of which is connected to the fourth terminal. The other end of the first line is connected to the other end of the second line at a first node, and the other end of the third line and the other end of the fourth line are connected to each other at a second node.

When a signal is received from the first node, a phase difference between a phase of a signal appearing on a second node side of the third line and a phase of a signal appearing on a second node side of the fourth line is almost 180°±360°*n (n is an integer equal to or larger than 0).

Since the antenna apparatus using the signal branching filter according to the present invention has the above configuration, when a signal is received from the first node, the phase difference between the phase of the signal appearing on the second node side of the third line and the phase of the signal appearing on the second node side of the fourth line is almost 180°±360°*n (n is an integer equal to or larger than 0). For this reason, isolation between the first node and the second node can be almost achieved.

In this manner, since the first node and the second node can mutually independently perform signal exchanges with the antenna element, two isolated signals can be inputted/outputted by one antenna apparatus. For this reason, a diversity antenna which can cause one antenna to input/output two isolated two signals can be provided.

Figure 5:
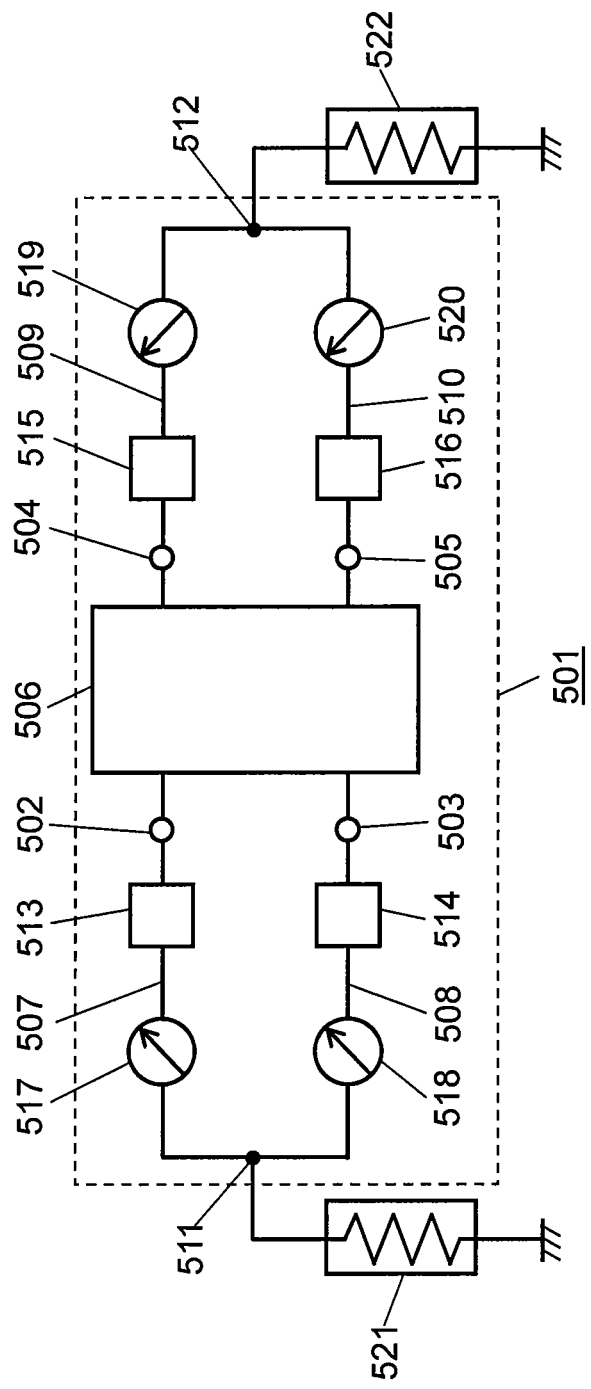
FIG. 5 is a block diagram of an antenna apparatus according to Embodiment 4 of the present invention.

FIG. 5 is a block diagram of an antenna apparatus according to Embodiment 4 of the present invention. In FIG. 5, antenna apparatus 501 according to Embodiment 4 has antenna element 506 having at least four terminals including first terminal 502, second terminal 503, third terminal 504, and fourth terminal 505, first line 507 one end of which is connected to first terminal 502 of antenna element 506, second line 508 one end of which is connected to second terminal 503 of antenna element 506, third line 509 one end of which is connected to third terminal 504 of antenna element 506, and fourth line 510 one end of which is connected to fourth terminal 505 of antenna element 506. The other end of first line 507 and the other end of second line 508 are connected to each other at first node 511, and the other end of third line 509 and the other end of fourth line 510 are connected to each other at second node 512.

Furthermore, antenna apparatus 501 according to Embodiment 4 has first matching circuit 513 and first phase shifter 517 which are connected to the middle of first line 507, second matching circuit 514 and second phase shifter 518 which are connected to the middle of second line 508, third matching circuit 515 and third phase shifter 519 which are connected to the middle of third line 509, and fourth matching circuit 516 and fourth phase shifter 520 which are connected to the middle of fourth line 510.

First load circuit 521 is connected to a point between first node 511 and the ground, and second load circuit 522 is connected to a point between second node 512 and the ground.

Furthermore, antenna element 506 has fifth terminal 523, sixth terminal 524, seventh terminal 525, and eighth terminal 526. In this case, when a signal is received from first node 511, a phase difference between a phase of a signal appearing on the second node 512 side of third line 509 and a phase of a signal appearing on the second node 512 side of fourth line 510 is almost 180°±360°*n (n is an integer equal to or larger than 0).

When a signal is received from second node 512, a phase difference between a phase of a signal appearing on the first node 511 side of first line 507 and a phase of a signal appearing on the first node 511 side of second line 508 is almost 180°±360°*n (n is an integer equal to or larger than 0).

In order to satisfy the above conditions, line lengths of first line 507, second line 508, third line 509, and fourth line 510, first matching circuit 513, second matching circuit 514, third matching circuit 515, and fourth matching circuit 516, and first phase shifter 517, second phase shifter 518, third phase shifter 519, and fourth phase shifter 520 are designed to have appropriate values.

For this reason, for example, a signal transmitted from first load circuit 521 is not generally propagated from second node 512 to the second load circuit 522 side because the phase difference between the phase of the signal appearing on the second node 512 side of third line 509 and the phase of the signal appearing on the second node 512 side of fourth line 510 is almost 180°±360°*n (n is an integer equal to or larger than 0).

In contrast to this, a signal transmitted from second load circuit 522 is not generally propagated from first node 511 to the first load circuit 521 side because the phase difference between the phase of the signal appearing on the first node 511 side of first line 507 and the phase of the signal appearing on the first node 511 side of second line 508 is almost 180°±360°*n (n is an integer equal to or larger than 0).

Therefore, no signal is propagated between first load circuit 521 and second load circuit 522, and isolation can be assured between first load circuit 521 and second load circuit 522. For this reason, first load circuit 521 and second load circuit 522 can mutually independently perform signal exchanges with one antenna element 506. More specifically, first load circuit 521 and second load circuit 522 can mutually independently perform signal exchange without being limited with respect to time and frequency.

The line lengths of first line 507, second line 508, third line 509, and fourth line 510, first matching circuit 513, second matching circuit 514, third matching circuit 515, and fourth matching circuit 516, and first phase shifter 517, second phase shifter 518, third phase shifter 519, and fourth phase shifter 520 may be designed such that, when a signal is inputted from first node 511 to the second node 512 side, an absolute value of an amplitude of a signal appearing on the second node 512 side of third line 509 and an absolute value of an amplitude of a signal appearing on the second node 512 side of fourth line 510 are almost equal to each other.

Similarly, the line lengths of first line 507, second line 508, third line 509, and fourth line 510, first matching circuit 513, second matching circuit 514, third matching circuit 515, and fourth matching circuit 516, and first phase shifter 517, second phase shifter 518, third phase shifter 519, and fourth phase shifter 520 may be designed such that, when a signal is inputted from second node 512 to the first node 511 side, an absolute value of an amplitude of the signal appearing on the first node 511 side of first line 507 and an absolute value of an amplitude of the signal appearing on the first node 511 side of second line 508 are almost equal to each other. For this reason, an advantage in which isolation between first load circuit 521 and second load circuit 522 can be made higher can be obtained.

The line lengths of first line 507 and second line 508, first matching circuit 513 and second matching circuit 514, and first phase shifter 517 and second phase shifter 518 may be designed such that, when signals each having the same phase and having equal absolute values of amplitudes are inputted to first terminal 502 and second terminal 503, respectively, the difference between the phase of the signal appearing on the first node 511 side of first line 507 and the phase of the signal appearing on the first node 511 side of second line 508 is almost $180°\pm360°*n$ (n is an integer equal to or larger than 0).

In this case, for example, when common mode signals are inputted across first terminal 502 and second terminal 503, a phase difference between currents of the common mode signals is zero between first terminal 502 and second terminal 503. Therefore, when the signals each having the same phase and having equal absolute values of amplitudes are inputted to first terminal 502 and second terminal 503, respectively, the difference between the phase of the signal appearing on the first node 511 side of first line 507 and the phase of the signal appearing on the first node 511 side of second line 508 is almost $180°\pm360°*n$ (n is an integer equal to or larger than 0). For this reason, at first node 511, the currents of the common mode signals are canceled out, and a common mode signal is not generally propagated from first node 511 to the first load circuit side.

In contrast to this, for example, when differential mode signals are inputted across first terminal 502 and second terminal 503, a phase difference between the differential mode signals is $\pm180°$ between first terminal 502 and second terminal 503. Therefore, when signals having a phase difference of $\pm180°$ and the equal absolute values of the amplitudes are inputted to first terminal 502 and second terminal 503, respectively, the difference between the phase of the signal appearing on the first node 511 side of first line 507 and the phase of the signal appearing on the first node 511 side of second line 508 is almost $0°\pm360°*n$ (n is an integer equal to or larger than 0). For this reason, at first node 511, the currents of the differential mode signals are summed up, and the signal is generally propagated from first node 511 to the first load circuit side.

As described above, when antenna apparatus 501 is designed such that, when signals each having the same phase and having equal absolute values of amplitudes are inputted to first terminal 502 and second terminal 503, respectively, the difference between the phase of the signal appearing on the first node 511 side of first line 507 and the phase of the signal appearing on the first node 511 side of second line 508 is almost $180°\pm360°*n$ (n is an integer equal to or larger than 0), only differential mode signals generated between first terminal 502 and second terminal 503 can be selected and propagated to first load circuit 521.

Furthermore, when the condition in which the difference between the phase of the signal appearing on the first node 511 side of first line 507 and the phase of the signal appearing on the first node 511 side of second line 508 is almost $180°\pm360°*n$ (n is an integer equal to or larger than 0) when signals each having the same phase and the equal absolute values of the amplitudes are inputted to first terminal 502 and second terminal 503, respectively and the condition in which the phase difference between the phase of the signal appearing on the second node 512 side of third line 509 and the phase of the signal appearing on the second node 512 side of fourth line 510 is almost $180°$ when a signal is received from first node 511 are considered, a difference between a change in phase from first terminal 502 to second node 512 and a change in phase from second terminal 503 to second node 512 becomes zero. More specifically, currents of common mode signals generated between first terminal 502 and second terminal 503 are summed up in the same phase at second node 512, and the signals are generally propagated from second node 512 to the second load circuit 522 side.

In contrast to this, the currents of the differential mode signals generated between first terminal 502 and second terminal 503 are summed up in reversed phases at second node 512 and canceled out, and the signals are not generally propagated from second node 512 to the second load circuit 522 side. Therefore, the differential mode signals generated between first terminal 502 and second terminal 503 are generally propagated to only the first load circuit 521 side, and the common mode signals generated between first terminal 502 and second terminal 503 are generally propagated to only the second load circuit 522 side. More specifically, antenna apparatus 501 according to Embodiment 4 can independently extract the signals of the two modes generated between first terminal 502 and second terminal 503.

In this case, the line lengths of first line 507 and second line 508, first matching circuit 513 and second matching circuit 514, and first phase shifter 517 and second phase shifter 518 may be designed such that, when signals each having the same phase and having equal absolute values of amplitudes are inputted to first terminal 502 and second terminal 503, respectively, the absolute value of the amplitude of the signal appearing on the first node 511 side of first line 507 and the absolute value of the amplitude of the signal appearing on the first node 511 side of second line 508 are almost equal to each other. For this reason, currents of common mode signals appearing at first node 511 can be more accurately canceled out, and a ratio of differential mode signal components to common mode signal of signals propagated from first node 511 to the first load circuit 521 side can be improved.

Similarly, the line lengths of third line 509 and fourth line 510, third matching circuit 515 and fourth matching circuit 516, and third phase shifter 519 and fourth phase shifter 520 may be designed such that, when signals having a phase difference of 180° and equal absolute values of amplitudes are inputted to first terminal 502 and second terminal 503, respectively, the absolute value of the amplitude of the signal appearing on the second node 512 side of third line 509 and the absolute value of the amplitude of the signal appearing on the second node 512 side of fourth line 510 are almost equal to each other. For this reason, currents of differential mode signals appearing at second node 512 can be accurately canceled out, and a ratio of common mode signal components to differential mode signal of signals propagated from second node 512 to the second load circuit 522 side can be improved.

The line lengths of first line 507 and second line 508, first matching circuit 513 and second matching circuit 514, and first phase shifter 517 and second phase shifter 518 may be designed such that a change in phase from first terminal 502 to first node 511 is almost $90°\pm360°*n$ (n is an integer equal to or larger than 0) and a change in phase from second terminal 503 to first node 511 is almost $-90°\pm360°*n$ (n is an integer equal to or larger than 0).

For example, when common mode signals are generated between first terminal 502 and second terminal 503, the change in phase from first terminal 502 to first node 511 is $90°\pm360°*n$ (n is an integer equal to or larger than 0) and the change in phase from second terminal 503 to first node 511 is almost $-90°\pm360°*n$ (n is an integer equal to or larger than 0). For this reason, the common mode signals are canceled out at first node 511.

More specifically, for the common mode signals, first node 511 is an imaginably grounded place. The changes in phase from imaginably grounded first node 511 to first terminal 502 and second terminal 503 are 90° and −90°, respectively, so that input impedances obtained when the first node 511 side is viewed from first terminal 502 and second terminal 503 become infinite. Therefore, the common mode signals generated between first terminal 502 and second terminal 503 are generally propagated to the second node 512 side but not generally propagated to the first node 511 side.

In this manner, a ratio of common mode signals to differential mode signals propagated to second load circuit 522 can be more improved, and a ratio of differential mode signals to common mode signals propagated to first load circuit 521 can be more improved.

Furthermore, in this condition, the line lengths of first line 507 and second line 508, first matching circuit 513 and second matching circuit 514, and first phase shifter 517 and second phase shifter 518 may be designed such that, when signals each having the same phase and having equal absolute values of amplitudes are inputted to first terminal 502 and second terminal 503, respectively, the absolute value of the amplitude of the signal appearing on the first node 511 side of first line 507 and the absolute value of the amplitude of the signal appearing on the first node 511 side of second line 508 are almost equal to each other. For this reason, currents of common mode signals appearing at first node 511 can be more accurately canceled out, and a ratio of differential mode signals to common mode signals propagated from first node 511 to the first load circuit 521 side can be improved. Therefore, the common mode signals and differential signals which are generated on antenna element 506 and have low correlation coefficients can be accurately separated from each other, and a compact diversity antenna which can obtain two signals having low correlation coefficients can be realized.

The line lengths of third line 509 and fourth line 510, third matching circuit 515 and fourth matching circuit 516, and third phase shifter 519 and fourth phase shifter 520 may be designed such that the change in phase from first terminal 502 to second node 512 is almost $+90°\pm180°*n$ (n is an integer equal to or larger than 0) and the change in phase from second terminal 503 to second node 512 is almost $+90°\pm180°*n$ (n is an integer equal to or larger than 0). In this manner, for example, when differential mode signals are generated between first terminal 502 and second terminal 503, the change in phase from first terminal 502 to second node 512 and the change in phase from second terminal 503 to second node 512 are equal to each other. For this reason, differential mode signals are canceled out at second node 512. More specifically, for the differential mode signals, second node 512 is an imaginably grounded place. The changes in phase from imaginably grounded second node 512 to first terminal 502 and second terminal 503 are 90° each, so that input impedances obtained when the second node 512 side is viewed from first terminal 502 and second terminal 503 become infinite.

Therefore, the differential mode signals generated between first terminal 502 and second terminal 503 are generally propagated to the first node 511 side but not generally propagated to the second node 512 side. In this manner, a ratio of differential mode signals to common mode signals propagated to first load circuit 521 can be improved, and a ratio of common mode signals to differential mode signals propagated to second load circuit 522 can be improved.

Furthermore, in this condition, the line lengths of third line 509 and fourth line 510, third matching circuit 515 and fourth matching circuit 516, and third phase shifter 519 and fourth phase shifter 520 may be designed such that, when signals having a phase difference of 180° and equal absolute values of amplitudes are inputted to first terminal 502 and second terminal 503, respectively, the absolute value of the amplitude of the signal appearing on the second node 512 side of third line 509 and the absolute value of the amplitude of the signal appearing on the second node 512 side of fourth line 510 are almost equal to each other.

For this reason, currents of differential mode signals appearing at second node 512 can be accurately canceled out, and a ratio of common mode signals to differential mode signals of signals propagated from second node 512 to the second load circuit 522 side can be improved. Therefore, the common mode signals and differential signals which are generated on antenna element 506 and have low correlation coefficients can be accurately separated from each other, and a compact diversity antenna which can obtain two signals having low correlation coefficients can be realized.

The line lengths of third line 509 and fourth line 510, third matching circuit 515 and fourth matching circuit 516, and third phase shifter 519 and fourth phase shifter 520 may be designed such that a change in phase from third terminal 504 to second node 512 is almost $+90°\pm180°*n$ (n is an integer equal to or larger than 0) and a difference in phase from fourth terminal 505 to second node 512 is almost $+90°\pm180°*n$ (n is an integer equal to or larger than 0). For this reason, for example, when differential mode signals are generated between third terminal 504 and fourth terminal 505, a change in phase from third terminal 504 to second node 512 and a change in phase from fourth terminal 505 to second node 512 are equal to each other. For this reason, the differential mode signals are canceled out at second node 512. More specifically, for the differential mode signals, second node 512 is an imaginably grounded place. The changes in phase from imaginably grounded second node 512 to third terminal 504 and fourth terminal 505 are 90° each, so that input impedances obtained when the second node 512 side is viewed from third terminal 504 and fourth terminal 505 become infinite.

Therefore, the differential mode signals generated between third terminal 504 and fourth terminal 505 are generally propagated to the first node 511 side but not generally propagated to the second node 512 side. In this manner, a ratio of differential mode signals to common mode signals propagated to first load circuit 521 can be more improved, and a ratio of common mode signals to differential mode signals propagated to second load circuit 522 can be improved.

Furthermore, in this condition, the line lengths of third line 509 and fourth line 510, third matching circuit 515 and fourth matching circuit 516, and third phase shifter 519 and fourth phase shifter 520 may be designed such that, when signals having a phase difference of 180° and equal absolute values of amplitudes are inputted to third terminal 504 and fourth terminal 505, respectively, the absolute value of the amplitude of the signal appearing on the second node 512 side of third line 509 and the absolute value of the amplitude of the signal appearing on the second node 512 side of fourth line 510 are almost equal to each other.

For this reason, currents of differential mode signals appearing at second node 512 can be accurately canceled out, and a ratio of common mode signals to differential mode signals propagated from second node 512 to the second load circuit 522 side can be improved.

Therefore, the common mode signals and differential signals which are generated on antenna element 506 and have low correlation coefficients can be accurately separated from each other, and a compact diversity antenna which can obtain two signals having low correlation coefficients can be realized.

In FIG. 5, at least one of first matching circuit 513, second matching circuit 514, third matching circuit 515, fourth matching circuit 516, first phase shifter 517, second phase shifter 518, third phase shifter 519, and fourth phase shifter 520 may be eliminated. In this manner, transmission losses on first line 507, second line 508, third line 509, and fourth line 510 can be reduced, the number of required parts can be reduced, and reductions in size and weight can be achieved.

If necessary, a matching circuit may be connected to at least one of a line between first node 511 and first load circuit 521 and a line between second node 512 and second load circuit 522. Therefore, matching states between antenna apparatus 501 and first load circuit 521 according to the embodiment and between antenna apparatus 501 and second load circuit 522 according to the embodiment can be made preferable, and reflection losses therebetween can be reduced. As a result, communication quality of the electronic appliance can be made preferable.

First matching circuit 513, second matching circuit 514, third matching circuit 515, fourth matching circuit 516, first phase shifter 517, second phase shifter 518, third phase shifter 519, and fourth phase shifter 520 are basically designed as circuits of reactance elements. However, when a signal is received from first node 511, in order to satisfy a condition in which an absolute value of an amplitude of a signal appearing on the second node 512 side of third line 509 and an absolute value of an amplitude of a signal appearing on the second node 512 side of fourth line 510 are equal to each other, the matching circuits and the phase shifters may be designed as circuits including a resistance element and an amplifying circuit (for example, a configuration or the like in which first line 507 has a transmission path and a reception path which have a transmission amplifying circuit and a reception amplifying circuit, respectively). For this reason, a high isolation characteristic between first load circuit 521 and second load circuit 522 can be realized, and a transmission/reception characteristic of an electronic appliance can be improved.

Embodiment 5

Figure 6:
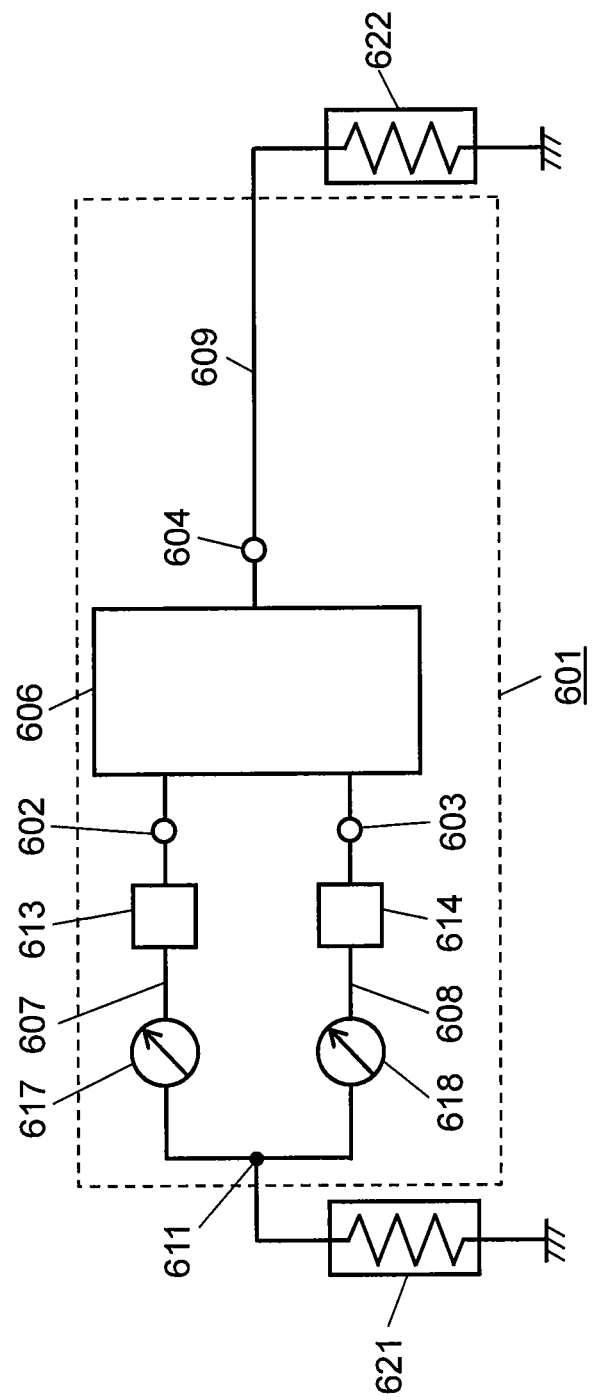
FIG. 6 is a block diagram of an antenna apparatus according to Embodiment 5 of the present invention.

FIG. 6 is a block diagram of an antenna apparatus according to Embodiment 5 of the present invention. With respect to the same configuration as that of Embodiment 4, only the same reference numerals are described, and a different configuration will be mainly described below.

In FIG. 6, antenna apparatus 601 according to Embodiment 5 has antenna element 606 having at least three terminals, first line 607 one end of which is connected to first terminal 602 of antenna element 606, second line 608 one end of which is connected to second terminal 603 of antenna element 606, and third line 609 one end of which is connected to third terminal 604 of antenna element 606. The other end of first line 607 and the other end of second line 608 are connected to first node 611. The line lengths of first line 607, second line 608, and third line 609, first matching circuit 613, second matching circuit 614, and third matching circuit 615, and first phase shifter 617, second phase shifter 618, and third phase shifter 619 are designed such that, when signals are received from the other end of third line 609, a phase difference between a phase of a signal appearing on the first node 611 side of first line 607 and a phase of a signal appearing on the first node 611 side of second line 608 are almost 180°±360°*(n is an integer equal to or larger than 0).

For this reason, for example, a signal transmitted from first load circuit 621 is not generally propagated to the second load circuit 622 side because the signal is canceled out on the other end side of third line 609 and at third terminal 604. In contrast to this, a signal transmitted from second load circuit 622 is not generally propagated from first node 611 to first load circuit 621 because the phase difference between the phase of the signal appearing on the first node 611 side of first line 607 and the phase of the signal appearing on the first node 611 side of second line 608 is almost 180°±360°*n (n is an integer equal to or larger than 0).

Therefore, no signal is propagated between first load circuit 621 and second load circuit 622, and isolation can be assured between first load circuit 621 and second load circuit 622. For this reason, first load circuit 621 and second load circuit 622 can mutually independently perform signal exchanges with antenna element 606. More specifically, first load circuit 621 and second load circuit 622 can mutually independently exchange signals without being limited with respect to time and frequency. Since antenna apparatus 601 according to Embodiment 5, in comparison with the antenna apparatus according to Embodiment 4, can reduce the number of lines which connect third terminal 604 and second load circuit 622, the number of matching circuits, and the number of phase shifters, reductions in size and weight can be achieved.

The line lengths of first line 607 and second line 608, first matching circuit 613 and second matching circuit 614, and first phase shifter 617 and second phase shifter 618 may be designed such that, when a signal is inputted from the other end of third line 609, an absolute value of an amplitude of the signal appearing on the first node 611 side of first line 607 and an absolute value of an amplitude of the signal appearing on the first node 611 side of second line 608 are almost equal to each other. For this reason, an advantage in which isolation between first load circuit 621 and second load circuit 622 can be made higher can be obtained.

The line lengths of first line 607 and second line 608, first matching circuit 613 and second matching circuit 614, and first phase shifter 617 and second phase shifter 618 may be designed such that, when signals each having the same phase and having equal absolute values of amplitudes are inputted to first terminal 602 and second terminal 603, respectively, the difference between the phase of the signal appearing on the first node 611 side of first line 607 and the phase of the signal appearing on the first node 611 side of second line 608 is almost $180°\pm360°*n$ (n is an integer equal to or larger than 0).

In this case, for example, when common mode signals are inputted across first terminal 602 and second terminal 603, a phase difference between currents of the common mode signals is zero between first terminal 602 and second terminal 603. Therefore, when the signals each having the same phase and having absolute values of amplitudes are inputted to first terminal 602 and second terminal 603, respectively, the difference between the phase of the signal appearing on the first node 611 side of first line 607 and the phase of the signal appearing on the first node 611 side of second line 608 is almost $180°\pm360°*n$ (n is an integer equal to or larger than 0). For this reason, at first node 611, the currents of the common mode signals are canceled out, and a common mode signal is not generally propagated from first node 611 to the first load circuit 621 side.

In contrast to this, for example, when differential mode signals are inputted across first terminal 602 and second terminal 603, a phase difference between the differential mode signals is $\pm180°$ between first terminal 602 and second terminal 603. Therefore, when signals having a phase difference of $\pm180°$ and the equal absolute values of the amplitudes are inputted to first terminal 602 and second terminal 603, respectively, the difference between the phase of the signal appearing on the first node 611 side of first line 607 and the phase of the signal appearing on the first node 611 side of second line 608 is almost $0°\pm360°*n$ (n is an integer equal to or larger than 0). For this reason, at first node 611, the currents of the differential mode signals are summed up, and the signal is generally propagated from first node 611 to the first load circuit 621 side.

As described above, when the antenna apparatus is designed such that, when signals each having the same phase and having equal absolute values of amplitudes are inputted to first terminal 602 and second terminal 603, respectively, the difference between the phase of the signal appearing on the first node 611 side of first line 607 and the phase of the signal appearing on the first node 611 side of second line 608 is almost $180°\pm360°*n$ (n is an integer equal to or larger than 0), only differential mode signals generated between first terminal 602 and second terminal 603 can be selected and propagated to first load circuit 621.

Furthermore, when the condition in which the difference between the phase of the signal appearing on the first node 611 side of first line 607 and the phase of the signal appearing on the first node 611 side of second line 608 is almost $180°\pm360°*n$ (n is an integer equal to or larger than 0) when signals each having the same phase and the equal absolute values of the amplitudes are inputted to first terminal 602 and second terminal 603, respectively and the condition in which the phase difference between the phase of the signal appearing on the first node 611 side of first line 607 and the phase of the signal appearing on the first node 611 side of second line 608 is almost $180°$ when a signal is received from the other end of third line 609 are considered, a difference between a change in phase from first terminal 602 to third terminal 604 and a change in phase from second terminal 603 to third terminal 604 becomes zero.

More specifically, currents of common mode signals generated between first terminal 602 and second terminal 603 are summed up in the same phase at third node 604, and the signals are generally propagated to the second load circuit 622 side. In contrast to this, the currents of the differential mode signals generated between first terminal 602 and second terminal 603 are summed up in reversed phases at third terminal 604 and canceled out, and the signals are not generally propagated to the second load circuit 622 side.

Therefore, the differential mode signals generated between first terminal 602 and second terminal 603 are generally propagated to only the first load circuit 621 side. In contrast to this, common mode signals generated between first terminal 602 and second terminal 603 are generally propagated to only the second load circuit 622 side.

More specifically, antenna apparatus 601 according to Embodiment 5 can independently extract the signals of the two modes generated between first terminal 602 and second terminal 603. In this case, the line lengths of first line 607 and second line 608, first matching circuit 613 and second matching circuit 614, and first phase shifter 617 and second phase shifter 618 may be designed such that, when signals each having the same phase and the equal absolute values of the amplitudes are inputted to first terminal 602 and second terminal 603, respectively, the absolute value of the amplitude of the signal appearing on the first node 611 side of first line 607 and the absolute value of the amplitude of the signal appearing on the first node 611 side of second line 608 are almost equal to each other.

For this reason, currents of common mode signals appearing at first node 611 can be more accurately canceled out, and a ratio of differential mode signal components of signals propagated from first node 611 to the first load circuit 621 side can be improved. Therefore, the common mode signals and differential signals which are generated on antenna element 606 and have low correlation coefficients can be accurately separated from each other, and a diversity antenna which can obtain two signals having low correlation coefficients can be realized.

The line lengths of first line 607 and second line 608, first matching circuit 613 and second matching circuit 614, and first phase shifter 617 and second phase shifter 618 may be designed such that the change in phase from first terminal 602 to first node 611 is almost $+90°\pm360°*n$ (n is an integer equal to or larger than 0) and the change in phase from second terminal 603 to first node 611 is almost $-90°\pm360°*n$ (n is an integer equal to or larger than 0). For example, when common mode signals are generated between first terminal 602 and second terminal 603, the change in phase from first terminal 602 to first node 611 is almost $+90°\pm360°*n$ (n is an integer equal to or larger than 0) and the change in phase from second terminal 603 to first node 611 is almost $-90°\pm360°*n$ (n is an integer equal to or larger than 0). For this reason, common mode signals are canceled out at first node 611.

More specifically, for the common mode signals, first node 611 is an imaginably grounded place. The changes in phase from imaginably grounded first node 611 to first terminal 602 and second terminal 603 are $90°$ and $-90°$, respectively, so that input impedances obtained when the first node 611 side is viewed from first terminal 602 and second terminal 603 become infinite. Therefore, the common mode signals generated between first terminal 602 and second terminal 603 are generally propagated to the second node 612 side but not generally propagated to the first node 611 side.

In this manner, a ratio of common mode signals propagated to second load circuit 622 to the differential mode signals can be improved, and a ratio of differential mode signals to common mode signals propagated to first load circuit 621 can be more improved.

Furthermore, in this condition, the line lengths of first line 607 and second line 608, first matching circuit 613 and second matching circuit 614, and first phase shifter 617 and second phase shifter 618 may be designed such that, when signals each having the same phase and having equal absolute values of amplitudes are inputted to first terminal 602 and second terminal 603, respectively, the absolute value of the amplitude of the signal appearing on the first node 611 side of first line 607 and the absolute value of the amplitude of the signal appearing on the first node 611 side of second line 608 are almost equal to each other.

For this reason, currents of common mode signals appearing at first node 611 can be accurately canceled out, and a ratio of differential mode signals propagated from first node 611 to the first load circuit 621 side to common mode signals can be improved.

Therefore, the common mode signals and differential signals which are generated on antenna element 606 and have low correlation coefficients can be accurately separated from each other, and a compact diversity antenna which can obtain two signals having low correlation coefficients can be realized.

In FIG. 6, at least one of first matching circuit 613, second matching circuit 614, first phase shifter 617, and second phase shifter 618 may be eliminated. In this manner, transmission losses on first line 607 and second line 608 can be reduced, the number of required parts can be reduced, and reductions in size and weight can be achieved.

If necessary, a matching circuit may be connected to at least one of a line between first node 611 and first load circuit 621 and a line between third terminal 604 and second load circuit 622. Therefore, matching states between antenna apparatus 601 and first load circuit 621 according to Embodiment 5 and between antenna apparatus 601 and second load circuit 622 according to Embodiment 5 can be made preferable, and reflection losses therebetween can be reduced. As a result, communication quality of the electronic appliance can be made preferable.

First matching circuit 613, second matching circuit 614, first phase shifter 617, and second phase shifter 618 are basically designed as circuits of reactance elements. However, when a signal is received from the other end of third line 609, in order to satisfy a condition in which an absolute value of an amplitude of a signal appearing on the first node 611 side of first line 607 and an absolute value of an amplitude of a signal appearing on the first node 611 side of second line 608 are almost equal to each other, the matching circuits and the phase shifters may be designed as circuits including a resistance element and an amplifying circuit (for example, a configuration or the like in which first line 607 has a transmission path and a reception path which have a transmission amplifying circuit and a reception amplifying circuit, respectively). For this reason, a high isolation characteristic between first load circuit 621 and second load circuit 622 can be realized, and a transmission/reception characteristic of an electronic appliance can be improved.

Embodiment 6

Figure 7:
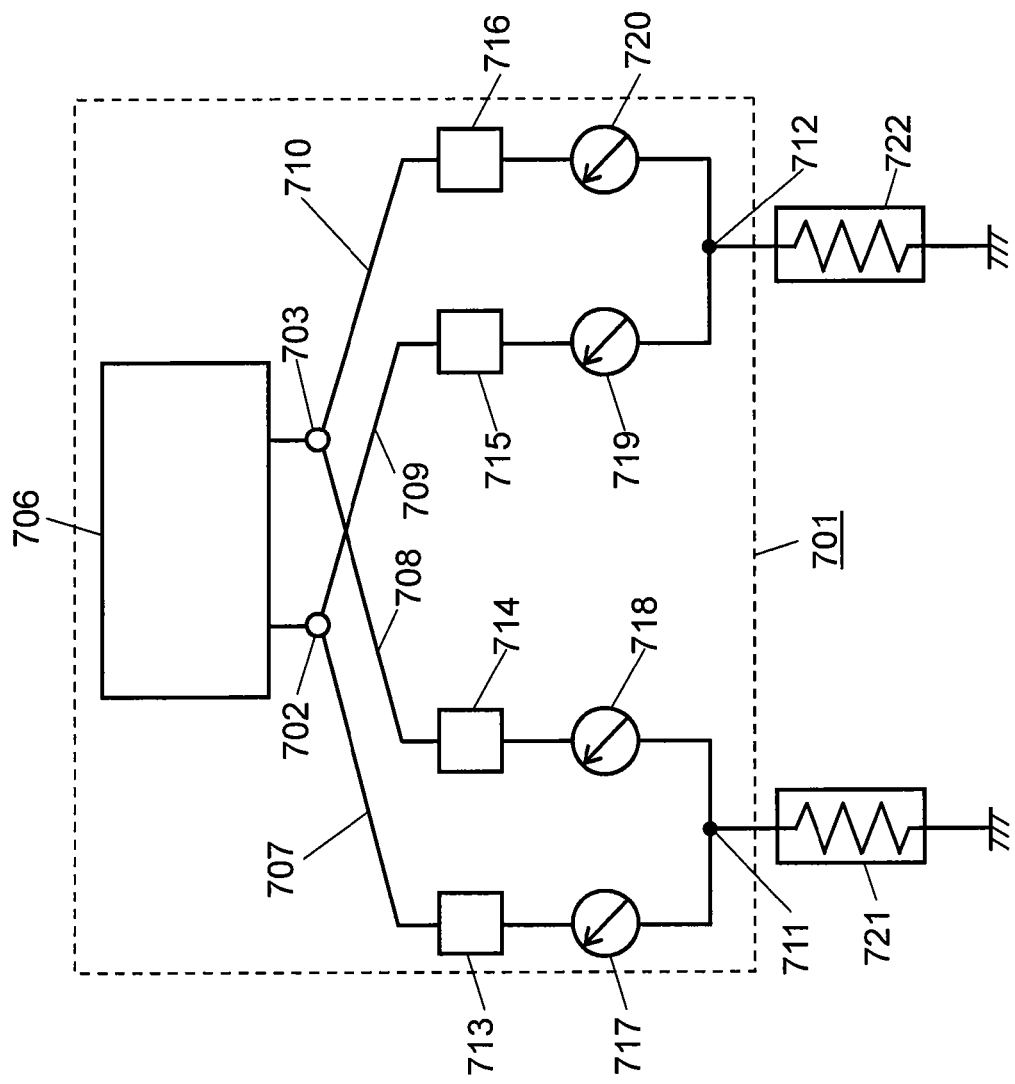
FIG. 7 is a block diagram of antenna apparatus 701 according to Embodiment 6 of the present invention.

FIG. 7 is a block diagram of an antenna apparatus 701 according to Embodiment 6 of the present invention. With respect to the same configuration as that of Embodiment 4, only the same reference numerals are described, and a different configuration will be mainly described below.

In FIG. 7, antenna apparatus 701 according to Embodiment 6 has antenna element 706 having at least two terminals of first terminal 702 and second terminal 703, first line 707 one end of which is connected to first terminal 702, second line 708 one end of which is connected to second terminal 703, and third line 709 one end of which is connected to first terminal 702, second line 708 one end of which is connected to second terminal 703, and fourth line 710 one end of which is connected to second terminal 703. The other end of first line 707 and the other end of second line 708 are connected to first node 711. The other end of third line 709 and the other end of fourth line 710 are connected to second node 712.

The line lengths of first line 707, second line 708, third line 709, and fourth line 710, first matching circuit 713, second matching circuit 714, third matching circuit 715, fourth matching circuit 716, first phase shifter 717, second phase shifter 718, third phase shifter 719, and fourth phase shifter 720 are designed such that, when signals are received from first node 711, a phase difference between a phase of a signal appearing on the second node 712 side of third line 709 and a phase of a signal appearing on the second node 712 side of fourth line 710 are almost $180°\pm360°*n$ (n is an integer equal to or larger than 0).

For this reason, for example, a signal transmitted from first load circuit 721 is not generally propagated from second node 712 to the second load circuit 722 side because a phase difference between a phase of a signal appearing on the second node 712 side of third line 709 and a phase of a signal appearing on the second node 712 side of fourth line 710 is almost $180°\pm360°*n$ (n is an integer equal to or larger than 0).

In contrast to this, a signal transmitted from second load circuit 722 is not generally propagated from first node 711 to first load circuit 721 because the phase difference between the phase of the signal appearing on the first node 711 side of first line 707 and the phase of the signal appearing on the first node 711 side of second line 708 is almost $180°\pm360°*n$ (n is an integer equal to or larger than 0).

Therefore, no signal is propagated between first load circuit 721 and second load circuit 722, and isolation can be assured between first load circuit 721 and second load circuit 722. For this reason, first load circuit 721 and second load circuit 722 can mutually independently perform signal exchanges through antenna element 706.

More specifically, first load circuit 721 and second load circuit 722 need not be selected with respect to time and frequency, and can mutually independently perform signal exchanges. Since antenna apparatus 701 according to Embodiment 6, in comparison with the antenna apparatus according to Embodiment 4, can be connected to antenna element 706 by only two connection terminals to make it possible to simplify the structure.

The line lengths of first line 707, second line 708, third line 709, and fourth line 710, first matching circuit 713, second matching circuit 714, third matching circuit 715, and fourth matching circuit 716, and first phase shifter 717, second phase shifter 718, third phase shifter 719, and fourth phase shifter 720 may be designed such that, when a signal is inputted from fourth line 711 to the second node 712 side, the absolute value of the amplitude of the signal appearing on the second node 712 side of third line 709 and the absolute value of the amplitude of the signal appearing on the second node 712 side of third line 709 are almost equal to each other.

Similarly, the line lengths of first line 707, second line 708, third line 709, and fourth line 710, first matching circuit 713, second matching circuit 714, third matching circuit 715, and fourth matching circuit 716, and first phase shifter 717, second phase shifter 718, third phase shifter 719, and fourth phase shifter 720 may be designed such that, when a signal is inputted from second node 712 to the first node 711 side, an absolute value of an amplitude of the signal appearing on the first node 711 side of first line 707 and an absolute value of an amplitude of the signal appearing on the first node 711 side of second line 708 are almost equal to each other. For this reason, an advantage in which isolation between first load circuit 721 and second load circuit 722 can be made higher can be obtained.

The line lengths of first line 707 and second line 708, first matching circuit 713 and second matching circuit 714, and first phase shifter 717 and second phase shifter 718 may be designed such that, when signals each having the same phase and having equal absolute values of amplitudes are inputted to first terminal 702 and second terminal 703, respectively, the difference between the phase of the signal appearing on the first node 711 side of first line 707 and the phase of the signal appearing on the first node 711 side of second line 708 is almost 180°±360°*n (n is an integer equal to or larger than 0).

In this case, for example, when common mode signals are inputted across first terminal 702 and second terminal 703, a phase difference between currents of the common mode signals is zero between first terminal 702 and second terminal 703. Therefore, when the signals each having the same phase and having equal absolute values of amplitudes are inputted to first terminal 702 and second terminal 703, respectively, the difference between the phase of the signal appearing on the first node 711 side of first line 707 and the phase of the signal appearing on the first node 711 side of second line 708 is almost 180°±360°*n (n is an integer equal to or larger than 0). For this reason, at first node 711, the currents of the common mode signals are canceled out, and a common mode signal is not generally propagated from first node 711 to the first load circuit 721 side.

In contrast to this, for example, when differential mode signals are inputted across first terminal 702 and second terminal 703, a phase difference between currents of the differential mode signals is ±180° between first terminal 702 and second terminal 703. Therefore, when signals having a phase difference of ±180° and the equal absolute values of the amplitudes are inputted to first terminal 702 and second terminal 703, respectively, the difference between the phase of the signal appearing on the first node 711 side of first line 707 and the phase of the signal appearing on the first node 711 side of second line 708 is almost 180°±360°*n (n is an integer equal to or larger than 0). For this reason, at first node 711, the currents of the differential mode signals are summed up, and the signal is generally propagated from first node 711 to the first load circuit 721 side.

As described above, when antenna apparatus 701 is designed such that, when signals each having the same phase and having equal absolute values of amplitudes are inputted to first terminal 702 and second terminal 703, respectively, the difference between the phase of the signal appearing on the first node 711 side of first line 707 and the phase of the signal appearing on the first node 711 side of second line 708 is almost 180°±360°*n (n is an integer equal to or larger than 0), only differential mode signals generated between first terminal 702 and second terminal 703 can be selected and propagated to first load circuit 721.

Furthermore, when the condition in which the difference between the phase of the signal appearing on the first node 711 side of first line 707 and the phase of the signal appearing on the first node 711 side of second line 708 is almost 180°±360°*n (n is an integer equal to or larger than 0) when signals each having the same phase and the equal absolute values of the amplitudes are inputted to first terminal 702 and second terminal 703, respectively and the condition in which the phase difference between the phase of the signal appearing on the second node 712 side of third line 709 and the phase of the signal appearing on the second node 712 side of fourth line 710 is almost 180° when a signal is received from first node 711 are considered, a difference between a change in phase from first terminal 702 to second node 712 and a change in phase from second terminal 703 to second node 712 becomes zero.

More specifically, currents of common mode signals generated between first terminal 702 and second terminal 703 are summed up in the same phase at second node 712, and the signals are generally propagated from second node 712 to the second load circuit 722 side. In contrast to this, the currents of the differential mode signals generated between first terminal 702 and second terminal 703 are summed up in reversed phases at second node 712 and canceled out, and the signals are not generally propagated from second node 712 to the second load circuit 722 side.

Therefore, the differential mode signals generated between first terminal 702 and second terminal 703 are generally propagated to only the first load circuit 721 side, and the common mode signals generated between first terminal 702 and second terminal 703 are generally propagated to only the second load circuit 722 side. More specifically, antenna apparatus 701 according to Embodiment 6 can independently extract the signals of the two modes generated between first terminal 702 and second terminal 703.

In this case, the line lengths of first line 707 and second line 708, first matching circuit 713 and second matching circuit 714, and first phase shifter 717 and second phase shifter 718 may be designed such that, when signals each having the same phase and having equal absolute values of amplitudes are inputted to first terminal 702 and second terminal 703, respectively, the absolute value of the amplitude of the signal appearing on the first node 711 side of first line 707 and the absolute value of the amplitude of the signal appearing on the first node 711 side of second line 708 are almost equal to each other. For this reason, currents of common mode signals appearing at first node 711 can be more accurately canceled out, and a ratio of differential mode signals propagated from first node 711 to the first load circuit 721 side to common mode signals can be improved.

Similarly, the line lengths of third line 709 and fourth line 710, third matching circuit 715 and fourth matching circuit 716, and third phase shifter 719 and fourth phase shifter 720 may be designed such that, when signals having a phase difference of 180° and equal absolute values of amplitudes are inputted to first terminal 702 and second terminal 703, respectively, the absolute value of the amplitude of the signal appearing on the second node 712 side of third line 709 and the absolute value of the amplitude of the signal appearing on the second node 712 side of fourth line 710 are almost equal to each other. For this reason, currents of differential mode signals appearing at second node 712 can be accurately canceled out, and a ratio of common mode signals propagated from second node 712 to the second load circuit 722 side to differential modes can be improved.

Therefore, the common mode signals and differential mode signals which are generated on antenna element 706 and have low correlation coefficients can be accurately separated from each other, and a compact diversity antenna which can obtain two signals having low correlation coefficients can be realized.

The line lengths of first line 707 and second line 708, first matching circuit 713 and second matching circuit 714, and third phase shifter 719 and fourth phase shifter 720 may be designed such that the change in phase from first terminal 702 to fourth line 711 is almost 90°±360°*n (n is an integer equal to or larger than 0) and the change in phase from second terminal 703 to fourth line 711 is almost −90°±360°*n (n is an integer equal to or larger than 0).

For example, when common mode signals are generated between first terminal 702 and second terminal 703, the change in phase from first terminal 702 to first node 711 is 90°±360°*n (n is an integer equal to or larger than 0) and the change in phase from second terminal 703 to first node 711 is almost −90°±360°*n (n is an integer equal to or larger than 0). For this reason, the common mode signals are canceled out at first node 711.

More specifically, for the common mode signals, first node 711 is an imaginably grounded place. The changes in phase from imaginably grounded first node 711 to first terminal 702 and second terminal 703 are 90° and −90°, respectively, so that input impedances obtained when the first node 711 side is viewed from first terminal 702 and second terminal 703 become infinite. Therefore, the common mode signals generated between first terminal 702 and second terminal 703 are generally propagated to the second node 712 side but not generally propagated to the first node 711 side.

In this manner, a ratio of common mode signals propagated to second load circuit 722 to differential mode signals can be more improved, and a ratio of differential mode signals propagated to first load circuit 721 to common mode signals can be more improved.

Furthermore, in this condition, the line lengths of first line 707 and second line 708, first matching circuit 713 and second matching circuit 714, and first phase shifter 717 and second phase shifter 718 may be designed such that, when signals each having the same phase and having equal absolute values of amplitudes are inputted to first terminal 702 and second terminal 703, respectively, the absolute value of the amplitude of the signal appearing on the first node 711 side of first line 707 and the absolute value of the amplitude of the signal appearing on the first node 711 side of second line 708 are almost equal to each other.

For this reason, currents of common mode signals appearing at first node 711 can be accurately canceled out, and a ratio of differential mode signals propagated from first node 711 to the first load circuit 721 side to common mode signals can be improved. Therefore, the common mode signals and differential signals which are generated on antenna element 706 and have low correlation coefficients can be accurately separated from each other, and a compact diversity antenna which can obtain two signals having low correlation coefficients can be realized.

The line lengths of third line 709 and fourth line 710, third matching circuit 715 and fourth matching circuit 716, and third phase shifter 719 and fourth phase shifter 720 may be designed such that the change in phase from first terminal 702 to first node 711 is almost +90°±180°*n (n is an integer equal to or larger than 0) and the change in phase from second terminal 703 to second node 712 is almost +90°±180°*n (n is an integer equal to or larger than 0).

Therefore, for example, when differential mode signals are generated between first terminal 702 and second terminal 703, the change in phase from first terminal 702 to first node 711 and the change in phase from second terminal 703 to second node 712 are equal to each other. For this reason, differential mode signals are canceled out at second node 712.

More specifically, for the differential mode signals, second node 712 is an imaginarily grounded place. The changes in phase from imaginarily grounded second node 712 to first terminal 702 and second terminal 703 are 90° each, so that input impedances obtained when the second node 712 side is viewed from first terminal 702 and second terminal 703 become infinite.

Therefore, the differential mode signals generated between first terminal 702 and second terminal 703 are generally propagated to the first node 711 side but not generally propagated to the second node 712 side. In this manner, a ratio of differential mode signals propagated to first load circuit 721 to the common mode signals can be improved, and a ratio of common mode signals propagated to second load circuit 722 to common mode signals can be more improved.

Furthermore, in this condition, the line lengths of third line 709 and fourth line 710, third matching circuit 715 and fourth matching circuit 716, third phase shifter 719, fourth phase shifter 720 may be designed such that, when signals having a phase difference of 180° and equal absolute values of amplitudes are inputted to first terminal 702 and second terminal 703, respectively, the absolute value of the amplitude of the signal appearing on the second node 712 side of third line 709 and the absolute value of the amplitude of the signal appearing on the second node 712 side of fourth line 710 are almost equal to each other.

For this reason, currents of differential mode signals appearing at second node 712 can be accurately canceled out, and a ratio of common mode signals propagated from second node 712 to the second load circuit 722 side to differential mode signals can be improved. Therefore, the common mode signals and differential signals which are generated on antenna element 706 and have low correlation coefficients can be accurately separated from each other, and a compact diversity antenna which can obtain two signals having low correlation coefficients can be realized.

In FIG. 7, at least one of first matching circuit 713, second matching circuit 714, third matching circuit 715, fourth matching circuit 716, first phase shifter 717, second phase shifter 718, third phase shifter 719, and fourth phase shifter 720 may be eliminated. In this manner, transmission losses on first line 707, second line 708, third line 709, and fourth line 710 can be reduced, the number of required parts can be reduced, and reductions in size and weight can be achieved.

If necessary, a matching circuit may be connected to at least one of a line between first node 711 and first load circuit 721 and a line between second node 712 and second load circuit 722. Therefore, matching states between antenna apparatus 701 and first load circuit 721 according to Embodiment 6 and between antenna apparatus 701 and second load circuit 722 according to Embodiment 6 can be made preferable, and reflection losses therebetween can be reduced. As a result, communication quality of the electronic appliance can be made preferable.

First matching circuit 713, second matching circuit 714, third matching circuit 715, fourth matching circuit 716, first phase shifter 717, second phase shifter 718, third phase shifter 719, and fourth phase shifter 720 are basically designed as circuits of reactance elements. However, when a signal is received from fourth line 711, in order to satisfy a condition in which an absolute value of an amplitude of a signal appearing on the second node 712 side of third line 709 and an absolute value of an amplitude of a signal appearing on the second node 712 side of fourth line 710 are almost equal to each other, the matching circuits and the phase shifters may be designed as circuits including a resistance element and an amplifying circuit (for example, a configuration or the like in which first line 707 has a transmission path and a reception path which have a transmission amplifying circuit and a reception amplifying circuit, respectively). For this reason, a high isolation characteristic between first load circuit 721 and second load circuit 722 can be realized, and a transmission/reception characteristic of an electronic appliance can be improved.

Embodiment 7

Figure 8:
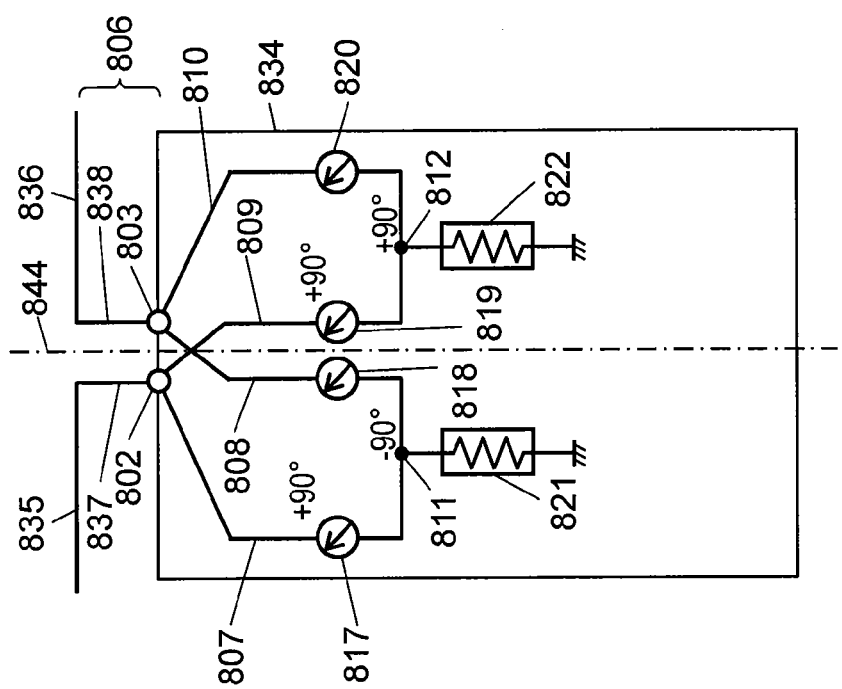
FIG. 8 is a diagram showing a signal transmitting method using a signal branching filter according to Embodiment 7 of the present invention.

FIG. 8 is a diagram showing a signal transmitting system using a signal branching filter according to Embodiment 7 of the present invention. With respect to the same configuration as that of Embodiment 6, only the same reference numerals are described, and a different configuration will be mainly described below.

FIG. 8 shows a case using a dipole antenna configured by two pairs of antenna elements including an antenna element configured by first element 835 and third element 837 and an antenna element configured by second element 836 and fourth element 838.

In FIG. 8, first terminal 802 is arranged at an end portion of third element 837, and second terminal 803 is arranged at an end portion of fourth element 838. First line 807 and third line 809 connected to first terminal 802, second line 808 and fourth line 810 connected to second terminal 803, first phase shifter 817, second phase shifter 818, third phase shifter 819, fourth shifter 820, first load circuit 821, and second load circuit 822 are approximately arranged above ground plate 834 built in an electronic appliance (not shown). One end of first load circuit 821 and one end of second load circuit 822 are connected to ground plate 834, and first terminal 802 and second terminal 803 are not directly connected to ground plate 834. First line 807 and first phase shifter 817 are designed such that a change in phase from first terminal 802 to first node 811 is +90°, second line 808 and second phase shifter 818 are designed such that a change in phase from second terminal 803 to first node 811 is −90°, third line 809 and third phase shifter 819 are designed such that a change in phase from first terminal 802 to second node 812 is +90°, and fourth line 810 and fourth shifter 820 are designed such that a change in phase from second terminal 803 to second node 812 is +90°.

First element 835 and second element 836 are arranged in almost parallel with an end portion of ground plate 834, and third element 837 and fourth element 838 are arranged almost perpendicularly to end portion 834.

Figure 9:
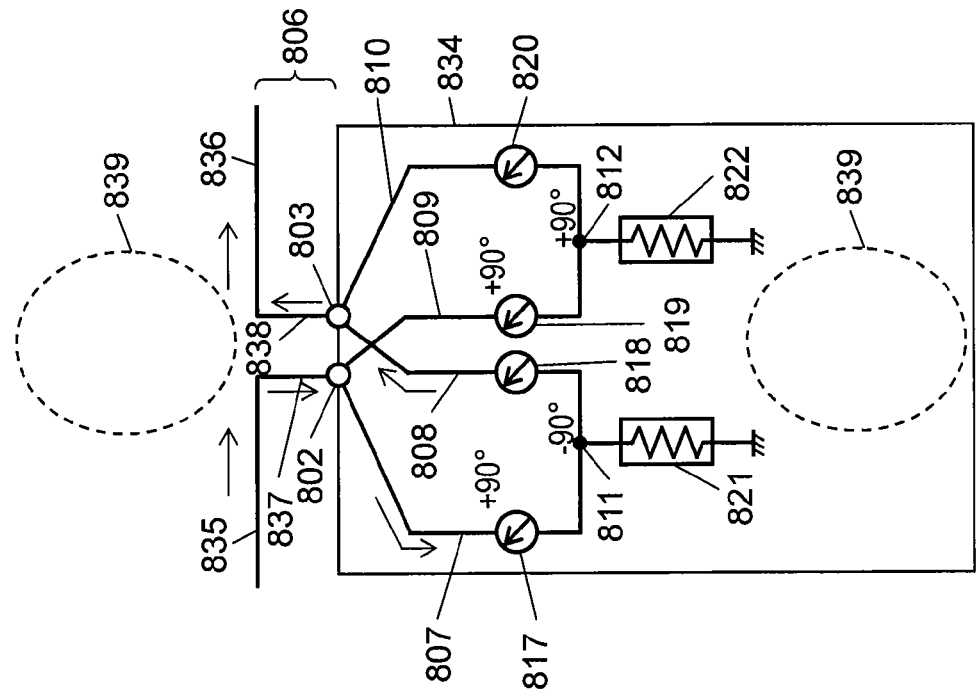
FIG. 9 is a diagram for explaining an operation of antenna using the signal branching filter according to Embodiment 7 of the present invention.

FIG. 9 is a diagram for explaining an operation of antenna using a signal branching filter according to Embodiment 7 of the present invention. FIG. 9 shows a case in which a differential mode signal is generated on antenna element 806. Currents (illustrated by arrows in FIG. 9) having uniform directions are generated on first element 835 and second element 836, respectively, and currents having reversed directions are generated on third element 837 and fourth element 838, respectively.

Therefore, a phase difference between signals generated on first terminal 802 and second terminal 803 is 180°. When the signals are inputted to first terminal 802 and second terminal 803, respectively, a signal appears at fourth line 711 according to the principle described in Embodiment 6, but no signal appears at second node 812. More specifically, when differential mode signals are generated on antenna element 806, the signals are received by first load circuit 821, and the signals are not received by second load circuit 822. When signals are inputted from first load circuit 821 to antenna apparatus 801, the signals are not propagated to second load circuit 822, and most of the signals are supplied to antenna element 806.

The supplied signals cause antenna element 806 to generate differential mode currents (see FIG. 9), and currents are radiated into the air as electromagnetic waves. As current vectors on antenna element 806 which contribute to the radiation, current vectors generated on first element 835 and second element 836 are main current vectors. Since current vectors generated on third element 837 and fourth element 838 have reversed directions, the current vectors do not largely contribute to the radiation.

Therefore, a radiation pattern obtained when a differential mode is generated on antenna element 806 is radiation pattern 839 as indicated by a dotted line. For this reason, when electromagnetic waves mainly perpendicularly coming to first element 835 and second element 836 are received, a differential mode is generated on antenna element 806, and the signal is extracted from only first load circuit 821.

Figure 10:
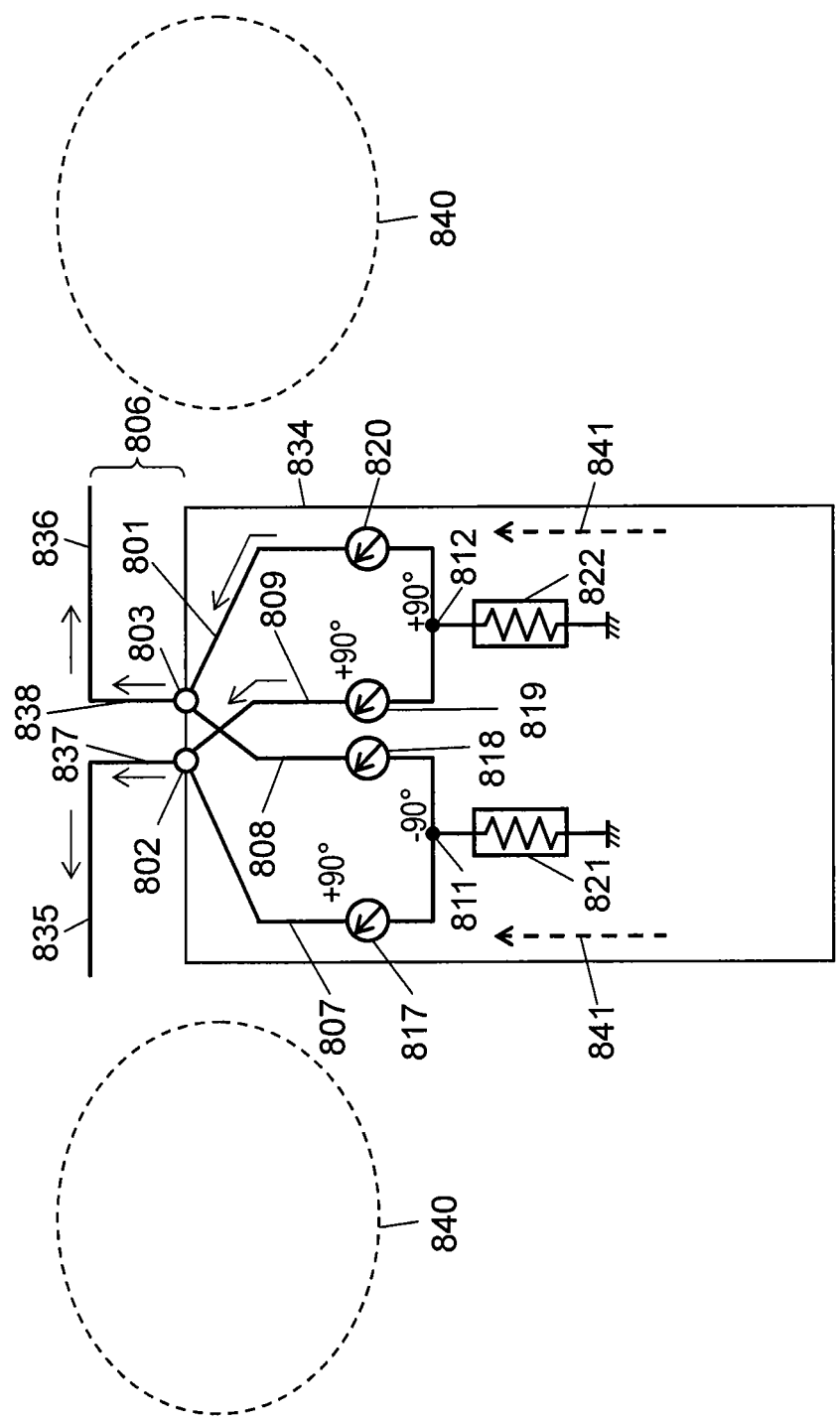
FIG. 10 is a diagram showing an operational principle of the antenna using the signal branching filter according to Embodiment 7 of the present invention.

FIG. 10 is a diagram showing an operational principle of the antenna using the signal branching filter according to Embodiment 7 of the present invention. FIG. 10 shows a case in which a common mode signal is generated on antenna element 806. Currents (indicated by arrows in FIG. 10) having reversed directions are generated on first element 835 and second element 836, respectively, and currents having uniform directions are generated on third element 837 and fourth element 838, respectively. Therefore, a phase difference between the signals generated on first terminal 802 and second terminal 803 is substantially 0°.

When the signals are inputted to first terminal 802 and second terminal 803, respectively, a signal appears at second node 812 according to the principle explained in Embodiment 6, but a signal does not appear at first node 811. More specifically, when a common mode signal is generated on antenna element 806, the signal is received by second load circuit 822. However, the signal is not received by first load circuit 821.

When signals are inputted from second load circuit 822 to antenna apparatus 801, the signals are not propagated to first load circuit 821, most of the signals are supplied to antenna element 806. The supplied signals cause antenna element 806 to generate common mode currents (see FIG. 10) and to radiate the currents into the air as electromagnetic waves.

As current vectors on antenna element 806 which contribute to the radiation, current vectors generated on third element 837 and fourth element 838 and current vector 841 generated on ground plate 834 in conjunction with the current vectors are main current vectors. Since current vectors generated on first element 835 and second element 836 have reversed directions, the current vectors do not largely contribute to the radiation. Therefore, a radiation pattern obtained when a common mode is generated on antenna element 806 is radiation pattern 840 as indicated by a dotted line in FIG. 10. For this reason, when electromagnetic waves mainly perpendicularly coming to third element 837 and fourth element 838 are received, a common mode is generated on antenna element 806, and the signal is extracted from only second load circuit 822.

As described above, when antenna element 806 (for example, a dipole antenna) having a symmetrical structure shown in FIGS. 8 to 10 is used, the antenna can be used as a directional diversity antenna by using only one antenna element. For this reason, the antenna apparatus can be reduced in size and weight.

Antenna element 806 having the symmetrical structure as shown in FIGS. 8 to 10 is used on purpose because, when a common mode signal and a differential mode signal are generated between first terminal 802 and second terminal 803, directions of current vectors which contribute radiation can be made orthogonal to each other (it can also be understood because current vectors which contribute the radiations in FIGS. 9 and 10). Therefore, a diversity gain of a directional diversity antenna realized by only one antenna element which is a characteristic feature of the antenna apparatus using the signal branching filter according to the present invention can be maximized.

A compact directional diversity antenna in which antenna element 806 which have two polarized wave axes (which are not orthogonal to each other) but not have a symmetrical structure can be realized.

Ground plate 834, like antenna element 806, may have an axisymmetrical shape about arbitrary line 844 (see FIG. 8). When a common mode signal is generated between first terminal 802 and second terminal 803, a current vector which contributes radiation is also generated on ground plate 834. For this reason, when ground plate 834 is designed to have a structure which is symmetrical about arbitrary line 844, a directional diversity antenna having a high diversity gain can be realized.

The above fact is also applied to antenna element 506 having the four terminals in FIG. 5 and antenna 606 having the three terminals in FIG. 6.

Figure 11:
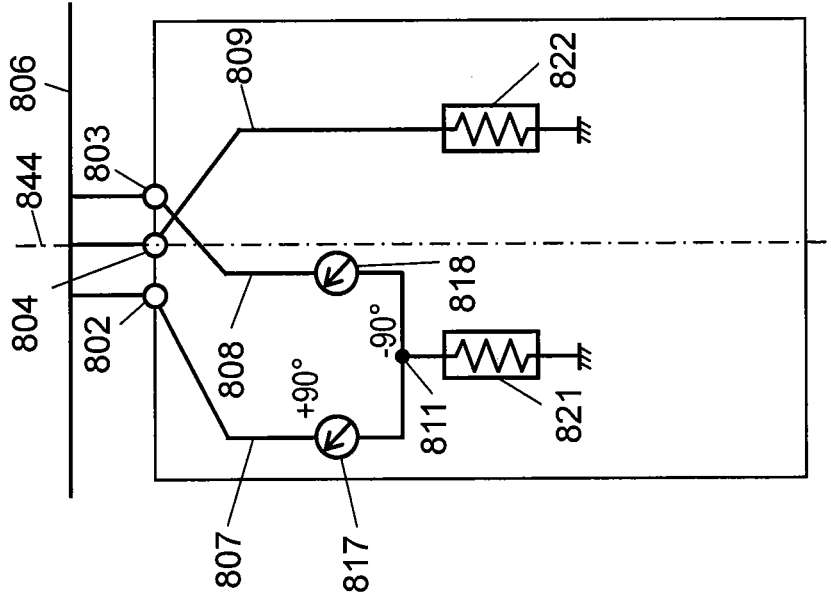
FIG. 11 is a diagram showing the antenna apparatus according to Embodiment 7 of the present invention.

FIG. 11 is a diagram showing the antenna apparatus according to Embodiment 7 of the present invention. In FIG. 11, at a middle point (not shown) between first terminal 802 and second terminal 803 on a first straight line (not shown) which connects first terminal 802 and second terminal 803, antenna element 806 substantially has an axisymmetrical shape about line 844 perpendicular to the first straight line. Furthermore, at a middle point (not shown) between third terminal 804 and fourth terminal 805 on a third straight line (not shown) which connects third terminal 804 and fourth terminal 805, antenna element 806 substantially has an axisymmetrical shape about line 844 perpendicular to the third straight line. When the above shape is employed as antenna element 806, a diversity gain of the directional diversity antenna can be maximized.

Figure 12:
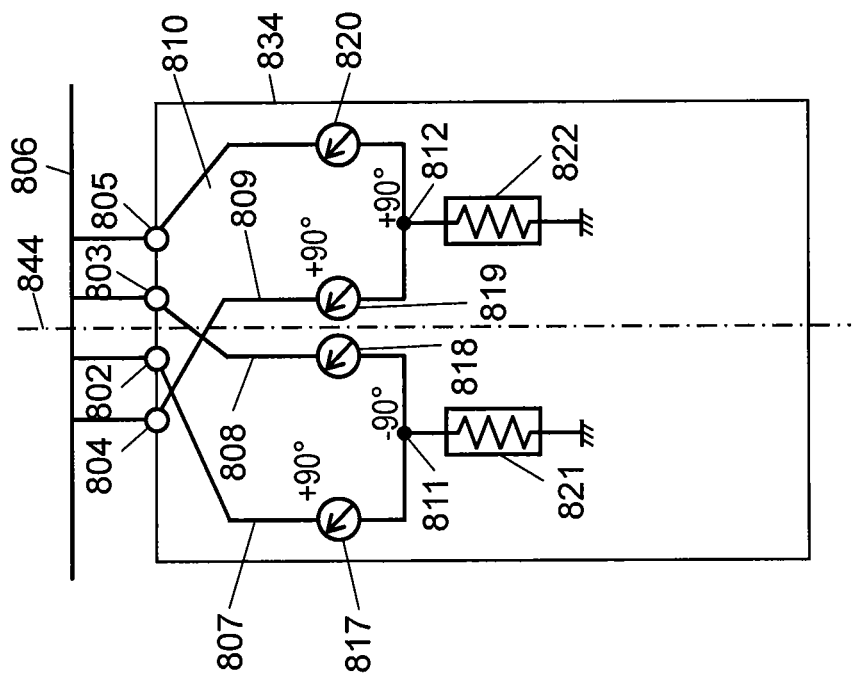
FIG. 12 is a diagram showing another antenna apparatus according to Embodiment 7 of the present invention.

FIG. 12 is a diagram showing another antenna apparatus according to Embodiment 7 of the present invention. In FIG. 12, at a middle point (not shown) between first terminal 802 and second terminal 803 on the straight line (not shown) which connects first terminal 802 and second terminal 803 to each other, antenna element 806 substantially has a axisymmetrical shape about line 844 perpendicular to the first straight line, and third terminal 804 is substantially present on line 844. When the above shape is employed as the above shape, a directional diversity antenna having a high diversity gain can be realized.

Since antenna apparatus 801 according to Embodiment 7 has a high isolation characteristic between first load circuit 821 and second load circuit 822, it can be said that antenna apparatus 801 also has a function of a duplexer. For example, it is understood that first load circuit 821 is used as a reception circuit and that second load circuit 822 is used as a transmission circuit. When antenna apparatus 801 according to the present invention is used as a duplexer, even though transmission/reception signals have the same frequency each, isolation can be assured between first load circuit 821 and second load circuit 822. For this reason, a characteristic which cannot be realized by a conventional duplexer can be realized.

A configuration may be designed such that first node 811 which receives a differential mode signal generated on antenna element 806 is connected to the reception circuit. In this manner, when the differential mode signal which is resistant to external noise is allocated to the reception side, a reception signal can be avoided from being deteriorated by the external noise, and reception capability of the electronic appliance can be improved.

In Embodiment 7, an antenna element (dipole antenna) having a symmetrical structure is used. However, the antenna element is not limited to an antenna element having a symmetrical element, and an asymmetrical antenna element which has at lest two connection terminals may be used. When it is assumed that the antenna element is built in a compact mobile terminal such as a cellular phone, an allowable space for the antenna element is very small. For this reason, an antenna element having a symmetrical structure is difficult to be employed. Therefore, when antenna apparatus 801 according to Embodiment 7 of the present invention is used, even though an antenna element having an asymmetrical structure, two modes, i.e., a common mode and a differential mode generated on the antenna element having the asymmetrical structure can be independently received and transmitted, and the antenna element can be equivalently functioned as two antenna elements. For this reason, an antenna apparatus suitable for a compact electronic appliance having a small allowable capacity for an antenna element can be realized.

The antenna apparatus according to Embodiment 7 may be used as an in-vehicle antenna which receives television broadcast or radio broadcast.

In this case, for example, antenna element 806 according to the embodiment formed on a transparent resin film is stuck on a windowshield to realize the antenna apparatus according to Embodiment 7, so that a diversity antenna which is compact and excellent in reception capability can be realized. In this case, first node 811 and first load circuit 821 (for example, a receiver such as a TV tuner or a demodulation circuit) are connected to each other by a coaxial cable having a length of about 5 m, and second node 812 and second load circuit 822 (for example, a receiver such as a TV tuner or a demodulation circuit) are connected to each other by the coaxial cable. However, when a transmitting method which will be described in Embodiment 8 (will be described later) or later is employed, the number of signal lines can be reduced from 2 to 1. In this manner, weight reduction and production efficiency can be improved.

Amplifiers are connected between third element 837 and first terminal 802 and between fourth element 838 and second terminal 803 to make it possible to reduce deterioration of an NF characteristic caused by losses from first terminal 802 and second terminal 803 to the antenna apparatus 801 side.

FIGS. 13 to 22 show an example in which antenna apparatus 801 according to Embodiment 7 is designed at 620 MHz by using an antenna element configured by first element 835 and third element 837 each having an input impedance of 50Ω when viewed from first terminal 802 and an antenna element configured by second element 836 and fourth element 838 each having an input impedance of 50Ω when viewed from second terminal 803. In FIGS. 13 to 22, reference symbol freq denotes a frequency, and reference symbol impedance denotes an impedance.

Figure 13:
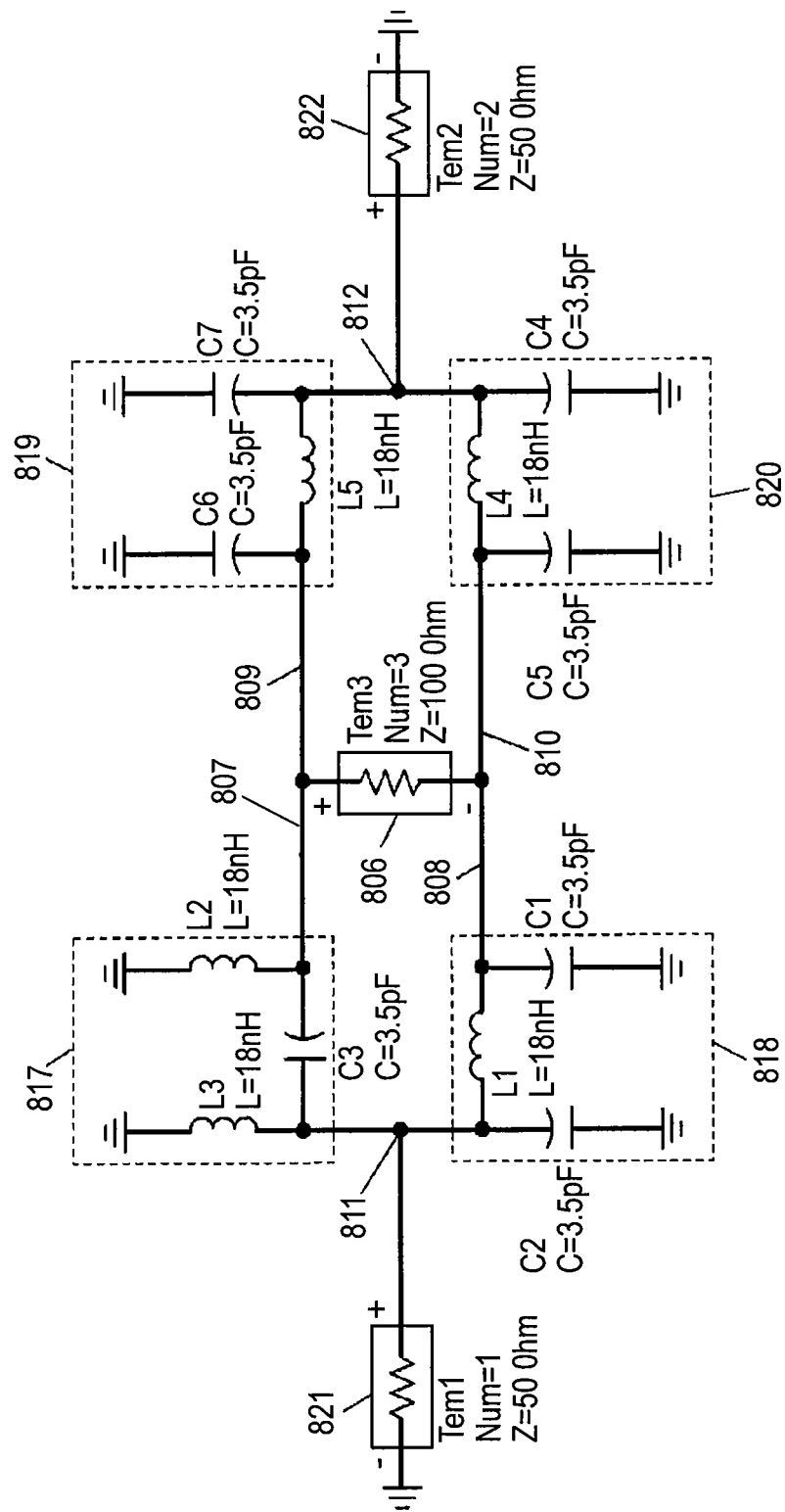
FIG. 13 is a diagram showing an example in which the antenna apparatus according to Embodiment 7 is designed at 620 MHz.
Figure 14:
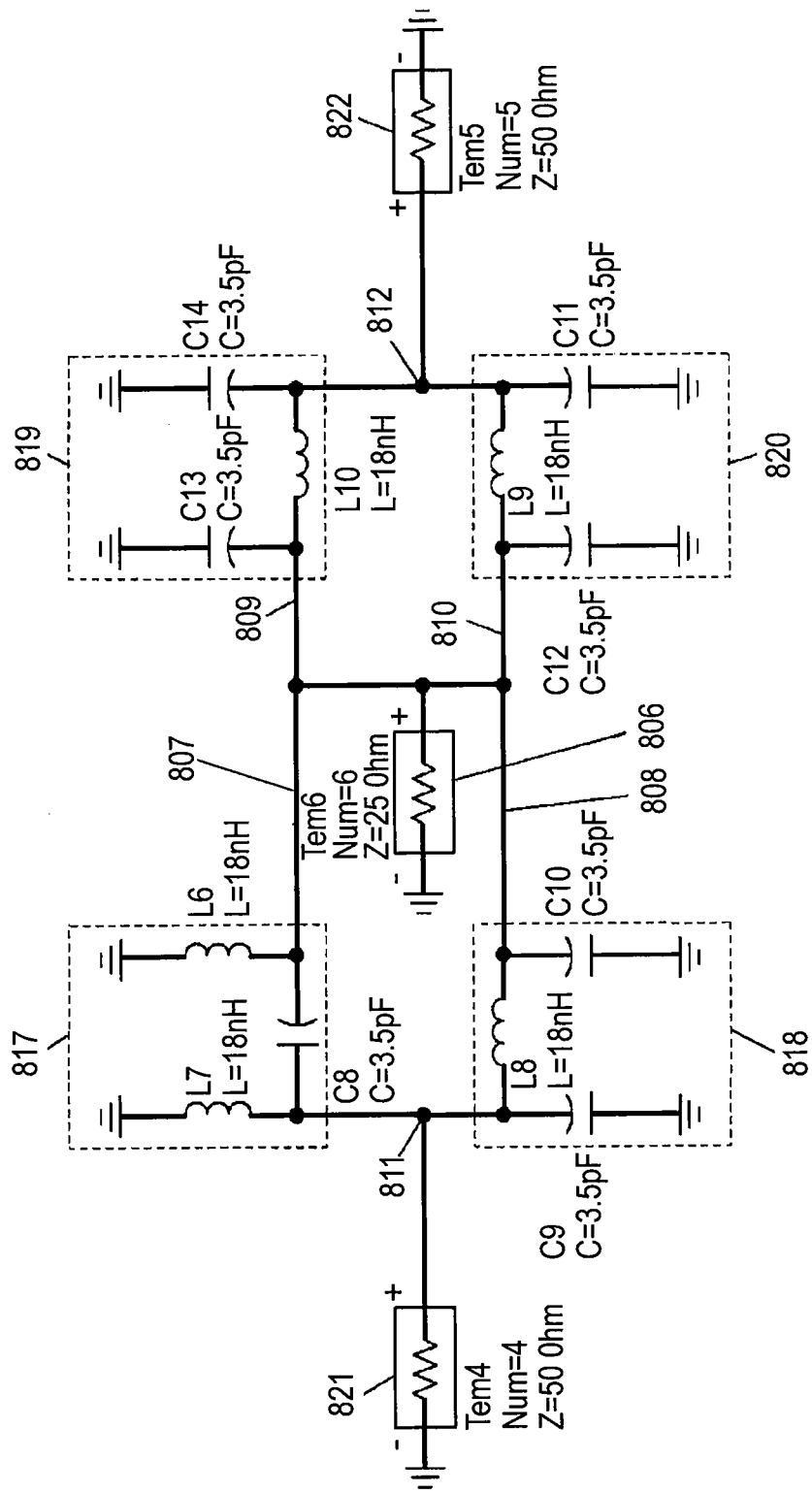
FIG. 14 is a diagram showing an example in which the antenna apparatus according to Embodiment 7 is designed at 620 MHz.

FIG. 13 is a diagram showing a case in which antenna element 806 according to Embodiment 7 operates in a differential mode. FIG. 14 is a diagram showing a case in which antenna element 806 according to Embodiment 7 operates in a common mode. When antenna element 806 operates in the differential mode (see FIG. 13), the antenna element configured by first element 835 and third element 837 and an antenna element configured by second element 836 and fourth element 838 are connected in series with each other.

For this reason, an input impedance of antenna element 806 when viewed from first terminal 802 and second terminal 803 is 100 Ω.

When antenna element 806 operates in the common mode (see FIG. 14), the antenna element configured by first element 835 and third element 837 and an antenna element configured by second element 836 and fourth element 838 are connected in parallel with each other. For this reason, an input impedance of antenna element 806 when viewed from first terminal 802 and second terminal 803 is 25 Ω.

Since the above facts are reflected on the design, the input impedance of antenna element 806 (port number 3) in FIG. 13 is 100Ω, and an input impedance of antenna element 806 (port number 6) in FIG. 14 is 25Ω. Since a general high-frequency circuit is designed at 50Ω, first load circuit 821 (port number 1) and second load circuit 822 (port number 2) in FIG. 13, first load circuit 821 (port number 4) in FIG. 14, and second load circuit 822 (port number 5) are designed such that the input impedances of these circuits are 50Ω each. In FIGS. 13 and 14, first phase shifter 817, second phase shifter 818, third phase shifter 819, and fourth shifter 820 are realized by reactance elements of 803 element.

Figure 15:
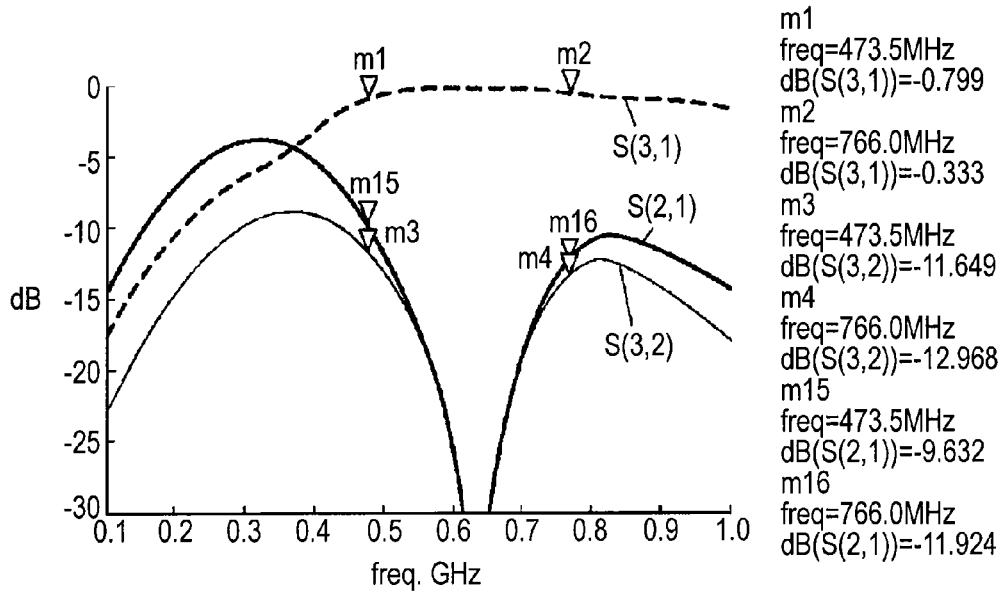
FIG. 15 is a graph showing an example in which the antenna apparatus according to Embodiment 7 is designed at 620 MHz.

FIG. 15 is a graph showing passing characteristics of the antenna apparatus according to Embodiment 7. FIG. 15 shows the passing characteristic between antenna element 806 (port number 3), first load circuit 821 (port number 1), and second load circuit 822 (port number 2) when antenna element 806 shown in FIG. 13 operates in the differential mode. For example, S(3,1) denotes a passing characteristic from first load circuit 821 (port number 1) to antenna element 806 (port number 3). As is apparent from FIG. 15, passing characteristic S(3,1) from first load circuit 821 (port number 1) to antenna element 806 (port number 3) is almost 0 dB at 620 MHz, and a conduction state is set. In contrast to this, passing characteristic S(3,2) from second load circuit 822 (port number 2) to antenna element 806 (port number 3) is −30 dB or less at 620 MHz, and it is understood that high isolation can be obtained. Passing characteristic S(2,1) from first load circuit 821 (port number 1) to second load circuit 822 (port number 2) is also −30 dB or less at 620 MHz, and it is understood that high isolation can be obtained.

Figure 16:
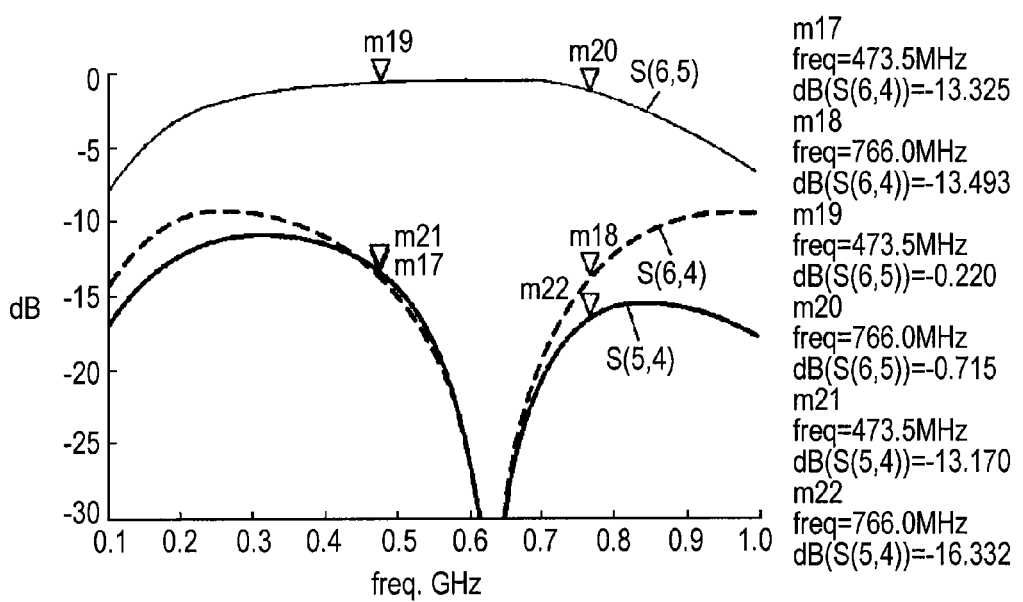
FIG. 16 is a graph showing an example in which the antenna apparatus according to Embodiment 7 is designed at 620 MHz.
Figure 17:
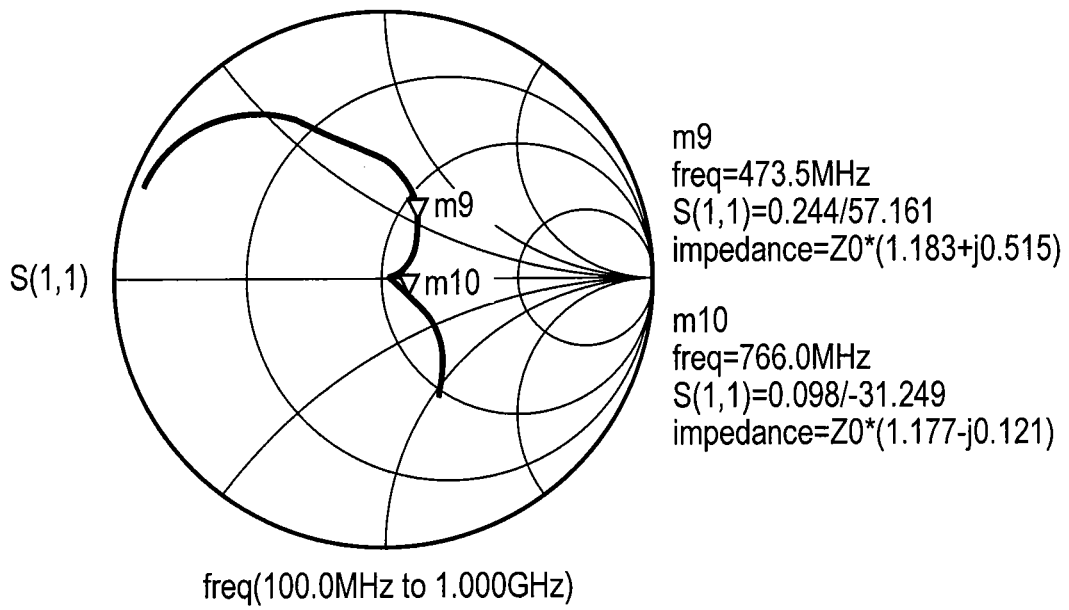
FIG. 17 is a diagram showing an example in which the antenna apparatus according to Embodiment 7 is designed at 620 MHz.
Figure 18:
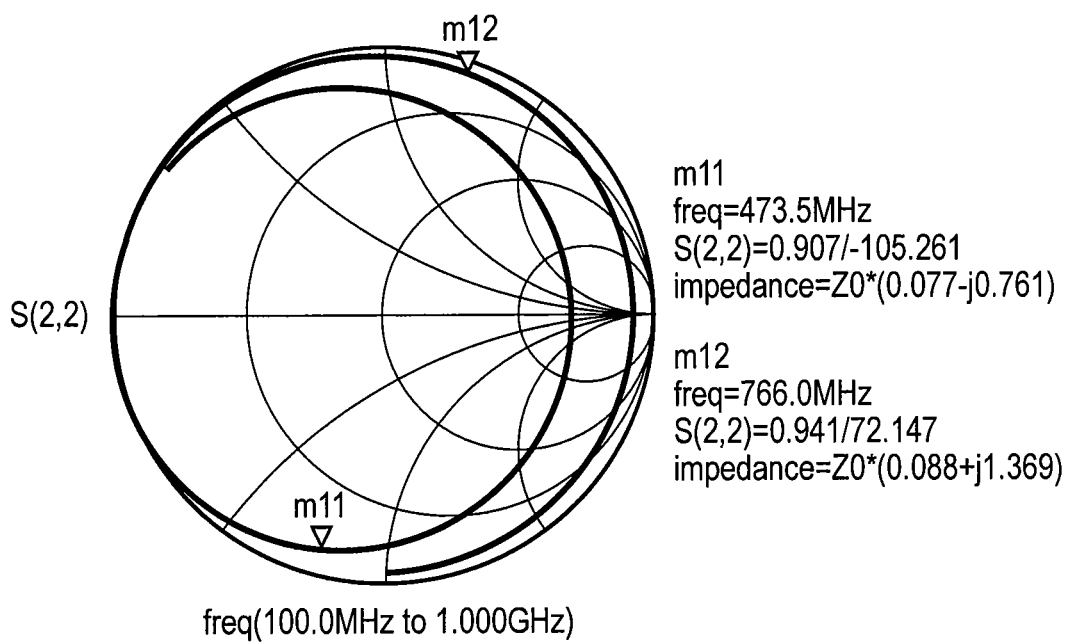
FIG. 18 is a diagram showing an example in which the antenna apparatus according to Embodiment 7 is designed at 620 MHz.
Figure 19:
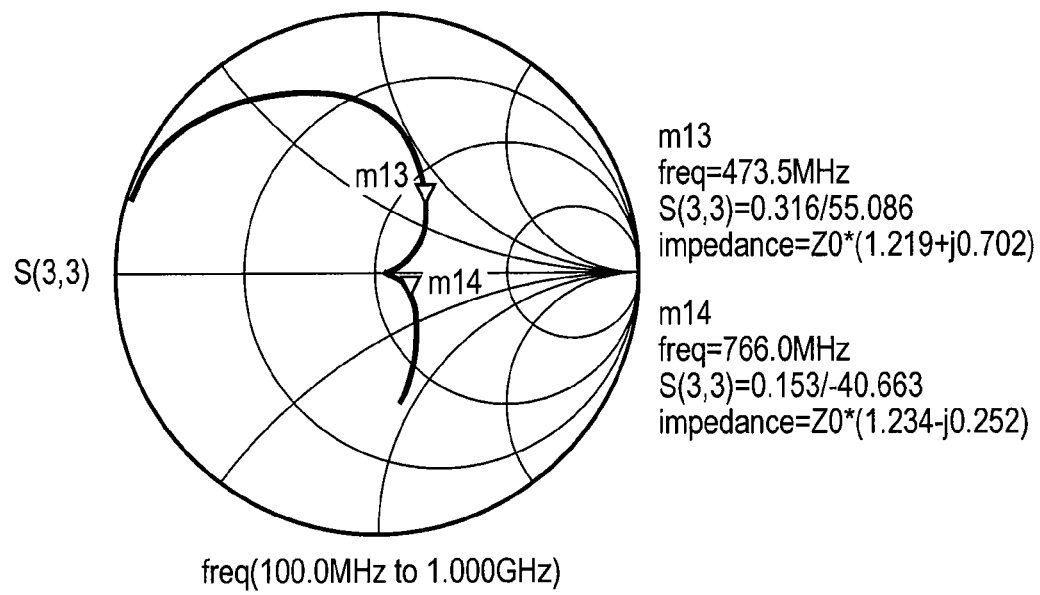
FIG. 19 is a diagram showing an example in which the antenna apparatus according to Embodiment 7 is designed at 620 MHz.
Figure 20:
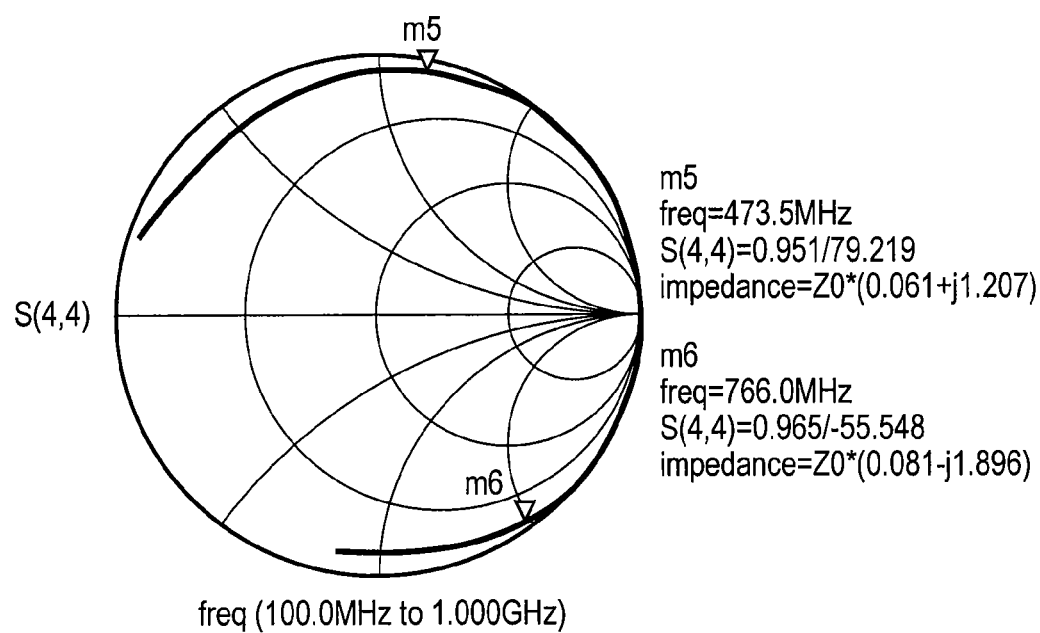
FIG. 20 is a diagram showing an example in which the antenna apparatus according to Embodiment 7 is designed at 620 MHz.
Figure 21:
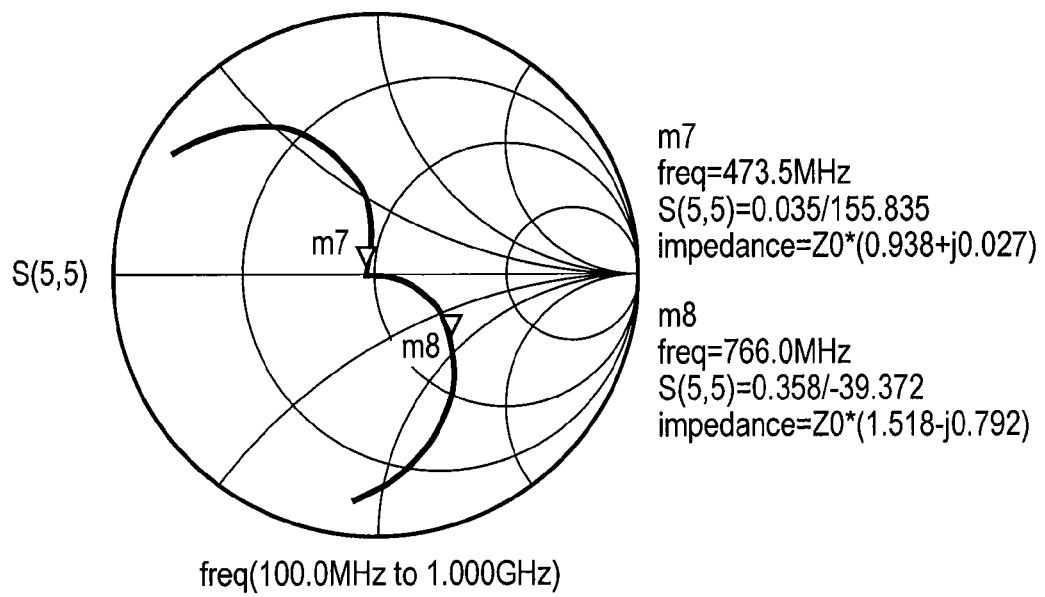
FIG. 21 is a diagram showing an example in which the antenna apparatus according to Embodiment 7 is designed at 620 MHz.
Figure 22:
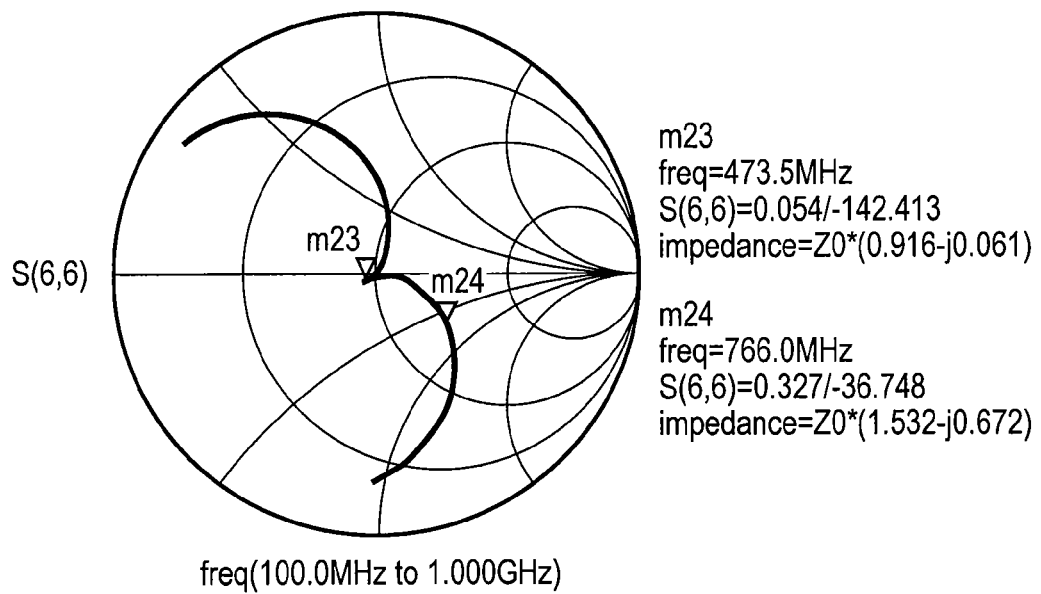
FIG. 22 is a diagram showing an example in which the antenna apparatus according to Embodiment 7 is designed at 620 MHz.

FIG. 16 is a graph showing passing characteristics of another antenna apparatus according to Embodiment. FIG. 16 shows the passing characteristic between antenna element 806 (port number 6), first load circuit 821 (port number 4), and second load circuit 822 (port number 5) when antenna element 806 shown in FIG. 14 operates in the common mode. For example, S(6,4) denotes a passing characteristic from first load circuit 821 (port number 4) to antenna element 806 (port number 6). As is apparent from FIG. 16, passing characteristic S(6,5) from second load circuit 822 (port number 5) to antenna element 806 (port number 6) is almost 0 dB at 620 MHz, and a conduction state is set. In contrast to this, passing characteristic S(6,4) from first load circuit 821 (port number 4) to antenna element 806 (port number 6) is −30 dB or less at 620 MHz, and it is understood that high isolation can be obtained. Passing characteristic S(5,4) from first load circuit 821 (port number 4) to second load circuit 822 (port number 5) is also −30 dB or less at 620 MHz, and it is understood that high isolation can be obtained.

As described above, it can be understood that an operation of the antenna apparatus described in FIGS. 5 to 10 can be actually realized. For reference, in FIGS. 17 to 22, impedance characteristics at the ports of port number 1 to port number 6. In FIGS. 17 to 22, for example, S(1,1) denotes an input impedance characteristic when the first node 811 side is viewed from first load circuit 821 in FIG. 13.

Antenna element 806 and the signal branching filter in FIG. 8 may be designed such that characteristic impedances of a first line, a second line, a third line, and a fourth line are Zo each, and an input impedance viewed from a first node of a first load circuit connected to the first node, an input impedance viewed from a second node of a second load circuit connected to the second node, an input impedance of antenna element 806 viewed from the first terminal, and an input impedance of antenna element 806 viewed from the second terminal are almost Zo/2 each. This is because the antenna apparatus shown in FIG. 8 is expressed by the equivalent circuit shown in FIGS. 13 and 14.

For this reason, impedance matching between antenna element 806 and first load circuit 821 or second load circuit 822 can be easily obtained, and a reflection loss can be reduced. FIGS. 14 and 15 satisfy the above impedance relations. As a result, as shown in FIGS. 17 to 22, preferable electric characteristics can be realized.

The first load circuit and the second load circuit in Embodiments 4 to 7 actually represent communication circuits which perform signal reception and signal transmission, and mounted on mounting boards installed in electronic appliances.

In FIGS. 5 to 10, a first line serving as one line, one first matching circuit, and one first phase shifter are arranged between the first terminal and the first node. However, a plurality of lines, a plurality of matching circuits, and a plurality of phase shifting circuits may be arranged between the first terminal and the first node. This is also applied to configurations between the second terminal and the first node, between the third terminal and the second node, and between the fourth terminal and the second node. The "first line", the "second line", the "third line", and the "fourth line" include lines each configured by a plurality of lines. Similarly, the "first matching circuit", the "second matching circuit", the "third matching circuit", and the "fourth matching circuit" include matching circuits each configured by a plurality of matching circuits, and the "first phase shifter", the "second phase shifter", the "third phase shifter, and the "fourth phase shifter" include phase shifters each configured by a plurality of phase shifters.

Embodiment 8

Figure 23:
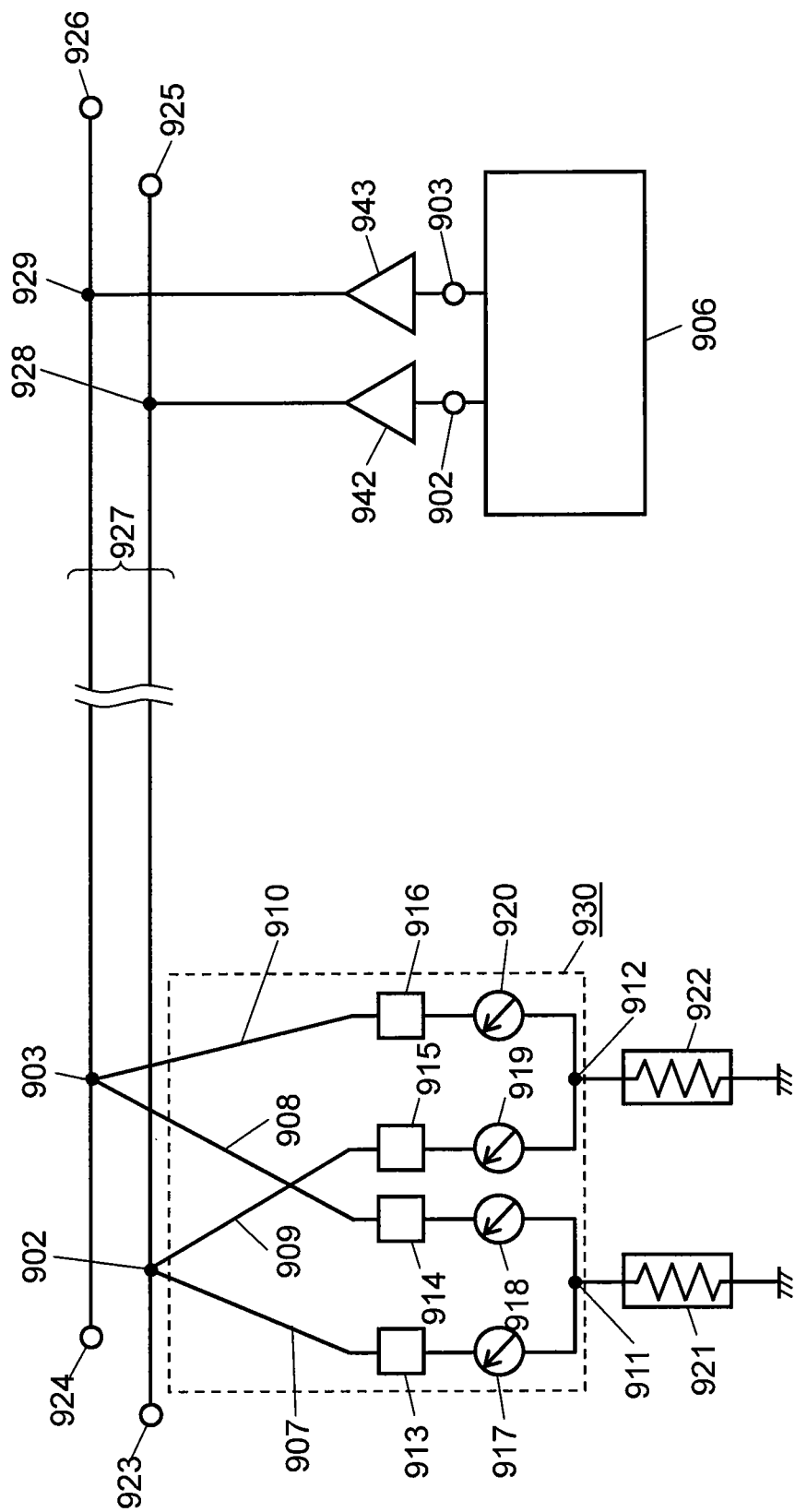
FIG. 23 is a block diagram in which the antenna apparatus according to Embodiments 4 to 6 of the present invention is used in an electronic appliance.

FIG. 23 is a block diagram in which the antenna apparatus according to Embodiments 4 to 6 of the present invention is used in an electronic appliance. With respect to the same configuration as that of Embodiment 6, only the same reference numerals are described, and a different configuration will be mainly described below.

In FIG. 23, antenna element 906 having first terminal 902 and second terminal 903 is connected to first amplifier 942 through first terminal 902 and connected to second amplifier 943 through second terminal 903. First amplifier 942 is connected to a two-terminal-pair line 927 at ninth terminal 928, and second amplifier 943 is connected to two-terminal-pair line 927 at tenth terminal 929. First matching circuit 913 and third matching circuit 915 of first signal branching filter 930 are connected to first terminal 902 of two-terminal-pair line 927, and second matching circuit 914 and fourth matching circuit 916 of first signal branching filter 930 are connected to second terminal 903 of two-terminal-pair line 927.

Furthermore, first phase shifter 917 is connected between first matching circuit 913 and first node 911, second phase shifter 918 is connected between second matching circuit 914 and first node 911, third phase shifter 919 is connected between third matching circuit 915 and second node 912, and fourth phase shifter 920 is connected between fourth matching circuit 916 and second node 912.

In this case, it is assumed that line lengths of first line 907, second line 908, third line 909, and fourth line 910 of first signal branching filter 930 in FIG. 23, first matching circuit 913, second matching circuit 914, third matching circuit 915, fourth matching circuit 916, first phase shifter 917, second phase shifter 918, third phase shifter 919, and fourth phase shifter 920 are designed.

In this case, for example, when it is assumed that differential mode signal 1 and common mode signal 2 are generated on antenna element 906, signal 1 is propagated through two-terminal-pair line 927 in a differential mode, and signal 2 is propagated through two-terminal-pair line 927 in a common mode. More specifically, signal 1 and signal 2 are mixed in two-terminal-pair line 927 and propagated. The mixed signals can be almost accurately separated from each other by first signal branching filter 930. More specifically, according to the principle described in Embodiment 6, only signal 1 propagated in the differential mode is received by first load circuit 921, and only signal 2 propagated in common mode is received by first load circuit 922. That is, the antenna apparatus according to the present invention is used to make it possible to perform transmission and reception of signals of two types by using one antenna element 906.

The antenna apparatus according to Embodiment 8 may be used such that, for example, a first signal and a second signal are inputted/outputted in the differential mode and the common mode from fifth terminal 923 and sixth terminal 924 of two-terminal-pair line 927 or seventh terminal 925 and eighth terminal 926, received by first signal branching filter 930, and transmitted by antenna element 906. In this manner, in a network in which a large number of load circuits are connected to two-terminal-pair line 927, data transmission/reception between the load circuits can be performed at a high speed.

In contrast to this, fifth terminal 923, sixth terminal 924, seventh terminal 925, and eighth terminal 926 may be removed, first terminal 902 and second terminal 903 may be connected to one end of two-terminal-pair line 927, and ninth terminal 928 and tenth terminal 929 may be connected to the other end of two-terminal-pair line 927. In this manner, the structure of two-terminal-pair line 927 can be simplified.

Two-terminal-pair line 927 may have a shape plane-symmetrical about an arbitrary plane. When the shape is employed, for example, a common mode signal can be prevented from being converted into a differential mode signal while being propagated through two-terminal-pair line 927.

Furthermore, the exterior of two-terminal-pair line 927 may be shielded. When the exterior is shielded, an S/N (Signal/Noise) characteristic of a signal propagated in a common mode can be mainly prevented from being deteriorated by noise coming from the outside, and a signal which is being transmitted through two-terminal-pair line 927 in the common mode can be prevented from being radiated and lost.

In consideration of the fact, signals to be transmitted may be selectively used depending on the transmission modes such that signals in a modulating method (for example, 64 QAM, 16 QAM, or the like) having large transmission quantity are transmitted in the differential mode, and signals in a modulating method (for example, QPSK, BPSK, or the like) which does not require a high receiving sensitivity because of relatively small transmission quantity are transmitted in the common mode.

Furthermore, when the antenna apparatus according to Embodiment 8 is used, an amount of noise received by two-terminal-pair line 927 can be recognized by second load circuit 922 which receives a common mode signal. This is because noise coming from the outside and leaking into two-terminal-pair line 927 is mainly propagated on two-terminal-pair line 927 in the common mode.

The frequencies of signal 1 and signal 2 may be equal to each other or different from each other. This is because the signals can be independently inputted/outputted from first load circuit 921 and second load circuit 922, respectively.

First amplifier 942 and second amplifier 943 can be operated as low-noise amplifiers. In this manner, NF characteristic deterioration of a receiving system caused by losses of circuits (for example, corresponding to two-terminal-pair line 927, first signal branching filter 930, and the like) connected to the outputs of first amplifier 942 and second amplifier 943 can be reduced.

For example, when a common mode is transmitted to two-terminal-pair line 927, a transmission loss is generated by radiation. However, when first amplifier 942 and second amplifier 943 are used, the NF characteristic deterioration can be reduced. In FIG. 23, since reception of a signal is consciously explained, only first amplifier 942 and second amplifier 943 which amplify signals from antenna element 906 are described. However, a third amplifier which amplifies a signal from two-terminal-pair line 927 may be connected between ninth terminal 928 and first terminal 902 in parallel with first amplifier 942, and a fourth amplifier which amplifies a signal from two-terminal-pair line 927 may be connected between tenth terminal 929 and second terminal 903 in parallel with second amplifier 943. In this manner, when one antenna element 906 and one two-terminal-pair line 927 are only used, two independent signals can be handled on the transmission side and the reception side, respectively, and data transmission quantity of an electronic appliance can be increased.

In the above description, when antenna element 906 operates as an antenna in a common mode and a differential mode, for example, two-terminal-pair line 927 operates as a part of the antenna. For this reason, the size of antenna element 906 can be equivalently increased, and a radiation resistance of the antenna apparatus can be increased.

This appears as a more conspicuous advantage because, for example, when the antenna apparatus is applied to an in-vehicle antenna which receives the television broadcast or radio broadcast, two-terminal-pair line 927 has a large length of about 5 m. This advantage is more conspicuous when first amplifier 942 and second amplifier 943 are not arranged.

Figure 24:
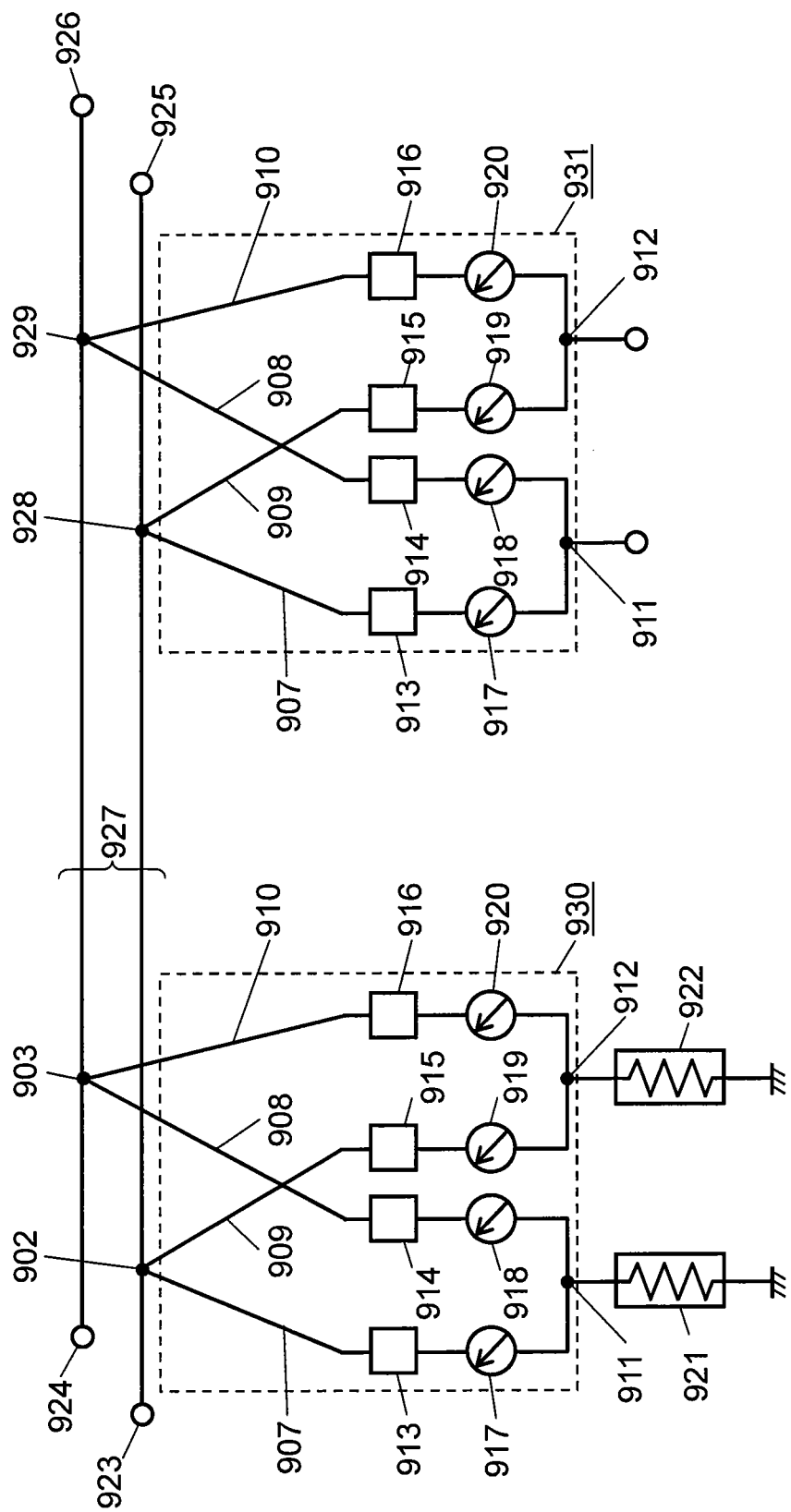
FIG. 24 is a diagram showing another antenna apparatus according to Embodiment 8 of the present invention.

FIG. 24 is a diagram showing another antenna apparatus according to Embodiment 8 of the present invention. In FIG. 24, second signal branching filter 931 is connected to ninth terminal 928 and tenth terminal 929 in FIG. 23. The antenna apparatus in FIG. 24 is used such that first node 911 of second signal branching filter 931 and, for example, at least one first node 911 of the antenna apparatus in FIGS. 5 to 7 are connected to each other and second node 912 of second signal branching filter 931 and at least one second node 912 of the antenna apparatus in FIG. 7 are connected to each other. In this manner, at first node 911, differential mode signals obtained from two-terminal-pair line 927 and antenna element 906 are extracted. At second node 912, common mode signals obtained from two-terminal-pair line 927 and antenna element 906 are extracted. Therefore, load circuits are connected to first node 911 and second node 912, respectively, and signals can be efficiently supplied from the load circuits to a plurality of targets.

Embodiment 9

In Embodiment 9, a case of a signal transmitting system will be described below as an example of an electronic appliance using a signal branching filter according to the present invention. In order to facilitate understanding, a general signal transmitting system will be described first with reference to FIG. 25. Thereafter, a signal transmitting system using a signal branching filter according to the present invention or using a principle of the signal branching filter will be described.

Figure 25:
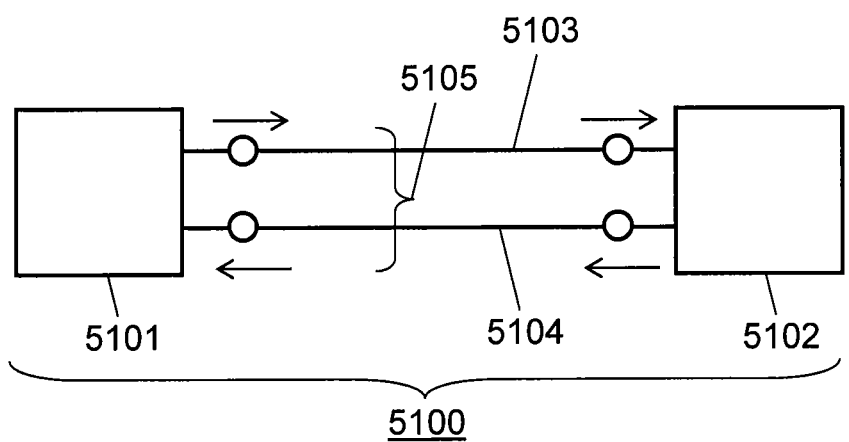
FIG. 25 is a block diagram of a signal transmitting system used in a general cellular phone system.

FIG. 25 is a block diagram of a signal transmitting system used in a general cellular phone. In FIG. 25, general signal transmitting system 5100 has first high-frequency circuit 5101 and second high-frequency circuit 5102, and first high-frequency circuit 5101 and second high-frequency circuit 5102 are electrically connected to each other by two-terminal-pair line 5105 configured by first transmission line 5103 and second transmission line 5104.

For example, when a signal is to be transmitted from first high-frequency circuit 5101 to second high-frequency circuit 5102, in general, a signal output to first transmission line 5103 and a signal input from second transmission line 5104 substantially have absolute values of the same amplitude and reversed phases (This manner of transmitting a signal is called a differential mode. Arrows in FIG. 25 illustrate directions of currents of signals.).

In general, as two-terminal-pair line 5105, a feeder line, a coaxial line, or the like is used. In general signal transmitting system 5100, two-terminal-pair line 5105, first high-frequency circuit 5101, and second high-frequency circuit 5102 may receive noise from an external device. In this case, since noise is substantially transmitted through two-terminal-pair line 5105 in a common mode, a common mode filter may be connected to the middle of two-terminal-pair line 5105 to reject noise.

Since the general signal transmitting system can transmit only one signal through two-terminal-pair line for an arbitrary time, two or more signals each having the same frequency cannot be transmitted for the same time. If two signals are transmitted in the differential mode for the same time, the two signals interfere with each other and cannot be separated from each other on the reception side. This means that, for example, in a cellular phone, a speed at which data is transmitted cannot be increased to a predetermined level or more.

As a signal transmitting system according to Embodiment 9 of the present invention, a signal transmitting system which can transmit two signals each having the same frequency for the same time is provided.

The signal transmitting system according to Embodiment 9 of the present invention transmits a first signal in a differential mode by using two-terminal-pair line and transmits a second signal in a common mode.

The signal transmitting system according to Embodiment 9 of the present invention is configured such that the first signal is transmitted in the differential mode by using the two-terminal-pair line and the second signal is transmitted in the common mode. For this reason, a signal transmitting system which can transmit the first signal and the second signal serving as two signals each having the same frequency for the same time through one two-terminal-pair line can be provided.

Figure 26:
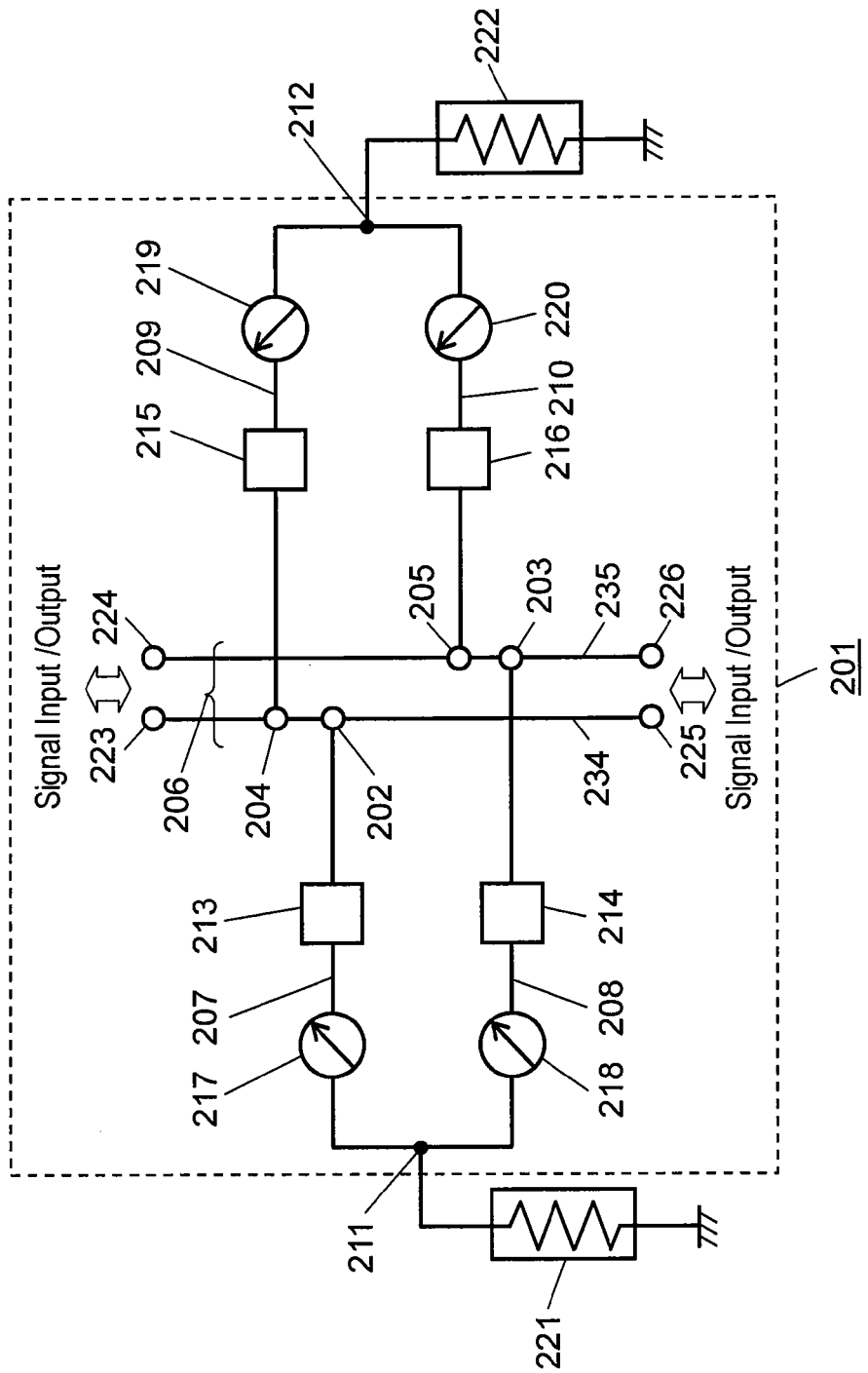
FIG. 26 is a block diagram of a signal transmitting system according to Embodiment 9 of the present invention.

FIG. 26 is a block diagram of the signal transmitting system according to Embodiment 9 of the present invention. In FIG. 26, signal transmitting system 201 according to Embodiment 9 has two-terminal-pair line 206 having at least four terminals including first terminal 202, second terminal 203, third terminal 204, and fourth terminal 205, first line 207 one end of which is connected to first terminal 202 of two-terminal-pair line 206, second line 208 one end of which is connected to second terminal 203 of two-terminal-pair line 206, third line 209 one end of which is connected to third terminal 204 of two-terminal-pair line 206, and fourth line 210 one end of which is connected to fourth terminal 205 of two-terminal-pair line 206. The other end of first line 207 and the other end of second line 208 are connected to each other at first node 211, and the other end of third line 209 and the other end of fourth line 210 are connected to each other at second node 212.

Furthermore, signal transmitting system 201 according to Embodiment 9 has first matching circuit 213 and first phase shifter 217 which are connected to the middle of first line 207, second matching circuit 214 and second phase shifter 218 which are connected to the middle of second line 208, third matching circuit 215 and third phase shifter 219 which are connected to the middle of third line 209, and fourth matching circuit 216 and fourth phase shifter 220 which are connected to the middle of fourth line 210. First load circuit 221 is connected to a point between first node 211 and the ground, and second load circuit 222 is connected to a point between second node 212 and the ground.

Furthermore, two-terminal-pair line 206 has sixth terminal 223, seventh terminal 224, eighth terminal 225, and ninth terminal 226. In this case, when a signal is received from first node 211, a phase difference between a phase of a signal appearing on the second node 212 side of third line 209 and a phase of a signal appearing on the second node 212 side of fourth line 210 is almost $180°\pm360°*n$ (n is an integer equal to or larger than 0). When a signal is received from second node 212, a phase difference between a phase of a signal appearing on the first node 211 side of first line 207 and a phase of a signal appearing on the first node 211 side of second line 208 is almost $180°\pm360°*n$ (n is an integer equal to or larger than 0).

In order to satisfy the above conditions, line lengths of first line 207, second line 208, third line 209, and fourth line 210, first matching circuit 213, second matching circuit 214, third matching circuit 215, and fourth matching circuit 216, and first phase shifter 217, second phase shifter 218, third phase shifter 219, and fourth phase shifter 220 are designed to have appropriate values. For this reason, for example, a signal transmitted from first load circuit 221 is not generally propagated from second node 212 to second load circuit 222 because the phase difference between the phase of the signal appearing on the second node 212 side of third line 209 and the phase of the signal appearing on the second node 212 side of fourth line 210 is almost $180°\pm360°*n$ (n is an integer equal to or larger than 0).

In contrast to this, a signal transmitted from second load circuit 222 is not generally propagated from first node 211 to the first load circuit 221 side because the phase difference between the phase of the signal appearing on the first node 211 side of first line 207 and the phase of the signal appearing on the first node 211 side of second line 208 is almost $180°\pm360°*n$ (n is an integer equal to or larger than 0).

Therefore, no signal is propagated between first load circuit 221 and second load circuit 222, and isolation can be assured between first load circuit 221 and second load circuit 222. For this reason, first load circuit 221 and second load circuit 222 can mutually independently perform signal exchanges with two-terminal-pair line 206. More specifically, first load circuit 221 and second load circuit 222 can mutually independently perform signal exchange without being limited with respect to time and frequency.

Furthermore, the line lengths of first line 207 and second line 208, first matching circuit 213 and second matching circuit 214, and first phase shifter 217 and second phase shifter 218 may be designed such that, when signals each having the same phase and the same amplitude are inputted to first terminal 202 and second terminal 203, respectively, the difference between the phase of the signal appearing on the first node 211 side of first line 207 and the phase of the signal appearing on the first node 211 side of second line 208 is almost 180°±360°*n (n is an integer equal to or larger than 0). In this case, for example, when common mode signals are inputted across first terminal 202 and second terminal 203, a phase difference between currents of the common mode signals is zero between first terminal 202 and second terminal 203.

Therefore, when the signals each having the same phase and having equal absolute values of amplitudes are inputted to first terminal 202 and second terminal 203, respectively, the difference between the phase of the signal appearing on the first node 211 side of first line 207 and the phase of the signal appearing on the first node 211 side of second line 208 is almost 180°±360°*n (n is an integer equal to or larger than 0). For this reason, at first node 211, the currents of the common mode signals are canceled out, and a common mode signal is not generally propagated from first node 211 to the first load circuit side.

In contrast to this, for example, when differential mode signals are inputted across first terminal 202 and second terminal 203, a phase difference between the differential mode signals is ±180° between first terminal 202 and second terminal 203. Therefore, when signals having a phase difference of ±180° and the equal absolute values of the amplitudes are inputted to first terminal 202 and second terminal 203, respectively, the difference between the phase of the signal appearing on the first node 211 side of first line 207 and the phase of the signal appearing on the first node 211 side of second line 208 is almost 180°±360°*n (n is an integer equal to or larger than 0). For this reason, at first node 211, the currents of the differential mode signals are summed up, and the signal is generally propagated from first node 211 to the first load circuit side.

As described above, when signal transmitting system 201 is designed such that, when signals each having the same phase and the equal absolute values of the amplitudes are inputted to first terminal 202 and second terminal 203, respectively, the difference between the phase of the signal appearing on the first node 211 side of first line 207 and the phase of the signal appearing on the first node 211 side of second line 208 is almost 180°±360°*n (n is an integer equal to or larger than 0), only differential mode signals generated between first terminal 202 and second terminal 203 can be selected and propagated to first load circuit 221.

Furthermore, when the condition in which the difference between the phase of the signal appearing on the first node 211 side of first line 207 and the phase of the signal appearing on the first node 211 side of second line 208 is almost 180°±360°*n (n is an integer equal to or larger than 0) when signals each having the same phase and the equal absolute values of the amplitudes are inputted to first terminal 202 and second terminal 203, respectively and the condition in which the phase difference between the phase of the signal appearing on the second node 212 side of third line 209 and the phase of the signal appearing on the second node 212 side of fourth line 210 is almost 180° when a signal is received from first node 211 are considered, a difference between a change in phase from first terminal 202 to second node 212 and a change in phase from second terminal 203 to second node 212 substantially becomes zero.

More specifically, currents of common mode signals generated between first terminal 202 and second terminal 203 are summed up in the same phase at second node 212, and the signals are substantially propagated from second node 212 to the second load circuit 222 side.

In contrast to this, the currents of the differential mode signals generated between first terminal 202 and second terminal 203 are summed up in reversed phases at second node 212 and canceled out, and the signals are not substantially propagated from second node 212 to the second load circuit 222 side.

Therefore, the differential mode signals generated between first terminal 202 and second terminal 203 are substantially propagated to only the first load circuit 221 side, and the common mode signals generated between first terminal 202 and second terminal 203 are substantially propagated to only the second load circuit 222 side. More specifically, signal transmitting system 201 according to Embodiment 9 can independently extract the signals of the two modes generated between first terminal 202 and second terminal 203.

More specifically, for example, when the first signal transmitted in the differential mode and the second signal transmitted in the common mode and having the same frequency as that of the first signal are transmitted through two-terminal-pair line 206, the first signal is extracted to first load circuit 221 through first node 211 without being substantially interfered with each other, and the second signal is extracted to second load circuit 222 through second node 212.

In contrast to this, when the first signal is inputted from first load circuit 221 to first node 211 and the second signal is inputted from second load circuit 222 to second node 212, the first signal and the second signal can be transmitted through two-terminal-pair line 206 without being substantially interfered with each other.

More specifically, by using one two-terminal-pair line 206, the first signal and the second signal serving as two signals each having the same frequency can be transmitted for the same time, and data transmission quantity can be increased.

In this case, the line lengths of first line 207 and second line 208, first matching circuit 213 and second matching circuit 214, and first phase shifter 217 and second phase shifter 218 may be designed such that, when signals each having the same phase and having equal absolute values of amplitudes are inputted to first terminal 202 and second terminal 203, respectively, the absolute value of the amplitude of the signal appearing on the first node 211 side of first line 207 and the absolute value of the amplitude of the signal appearing on the first node 211 side of second line 208 are almost equal to each other.

For this reason, currents of common mode signals appearing at first node 211 can be more accurately canceled out, and a ratio of differential mode signals propagated from fourth line 211 to the first load circuit 221 side to common mode signals can be improved.

Similarly, the line lengths of third line 209 and fourth line 210, third matching circuit 215 and fourth matching circuit 216, and third phase shifter 219 and fourth phase shifter 220 may be designed such that, when signals having a phase difference of 180° and equal absolute values of amplitudes are inputted to first terminal 202 and second terminal 203, respectively, the absolute value of the amplitude of the signal appearing on the second node 212 side of third line 209 and the absolute value of the amplitude of the signal appearing on the second node 212 side of fourth line 210 are almost equal to each other.

For this reason, currents of differential mode signals appearing at second node 212 can be accurately canceled out, and a ratio of common mode signals propagated from second node 212 to the second load circuit 222 side to differential modes can be improved.

Therefore, the line lengths of first line 207, second line 208, third line 209 and fourth line 210, first matching circuit 213, second matching circuit 214, third matching circuit 215, fourth matching circuit 216, first phase shifter 217, second phase shifter 218, third phase shifter 219 and fourth phase shifter 220 may be designed such that, when a signal is received from first node 211, the absolute value of the amplitude of the signal appearing on the second node 212 side of third line 209 and the absolute value of the amplitude of the signal appearing on the second node 212 side of fourth line 210 are almost equal to each other.

Similarly, the line lengths of first line 207, second line 208, third line 209, and fourth line 210, first matching circuit 213, second matching circuit 214, third matching circuit 215, and fourth matching circuit 216, and first phase shifter 217, second phase shifter 218, third phase shifter 219, and fourth phase shifter 220 may be designed such that, when a signal is inputted from second node 212, an absolute value of an amplitude of the signal appearing on the first node 211 side of first line 207 and an absolute value of an amplitude of the signal appearing on the first node 211 side of second line 208 are almost equal to each other. For this reason, an advantage in which isolation between first load circuit 221 and second load circuit 222 can be made higher can be obtained.

The line lengths of first line 207 and second line 208, first matching circuit 213 and second matching circuit 214, and first phase shifter 217 and second phase shifter 218 may be designed such that the change in phase from first terminal 202 to fourth line 211 is almost 90°±360°*n (n is an integer equal to or larger than 0) and the change in phase from second terminal 203 to fourth line 211 is almost −90°±360°*n (n is an integer equal to or larger than 0). For example, when common mode signals are generated between first terminal 202 and second terminal 203, the change in phase from first terminal 202 to first node 211 is 90°±360°*n (n is an integer equal to or larger than 0) and the change in phase from second terminal 203 to first node 211 is almost −90°±360°*n (n is an integer equal to or larger than 0). For this reason, the common mode signals are canceled out at first node 211.

More specifically, for the common mode signals, first node 211 is an imaginably grounded place. The changes in phase from imaginably grounded first node 211 to first terminal 202 and second terminal 203 are 90° and −90°, respectively, so that input impedances obtained when the first node 211 side is viewed from first terminal 202 and second terminal 203 become infinite. Therefore, the common mode signals generated between first terminal 202 and second terminal 203 are generally propagated to the second node 212 side but not generally propagated to the first node 211 side.

In this manner, a ratio of common mode signals propagated to second load circuit 222 to differential mode signals can be more improved, and a ratio of differential mode signals propagated to first load circuit 221 to common mode signals can be more improved.

Furthermore, in this condition, the line lengths of first line 207 and second line 208, first matching circuit 213 and second matching circuit 214, and first phase shifter 217 and second phase shifter 218 may be designed such that, when signals each having the same phase and having equal absolute values of amplitudes are inputted to first terminal 202 and second terminal 203, respectively, the absolute value of the amplitude of the signal appearing on the first node 211 side of first line 207 and the absolute value of the amplitude of the signal appearing on the first node 211 side of second line 208 are almost equal to each other.

The line lengths of third line 209 and fourth line 210, third matching circuit 215, fourth matching circuit 216, and third phase shifter 217 and fourth phase shifter 218 may be designed such that a change in phase from first terminal 202 to second node 211 is almost +90°±180°*n (n is an integer equal to or larger than 0) and a difference in phase from second terminal 203 to second node 212 is almost +90°±180°*n (n is an integer equal to or larger than 0). For this reason, for example, when differential mode signals are generated between first terminal 202 and second terminal 203, a change in phase from first terminal 202 to second node 211 and a change in phase from fourth first 202 to second node 212 are equal to each other. For this reason, the differential mode signals are canceled out at second node 212.

More specifically, for the differential mode signals, second node 212 is an imaginably grounded place. The changes in phase from imaginably grounded second node 212 to first terminal 202 and second terminal 203 are 90° each, so that input impedances obtained when the second node 212 side is viewed from first terminal 202 and second terminal 203 become infinite. Therefore, the differential mode signals generated between first terminal 202 and second terminal 203 are generally propagated to the first node 211 side but not generally propagated to the second node 212 side. In this manner, a ratio of differential mode signals propagated to second load circuit 222 to common mode signals can be more improved, and a ratio of common mode signals propagated to second load circuit 222 to differential mode signals can be improved.

Furthermore, in this condition, the line lengths of third line 209 and fourth line 210, third matching circuit 215 and fourth matching circuit 216, and third phase shifter 219 and fourth phase shifter 220 may be designed such that, when signals having a phase difference of 180° and equal absolute values of amplitudes are inputted to first terminal 202 and second terminal 203, respectively, the absolute value of the amplitude of the signal appearing on the second node 212 side of third line 209 and the absolute value of the amplitude of the signal appearing on the second node 212 side of fourth line 210 are almost equal to each other.

For this reason, currents of differential mode signals appearing at second node 212 can be accurately canceled out, and a ratio of common mode signals to differential mode signals propagated from second node 212 to the second load circuit 222 side can be improved.

The line lengths of third line 209 and fourth line 210, third matching circuit 215 and fourth matching circuit 216, and first phase shifter 217 and second phase shifter 218 may be designed such that the change in phase from third terminal 204 to first node 211 is almost +90°±180°*n (n is an integer equal to or larger than 0) and the change in phase from fourth terminal 205 to second node 212 is almost +90°±180°*n (n is an integer equal to or larger than 0).

Therefore, for example, when differential mode signals are generated between third terminal 204 and fourth terminal 205, the change in phase from third terminal 204 to first node 211 and the change in phase from fourth terminal 205 to second node 212 are equal to each other. For this reason, differential mode signals are canceled out at second node 212.

More specifically, for the differential mode signals, second node 212 is an imaginably grounded place. The changes in phase from imaginably grounded second node 212 to third terminal 204 and fourth terminal 205 are 90° each, so that input impedances obtained when the second node 212 side is viewed from third terminal 204 and fourth terminal 205 become infinite.

Therefore, the differential mode signals generated between third terminal 204 and fourth terminal 205 are generally propagated to the first node 211 side but not generally propagated to the second node 212 side. In this manner, a ratio of differential mode signals propagated to first load circuit 222 to the common mode signals can be more improved, and a ratio of common mode signals propagated to second load circuit 222 to differential mode signals can be more improved.

Furthermore, in this condition, the line lengths of third line 209 and fourth line 210, third matching circuit 215 and fourth matching circuit 216, and third phase shifter 219 and fourth phase shifter 220 may be designed such that, when signals having a phase difference of 180° and equal absolute values of amplitudes are inputted to third terminal 204 and fourth terminal 205, respectively, the absolute value of the amplitude of the signal appearing on the second node 212 side of third line 209 and the absolute value of the amplitude of the signal appearing on the second node 212 side of fourth line 210 are almost equal to each other. For this reason, currents of differential mode signals appearing at second node 212 can be accurately canceled out, and a ratio of common mode signals propagated from second node 212 to the second load circuit 222 side to differential mode signals can be improved.

In FIG. 26, at least one of first matching circuit 213, second matching circuit 214, third matching circuit 215, fourth matching circuit 216, first phase shifter 217, second phase shifter 218, third phase shifter 219, and fourth phase shifter 220 may be eliminated. In this manner, transmission losses on first line 207, second line 208, third line 209, and fourth line 210 can be reduced, the number of required parts can be reduced, and reductions in size and weight can be achieved.

If necessary, a matching circuit may be connected to at least one of a line between first node 211 and first load circuit 221 and a line between second node 212 and second load circuit 222. Therefore, matching states between antenna apparatus 201 and first load circuit 221 according to Embodiment 9 and between antenna apparatus 201 and second load circuit 222 according to Embodiment 9 can be made preferable, and reflection losses therebetween can be reduced. As a result, communication quality of the electronic appliance can be made preferable.

First matching circuit 213, second matching circuit 214, third matching circuit 215, fourth matching circuit 216, first phase shifter 217, second phase shifter 218, third phase shifter 219, and fourth phase shifter 220 are basically designed as circuits of reactance elements. However, the matching circuits and the phase shifters may be designed as circuits including a resistance element and an amplifying circuit (for example, a configuration or the like in which first line 207 has a transmission path and a reception path which have a transmission amplifying circuit and a reception amplifying circuit, respectively). For this reason, a high isolation characteristic between first load circuit 221 and second load circuit 222 can be realized, and a transmission/reception characteristic of an electronic appliance can be improved.

In FIG. 26, although signals are inputted and outputted from/to sixth terminal 223, seventh terminal 224, eighth terminal 225, and ninth terminal 226, the number of input/output terminals is not limited to this. A signal may only be inputted/outputted from at least one input/output terminal.

Embodiment 10

Figure 27:
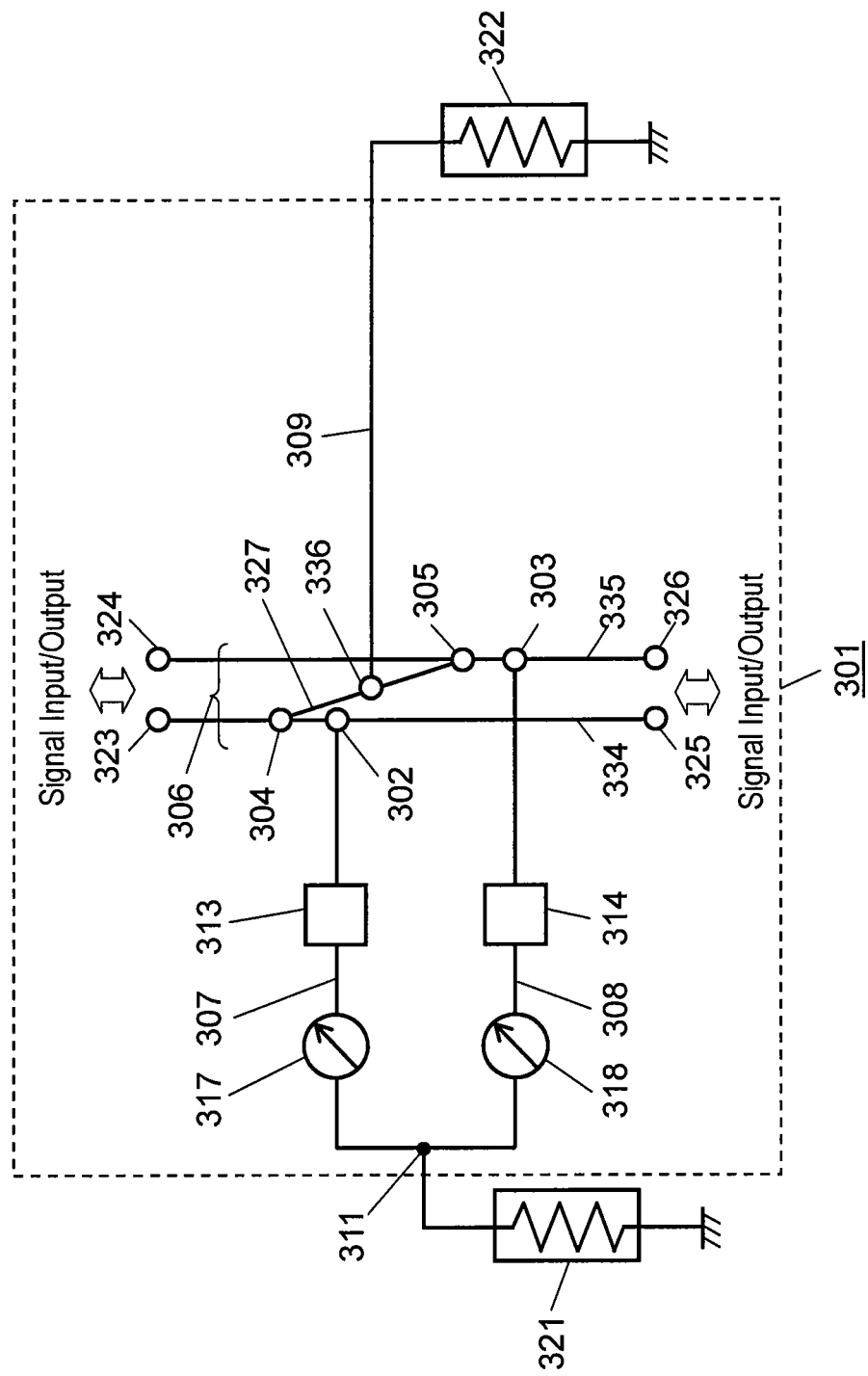
FIG. 27 is a block diagram of a signal transmitting system according to Embodiment 10 of the present invention.

FIG. 27 is a block diagram of a signal transmitting system according to Embodiment 10 of the present invention. With respect to the same configuration as that of Embodiment 9, only the same reference numerals are described, and a different configuration will be mainly described below.

In FIG. 27, signal transmitting system 301 according to Embodiment 10 of the present invention has two-terminal-pair line 306 having at least four terminals including first terminal 302, second terminal 303, third terminal 304, and fourth terminal 305 and fifth terminal 336 on a short-circuit line 327 which connects third terminal 304 and fourth terminal 305 to each other. A change in phase from first terminal 302 to fifth terminal 336 and a change in phase from second terminal 303 to fifth terminal 336 are substantially equal to each other.

Furthermore, signal transmitting system 301 according to Embodiment 10 of the present invention has first line 307 one end of which is connected to first terminal 302 of two-terminal-pair line 306, second line 308 one end of which is connected to second terminal 303 of two-terminal-pair line 306, and third line 309 one end of which is connected to third terminal 304 of two-terminal-pair line 306. The other end of first line 307 and the other end of second line 308 are connected to each other at first node 311. The line lengths of first line 307, second line 308, and third line 309, first matching circuit 313, second matching circuit 314, and third matching circuit 315, and first phase shifter 317, second phase shifter 318, and third phase shifter 319 are designed such that, when signals are received from the other end of third line 309, a phase difference between a phase of a signal appearing on the first node 311 side of first line 307 and a phase of a signal appearing on the first node 311 side of second line 308 are almost 180°±360°*(n is an integer equal to or larger than 0).

For this reason, for example, a signal transmitted from first load circuit 321 to the second load circuit 322 side is not generally propagated to the second load circuit 322 side because the signal is canceled out on the other end side of third line 309 and at third terminal. In contrast to this, a signal transmitted from second load circuit 322 to the first load circuit 321 side is not generally propagated from first node 311 to first load circuit 321 because the phase difference between the phase of the signal appearing on the first node 311 side of first line 307 and the phase of the signal appearing on the first node 311 side of second line 308 is almost 180°±360°*n (n is an integer equal to or larger than 0).

Therefore, no signal is propagated between first load circuit 321 and second load circuit 322, and isolation can be assured between first load circuit 321 and second load circuit 322. For this reason, first load circuit 321 and second load circuit 322 can mutually independently perform signal exchanges with antenna element 306. More specifically, first load circuit 321 and second load circuit 322 can mutually independently exchange signals without being limited with respect to time and frequency.

Since antenna apparatus 301 according to Embodiment 10, in comparison with Embodiment 9, can reduce the number of lines which connect third terminal 304 and second load circuit 322, the number of matching circuits, and the number of phase shifters, reductions in size and weight can be achieved.

The line lengths of first line 307 and second line 308, first matching circuit 313 and second matching circuit 314, and first phase shifter 317 and second phase shifter 318 may be designed such that, when a signal is inputted from the other end of third line 309, an absolute value of an amplitude of the signal appearing on the first node 311 side of first line 307 and an absolute value of an amplitude of the signal appearing on the first node 311 side of second line 308 are almost equal to each other. For this reason, an advantage in which isolation between first load circuit 321 and second load circuit 322 can be made higher can be obtained.

Furthermore, the line lengths of first line 307 and second line 308, first matching circuit 313 and second matching circuit 314, and first phase shifter 317 and second phase shifter 318 may be designed such that, when signals each having the same phase and having equal absolute values of amplitudes are inputted to first terminal 302 and second terminal 303, respectively, the difference between the phase of the signal appearing on the first node 311 side of first line 307 and the phase of the signal appearing on the first node 311 side of second line 308 is almost 180°±360°*n (n is an integer equal to or larger than 0). In this case, for example, when common mode signals are inputted across first terminal 302 and second terminal 303, a phase difference between currents of the common mode signals is zero between first terminal 302 and second terminal 303.

Therefore, when the signals each having the same phase and having absolute values of amplitudes are inputted to first terminal 302 and second terminal 303, respectively, the difference between the phase of the signal appearing on the first node 311 side of first line 307 and the phase of the signal appearing on the first node 311 side of second line 308 is almost 180°±360°*n (n is an integer equal to or larger than 0). For this reason, at first node 311, the currents of the common mode signals are canceled out, and a common mode signal is not generally propagated from first node 311 to the first load circuit side. In contrast to this, for example, when differential mode signals are inputted across first terminal 302 and second terminal 303, a phase difference between the currents of the differential mode signals is ±180° between first terminal 302 and second terminal 303.

Therefore, when signals having a phase difference of ±180° and the equal absolute values of the amplitudes are inputted to first terminal 302 and second terminal 303, respectively, the difference between the phase of the signal appearing on the first node 311 side of first line 307 and the phase of the signal appearing on the first node 311 side of second line 308 is almost 180°±360°*n (n is an integer equal to or larger than 0). For this reason, at first node 311, the currents of the differential mode signals are summed up, and the signal is generally propagated from first node 311 to the first load circuit side.

As described above, when the signal transmitting system is designed such that, when signals each having the same phase and having equal absolute values of amplitudes are inputted to first terminal 302 and second terminal 303, respectively, the difference between the phase of the signal appearing on the first node 311 side of first line 307 and the phase of the signal appearing on the first node 311 side of second line 308 is almost 180°±360°*n (n is an integer equal to or larger than 0), only differential mode signals generated between first terminal 302 and second terminal 303 can be selected and propagated to first load circuit 321.

Furthermore, when the condition in which the difference between the phase of the signal appearing on the first node 311 side of first line 307 and the phase of the signal appearing on the first node 311 side of second line 308 is almost 180°±360°*n (n is an integer equal to or larger than 0) when signals each having the same phase and having the equal absolute values of the amplitudes are inputted to first terminal 302 and second terminal 303, respectively and the condition in which the phase difference between the phase of the signal appearing on the second node 312 side of third line 309 and the phase of the signal appearing on the second node 312 side of fourth line 310 is almost 180° when a signal is received from first node 311 are considered, a difference between a change in phase from first terminal 302 to second node 312 and a change in phase from second terminal 303 to second node 312 becomes zero.

More specifically, currents of common mode signals generated between first terminal 302 and second terminal 303 are summed up in the same phase at third terminal 304, and the signals are generally propagated to the second load circuit 322 side. In contrast to this, the currents of the differential mode signals generated between first terminal 302 and second terminal 303 are summed up in reversed phases at third terminal 304 and canceled out, and the signals are not generally propagated to the second load circuit 322 side.

Therefore, the differential mode signals generated between first terminal 302 and second terminal 303 are substantially propagated to only the first load circuit 321 side, and common mode signals generated between first terminal 302 and second terminal 303 are substantially propagated to only the second load circuit 322 side. More specifically, signal transmitting system 301 according to Embodiment 10 can independently extract the signals of the two modes generated between first terminal 302 and second terminal 303.

More specifically, for example, when the first signal transmitted in the differential mode and the second signal transmitted in the common mode and having the same frequency as that of the first signal are transmitted through two-terminal-pair line 306, the first signal is extracted to first load circuit 321 through first node 311 without being substantially interfered with each other, and the second signal is extracted to second load circuit 322 through third terminal 304.

In contrast to this, when the first signal is inputted from first load circuit 321 to first node 311 and the second signal is inputted from second load circuit 322 to third terminal 304, the first signal and the second signal can be transmitted through two-terminal-pair line 306 without being substantially interfered with each other.

More specifically, by using one two-terminal-pair line 306, the first signal and the second signal serving as two signals each having the same frequency can be transmitted for the same time, and data transmission quantity can be increased.

In this case, the line lengths of first line 307 and second line 308, first matching circuit 313 and second matching circuit 314, and first phase shifter 317 and second phase shifter 318 may be designed such that, when signals each having the same phase and having equal absolute values of amplitudes are inputted to first terminal 302 and second terminal 303, respectively, the absolute value of the amplitude of the signal appearing on the first node 311 side of first line 307 and the absolute value of the amplitude of the signal appearing on the first node 311 side of second line 308 are almost equal to each other. For this reason, currents of common mode signals appearing at first node 311 can be more accurately canceled out, and a ratio of differential mode signals propagated from first node 311 to the first load circuit 321 side to common mode signals can be improved.

The line lengths of first line 307 and second line 308, first matching circuit 313 and second matching circuit 314, and first phase shifter 317 and second phase shifter 318 may be designed such that the change in phase from first terminal 302 to first node 311 is almost 90°±180°*n (n is an integer equal to or larger than 0) and the change in phase from second terminal 303 to first node 311 is almost −90°±180°*n (n is an integer equal to or larger than 0).

For example, when common mode signals are generated between first terminal 302 and second terminal 303, the change in phase from first terminal 302 to first node 311 is 90°±360°*n (n is an integer equal to or larger than 0) and the change in phase from second terminal 303 to first node 311 is almost −90°±360°*n (n is an integer equal to or larger than 0). For this reason, the common mode signals are canceled out at first node 311.

More specifically, for the common mode signals, first node 311 is an imaginably grounded place. The changes in phase from imaginably grounded first node 311 to first terminal 302 and second terminal 303 are 90° and −90°, respectively, so that input impedances obtained when the first node 311 side is viewed from first terminal 302 and second terminal 303 become infinite. Therefore, the common mode signals generated between first terminal 302 and second terminal 303 are generally propagated to the second node 312 side but not generally propagated to the first node 311 side.

In this manner, a ratio of common mode signals propagated to second load circuit 322 to differential mode signals can be more improved, and a ratio of differential mode signals propagated to first load circuit 321 to common mode signals can be more improved.

Furthermore, in this condition, the line lengths of first line 307 and second line 308, first matching circuit 313 and second matching circuit 314, and first phase shifter 317 and second phase shifter 318 may be designed such that, when signals each having the same phase and having equal absolute values of amplitudes are inputted to first terminal 302 and second terminal 303, respectively, the absolute value of the amplitude of the signal appearing on the first node 311 side of first line 307 and the absolute value of the amplitude of the signal appearing on the first node 311 side of second line 308 are almost equal to each other. For this reason, currents of common mode signals appearing at first node 311 can be more accurately canceled out, and a ratio of differential mode signals propagated from first node 311 to the first load circuit 321 side to common mode signals can be improved.

In FIG. 27, at least one of first matching circuit 313, second matching circuit 314, first phase shifter 317, and second phase shifter 318 may be eliminated. In this manner, transmission losses on first line 307 and second line 308 can be reduced, the number of required parts can be reduced, and reductions in size and weight can be achieved.

If necessary, a matching circuit may be connected to at least one of a line between first node 311 and first load circuit 321 and a line between third node 304 and second load circuit 322. Therefore, matching states between signal transmitting system 301 and first load circuit 321 according to Embodiment 10 and between signal transmitting system 301 and second load circuit 322 according to Embodiment 10 can be made preferable, and reflection losses therebetween can be reduced. As a result, communication quality of the electronic appliance can be made preferable.

First matching circuit 313, second matching circuit 314, first phase shifter 317, and second phase shifter 318 are basically designed as circuits of reactance elements. However, in order to satisfy a condition in which an absolute value of an amplitude of a signal appearing on the first node 311 side of first line 307 and an absolute value of an amplitude of a signal appearing on the first node 311 side of second line 308 are equal to each other, when a signal is received from the other end of third line 309, the matching circuits and the phase shifters may be designed as circuits including a resistance element and an amplifying circuit (for example, a configuration or the like in which first line 307 has a transmission path and a reception path which have a transmission amplifying circuit and a reception amplifying circuit, respectively). For this reason, a high isolation characteristic between first load circuit 321 and second load circuit 322 can be realized, and a transmission/reception characteristic of an electronic appliance can be improved.

In FIG. 27, although signals are inputted and outputted from/to sixth terminal 323, seventh terminal 324, eighth terminal 325, and ninth terminal 326, the number of input/output terminals is not limited to this. A signal may only be inputted/outputted from at least one input/output terminal.

Furthermore, in FIG. 27, first terminal 302, third terminal 304, second terminal 303, and fourth terminal 305 are arranged at positions different from each other. However, when first terminal 302 and third terminal 304 may be arranged at the same position and second terminal 303 and fourth terminal 305 are arranged at the same position, the same advantage as described above can be obtained, and the number of terminals on two-terminal-pair line 306 can be reduced, and the structure of two-terminal-pair line 306 can be simplified. The case in which signals each having the same phase and the same amplitude are inputted to first terminal 302 and second terminal 303, respectively and the case in which an absolute value of an amplitude of a signal appearing on first node 311 side of first line 307 and an absolute value of an amplitude of a signal appearing on the first node 311 side of second line 308 are almost equal to each other include the case in which first terminal 302 and third terminal 304 are arranged at the same position and second terminal 303 and fourth terminal 305 are arranged at the same position.

Embodiment 11

Figure 28:
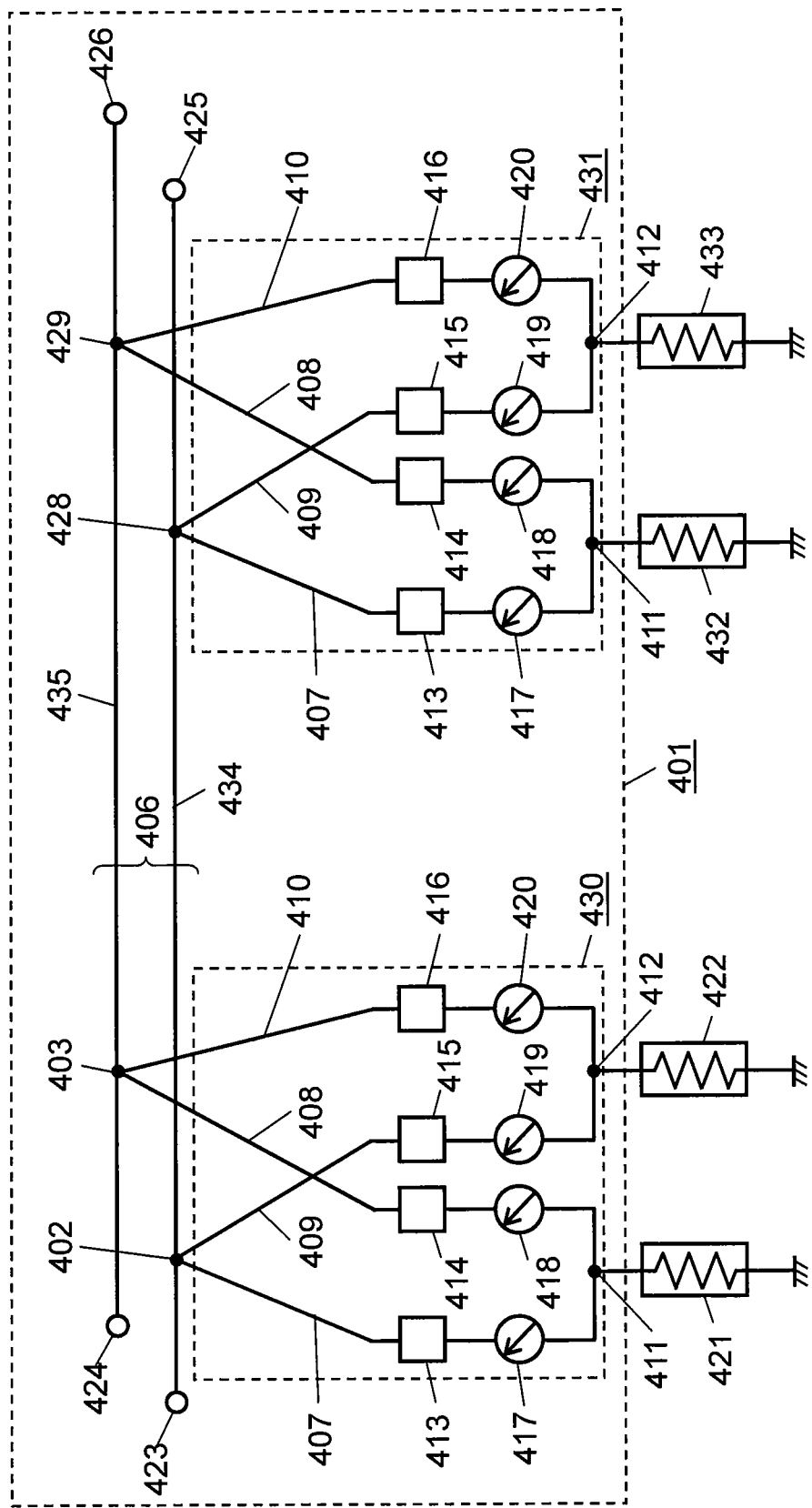
FIG. 28 is a block diagram of a signal transmitting system according to Embodiment 11 of the present invention.

FIG. 28 is a block diagram of a signal transmitting system according to Embodiment 11 of the present invention. With respect to the same configuration as that of Embodiment 9, only the same reference numerals are described, and a different configuration will be mainly described below.

In FIG. 28, signal transmitting system 401 according to Embodiment 11 has first signal branching filter 430 connected to first terminal 402 and second terminal 403 and second signal branching filter 431 connected to tenth terminal 428 and eleventh terminal 429.

First signal branching filter 430 has first line 407 one end of which is connected to first terminal 402, third line 409 one end of which is connected to first terminal 402, second line 408 one end of which is connected to second terminal 403, and fourth line 410 one end of which is connected to second terminal 403. The other end of first line 407 and the other end of second line 408 are connected to first node 411, and the other end of third line 409 and the other end of fourth line 410 are connected to second node 412.

Second signal branching filter 431 has first line 407 one end of which is connected to tenth terminal 428, third line 409 one end of which is connected to first terminal 402, second line 408 one end of which is connected to eleventh terminal 429, and fourth line 410 one end of which is connected to second terminal 403. The other end of first line 407 and the other end of second line 408 are connected to first node 411, and the other end of third line 409 and the other end of fourth line 410 are connected to second node 412.

In this case, an operational principle of first signal branching filter 430 will be described in detail (operational principle of second signal branching filter 431 is the same as that of first signal branching filter 430).

The line lengths of first line 407, second line 408, third line 409, and fourth line 410, first matching circuit 413, second matching circuit 414, third matching circuit 415, fourth matching circuit 416, first phase shifter 417, second phase shifter 418, third phase shifter 419, and fourth phase shifter 420 are designed such that, when signals are received from first node 411 of first signal branching filter 430, a phase difference between a phase of a signal appearing on the second node 412 side of third line 409 and a phase of a signal appearing on the second node 412 side of fourth line 410 are almost $180°\pm360°*n$ (n is an integer equal to or larger than 0). For this reason, for example, a signal transmitted from first load circuit 421 is not generally propagated from second node 412 to the second load circuit 422 side because a phase difference between a phase of a signal appearing on the second node 412 side of third line 409 and a phase of a signal appearing on the second node 412 side of fourth line 410 is almost 180°±360°*n (n is an integer equal to or larger than 0).

In contrast to this, a signal transmitted from second load circuit 422 is not generally propagated from first node 411 to first load circuit 421 because the phase difference between the phase of the signal appearing on the first node 411 side of first line 407 and the phase of the signal appearing on the first node 411 side of second line 408 is almost 180°±360°*n (n is an integer equal to or larger than 0). Therefore, no signal is propagated between first load circuit 421 and second load circuit 422, and isolation can be assured between first load circuit 421 and second load circuit 422.

For this reason, first load circuit 421 and second load circuit 422 can mutually independently perform signal exchanges through two-terminal-pair line 406. More specifically, first load circuit 421 and second load circuit 422 need not be selected with respect to time and frequency, and can mutually independently perform signal exchanges.

First signal branching filter 430 (is the same as second signal branching filter 431) according to Embodiment 11 can be connected to two-terminal-pair line 406 by only two connection terminals, and a structure can be simplified.

The line lengths of first line 407 and second line 408, third line 409, and fourth line 410, first matching circuit 413, second matching circuit 414, third matching circuit 415, and fourth matching circuit 416, and first phase shifter 417, second phase shifter 418, third phase shifter 419, and fourth phase shifter 420 may be designed such that, when a signal is inputted from first node 411, an absolute value of an amplitude of the signal appearing on the second node 412 side of third line 409 and an absolute value of an amplitude of the signal appearing on the second node 412 side of fourth line 410 are almost equal to each other.

Similarly, The line lengths of first line 407, second line 408, third line 409, and fourth line 410, first matching circuit 413, second matching circuit 414, third matching circuit 415, and fourth matching circuit 416, and first phase shifter 417, second phase shifter 418, third phase shifter 419, and fourth phase shifter 420 may be designed such that, when a signal is received from second node 412, the absolute value of the amplitude of the signal appearing on the first node 411 side of first line 407 and the absolute value of the amplitude of the signal appearing on the first node 411 side of second line 408 are almost equal to each other. For this reason, an advantage in which isolation between first load circuit 421 and second load circuit 422 can be made higher can be obtained.

Furthermore, the line lengths of first line 407 and second line 408, first matching circuit 413 and second matching circuit 414, and first phase shifter 417 and second phase shifter 418 are designed such that, when signals each having the same phase and having equal absolute values of amplitudes are inputted to first terminal 402 and second terminal 403, respectively, the difference between the phase of the signal appearing on the first node 411 side of first line 407 and the phase of the signal appearing on the first node 411 side of second line 408 is almost 180°±360°*n (n is an integer equal to or larger than 0).

In this case, for example, when common mode signals are inputted across first terminal 402 and second terminal 403, a phase difference between currents of the common mode signals is zero between first terminal 402 and second terminal 403. Therefore, when the signals each having the same phase and having equal absolute values of amplitudes are inputted to first terminal 402 and second terminal 403, respectively, the difference between the phase of the signal appearing on the first node 411 side of first line 407 and the phase of the signal appearing on the first node 411 side of second line 408 is almost 180°±360°*n (n is an integer equal to or larger than 0). For this reason, at first node 411, the currents of the common mode signals are canceled out, and a common mode signal is not substantially propagated from first node 411 to the first load circuit side.

In contrast to this, for example, when differential mode signals are inputted across first terminal 402 and second terminal 403, a phase difference between the differential mode signals is ±180° between first terminal 402 and second terminal 403. Therefore, when signals having a phase difference of ±180° and the equal absolute values of the amplitudes are inputted to first terminal 402 and second terminal 403, respectively, the difference between the phase of the signal appearing on the first node 411 side of first line 407 and the phase of the signal appearing on the first node 411 side of second line 408 is almost 0°±360°*n (n is an integer equal to or larger than 0). For this reason, at first node 411, the currents of the differential mode signals are summed up, and the differential mode signals are substantially propagated from first node 411 to the first load circuit side.

As described above, when the signal transmitting system is designed such that, when signals each having the same phase and having equal absolute values of amplitudes are inputted to first terminal 402 and second terminal 403, respectively, the difference between the phase of the signal appearing on the first node 411 side of first line 407 and the phase of the signal appearing on the first node 411 side of second line 408 is almost 180°±360°*n (n is an integer equal to or larger than 0), only differential mode signals generated between first terminal 402 and second terminal 403 can be selected and propagated to first load circuit 421.

Furthermore, when the condition in which the difference between the phase of the signal appearing on the first node 411 side of first line 407 and the phase of the signal appearing on the first node 411 side of second line 408 is almost 180°±360°*n (n is an integer equal to or larger than 0) when signals each having the same phase and having the equal absolute values of the amplitudes are inputted to first terminal 402 and second terminal 403, respectively and the condition in which the first signal is transmitted in the differential mode by using a two-terminal-pair line and the second signal is transmitted in the common mode by using the two-terminal-pair line, a difference between a change in phase from first terminal 402 to second node 412 and a change in phase from second terminal 403 to second node 412 becomes zero.

More specifically, currents of common mode signals generated between first terminal 402 and second terminal 403 are summed up in the same phase at second terminal 412, and the signals are substantially propagated from second terminal 412 to the second load circuit 422 side. In contrast to this, the currents of the differential mode signals generated between first terminal 402 and second terminal 403 are summed up in reversed phases at second terminal 412 and canceled out, and the signals are not substantially propagated from second terminal 412 to the second load circuit 422 side.

Therefore, the differential mode signals generated between first terminal 402 and second terminal 403 are generally propagated to only the first load circuit 421 side, and common mode signals generated between first terminal 402 and second terminal 403 are generally propagated to only the second load circuit 422 side. More specifically, signal transmitting system 401 according to Embodiment 11 can independently extract the signals of the two modes generated between first terminal 402 and second terminal 403.

More specifically, for example, when the first signal transmitted in the differential mode and the second signal transmitted in the common mode and having the same frequency as that of the first signal are transmitted through two-terminal-pair line 406, the first signal is extracted to first load circuit 421 through first node 411 without being substantially interfered with each other, and the second signal is extracted to second load circuit 422 through second node 412.

In contrast to this, when the first signal is inputted from first load circuit 421 to first node 411 and the second signal is inputted from second load circuit 422 to second terminal 412, the first signal and the second signal can be transmitted through two-terminal-pair line 406 without being substantially interfered with each other.

More specifically, by using one two-terminal-pair line 406, the first signal and the second signal serving as two signals each having the same frequency can be transmitted for the same time, and data transmission quantity can be increased.

In this case, the line lengths of first line 407 and second line 408, first matching circuit 413 and second matching circuit 414, and first phase shifter 417 and second phase shifter 418 may be designed such that, when signals each having the same phase and having equal absolute values of amplitudes are inputted to first terminal 402 and second terminal 403, respectively, the absolute value of the amplitude of the signal appearing on the first node 411 side of first line 407 and the absolute value of the amplitude of the signal appearing on the first node 411 side of second line 408 are almost equal to each other. For this reason, currents of common mode signals appearing at first node 411 can be more accurately canceled out, and a ratio of differential mode signals propagated from first node 411 to the first load circuit 421 side to common mode signals can be improved.

Similarly, the line lengths of third line 409 and fourth line 410, third matching circuit 415 and fourth matching circuit 416, and third phase shifter 419 and fourth phase shifter 420 may be designed such that, when signals having a phase difference of 180° and equal absolute values of amplitudes are inputted to first terminal 402 and second terminal 403, respectively, the absolute value of the amplitude of the signal appearing on the second node 412 side of third line 409 and the absolute value of the amplitude of the signal appearing on the second node 412 side of fourth line 410 are almost equal to each other.

For this reason, currents of differential mode signals appearing at second node 412 can be accurately canceled out, and a ratio of common mode signal components propagated from second node 412 to the second load circuit 422 can be improved.

The line lengths of first line 407 and second line 408, first matching circuit 413 and second matching circuit 414, and first phase shifter 417 and second phase shifter 418 may be designed such that the change in phase from first terminal 402 to first node 411 is almost $90°±180°*n$ (n is an integer equal to or larger than 0) and the change in phase from second terminal 403 to first node 411 is almost $-90°±180°*n$ (n is an integer equal to or larger than 0).

For example, when common mode signals are generated between first terminal 402 and second terminal 403, the change in phase from first terminal 402 to first node 411 is $90°±360°*n$ (n is an integer equal to or larger than 0) and the change in phase from second terminal 403 to first node 411 is almost $-90°±360°*n$ (n is an integer equal to or larger than 0). For this reason, the common mode signals are canceled out at first node 411.

More specifically, for the common mode signals, first node 411 is an imaginarily grounded place. The changes in phase from imaginarily grounded first node 411 to first terminal 402 and second terminal 403 are 90° and −90°, respectively, so that input impedances obtained when the first node 411 side is viewed from first terminal 402 and second terminal 403 become infinite. Therefore, the common mode signals generated between first terminal 402 and second terminal 403 are generally propagated to the second node 412 side but not generally propagated to the first node 411 side.

In this manner, a ratio of common mode signals propagated to second load circuit 422 to differential mode signals can be more improved, and a ratio of differential mode signals propagated to first load circuit 421 to common mode signals can be more improved.

Furthermore, in this condition, the line lengths of first line 407 and second line 408, first matching circuit 413 and second matching circuit 414, and first phase shifter 417 and second phase shifter 418 may be designed such that, when signals each having the same phase and having equal absolute values of amplitudes are inputted to first terminal 402 and second terminal 403, respectively, the absolute value of the amplitude of the signal appearing on the first node 411 side of first line 407 and the absolute value of the amplitude of the signal appearing on the first node 411 side of second line 408 are substantially equal to each other. For this reason, currents of common mode signals appearing at first node 411 can be more accurately canceled out, and a ratio of differential mode signals propagated from first node 411 to the first load circuit 421 side to common mode signals can be improved.

The line lengths of third line 409 and fourth line 410, third matching circuit 415 and fourth matching circuit 416, and first phase shifter 417 and second phase shifter 418 may be designed such that the change in phase from first terminal 402 to first node 411 is almost $+90°±180°*n$ (n is an integer equal to or larger than 0) and the change in phase from second terminal 403 to second node 412 is almost $+90°±180°*n$ (n is an integer equal to or larger than 0). Therefore, for example, when differential mode signals are generated between first terminal 402 and second terminal 403, the change in phase from first terminal 402 to first node 411 and the change in phase from second terminal 403 to second node 412 are equal to each other. For this reason, differential mode signals are canceled out at second node 412.

More specifically, for the differential mode signals, second node 412 is an imaginarily grounded place. The changes in phase from imaginarily grounded second node 412 to first terminal 402 and second terminal 403 are 90° each, so that input impedances obtained when the second node 412 side is viewed from first terminal 402 and second terminal 403 become infinite.

Therefore, the differential mode signals generated between first terminal 402 and second terminal 403 are substantially propagated to the first node 411 side but not generally propagated to the second node 412 side.

In this manner, a ratio of differential mode signals propagated to first load circuit 422 to the common mode signals can be more improved, and a ratio of common mode signals propagated to second load circuit 422 to differential mode signals can be more improved.

Furthermore, in this condition, the line lengths of third line 409 and fourth line 410, third matching circuit 415 and fourth matching circuit 416, and third phase shifter 419 and fourth phase shifter 420 may be designed such that, when signals having a phase difference of 180° and equal absolute values of amplitudes are inputted to first terminal 402 and second terminal 403, respectively, the absolute value of the amplitude of the signal appearing on the second node 412 side of third line 409 and the absolute value of the amplitude of the signal appearing on the second node 412 side of fourth line 410 are almost equal to each other. For this reason, currents of differential mode signals appearing at second node 412 can be accurately canceled out, and a ratio of common mode signals propagated from second node 412 to the second load circuit 422 side to differential mode signals can be improved.

In FIG. 28, at least one of first matching circuit 413, second matching circuit 414, third matching circuit 415, fourth matching circuit 416, first phase shifter 417, second phase shifter 418, third phase shifter 419, and fourth phase shifter 420 may be eliminated. In this manner, transmission losses on first line 407, second line 408, third line 409, fourth line 410 can be reduced, the number of required parts can be reduced, and reductions in size and weight can be achieved.

If necessary, a matching circuit may be connected to at least one of a line between first node 411 and first load circuit 421 and a line between second node 412 and second load circuit 422. Therefore, matching states between signal transmitting system 401 and first load circuit 421 according to Embodiment 11 and between signal transmitting system 401 and second load circuit 422 according to Embodiment 11 can be made preferable, and reflection losses therebetween can be reduced. As a result, communication quality of the electronic appliance can be made preferable.

First matching circuit 413, second matching circuit 414, third matching circuit 415, fourth matching circuit 416, first phase shifter 417, second phase shifter 418, third phase shifter 419, and fourth phase shifter 420 are basically designed as circuits of reactance elements. However, in order to satisfy a condition in which a sectional shape of the two-terminal-pair line is substantially plane-symmetrical, the matching circuits and the phase shifters may be designed as circuits including a resistance element and an amplifying circuit (for example, a configuration or the like in which first line 407 has a transmission path and a reception path which have a transmission amplifying circuit and a reception amplifying circuit, respectively). For this reason, a high isolation characteristic between first load circuit 421 and second load circuit 422 can be realized, and a transmission/reception characteristic of an electronic appliance can be improved.

In FIG. 28, although signals are inputted and outputted from/to sixth terminal 423, seventh terminal 424, eighth terminal 425, and ninth terminal 426, the number of input/output terminals is not limited to this. A signal may only be inputted/outputted from at least one input/output terminal.

A manner of an operation of signal transmitting system 401 according to Embodiment 11 shown in FIG. 28 will be described in detail.

In FIG. 28, first matching circuit 413 and third matching circuit 415 of first signal branching filter 430 are connected to first terminal 402 of two-terminal-pair line 406, and second matching circuit 414 and fourth matching circuit 416 of first signal branching filter 430 are connected to second terminal 403 of two-terminal-pair line 427. Furthermore, first matching circuit 413 and third matching circuit 415 of second signal branching filter 431 are connected to tenth terminal 428 of two-terminal-pair line 406, and second matching circuit 414 and fourth matching circuit 416 of second signal branching filter 431 are connected to eleventh terminal 429 of two-terminal-pair line 406.

First node 411 of first signal branching filter 430 is connected to first load circuit 421, and second node 412 of first signal branching filter 430 is connected to second load circuit 422. Furthermore, first node 411 of second signal branching filter 431 is connected to third load circuit 432, and second node 412 of second signal branching filter 431 is connected to fourth load circuit 433.

For example, when the first signal is inputted from first load circuit 421 to first node 411 and the second signal is inputted from second load circuit 422 to second node 412, the first signal is propagated through two-terminal-pair line 427 in a differential mode, and second signal is propagated through two-terminal-pair line 427 in a common mode. More specifically, first signal and second signal are mixed in two-terminal-pair line 427 and propagated. The mixed signals can be substantially accurately separated from each other by second signal branching filter 431.

More specifically, only the first signal propagated through two-terminal-pair line 406 in the differential mode is received by third load circuit 432, and only the second signal propagated through two-terminal-pair line 406 in common mode is received by fourth load circuit 433.

That is, the signal transmitting system according to Embodiment 11 is used to make it possible to perform transmission and reception of signals of two types by using one two-terminal-pair line 406. Therefore, when signal transmission is performed by using both the modes including the differential mode and the common mode, signal transmission quantity can be increased.

Signal transmitting system 401 according to Embodiment 11 may be used such that, for example, the first signal and the second signal are inputted/outputted in the differential mode and the common mode from sixth terminal 423 and seventh terminal 424 of two-terminal-pair line 406 or eighth terminal 425 and ninth terminal 426 and received by first signal branching filter 430 and second signal branching filter 431. In this manner, signals can be transmitted to a large number of load circuits on a network.

A sectional shape of two-terminal-pair line 406 may substantially have a plane-symmetrical shape. When this shape is employed, for example, a common mode signal can be prevented from being converted into a differential mode signal while being propagated through two-terminal-pair line 406.

Figure 29:
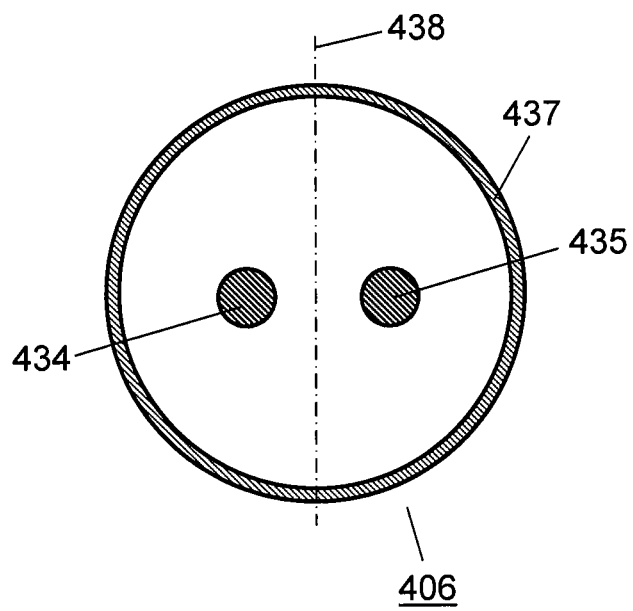
FIG. 29 is a diagram showing a sectional shape of a two-terminal-pair line used in the signal transmitting system according to Embodiment 11 of the present invention.
Figure 30:
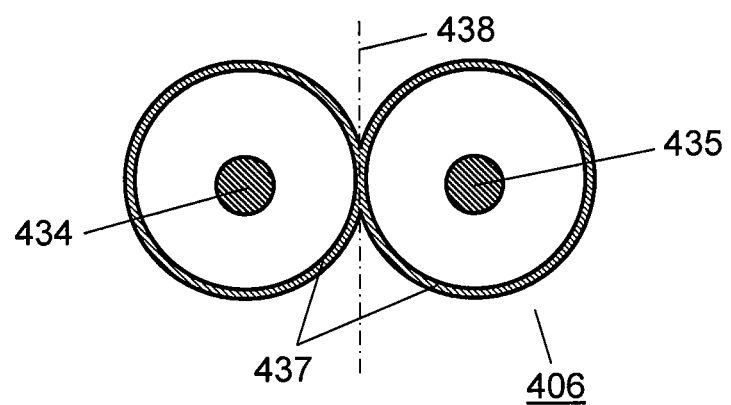
FIG. 30 is a diagram showing a sectional shape of a two-terminal-pair line used in the signal transmitting system according to Embodiment 11 of the present invention.

FIGS. 29 and 30 are diagrams showing sectional shapes of two-terminal-pair lines used in the signal transmitting system according to Embodiment 11 of the present invention.

In FIG. 29, two-terminal-pair line 406 has first transmission line 434 and second transmission line 435, and has shield conductor 437 to surround first transmission line 434 and second transmission line 435. In this case, first transmission line 434, second transmission line 435, and shield conductor 437 substantially have a plane-symmetrical configuration with reference to plane 438.

In FIG. 30, two-terminal-pair line 406 has first transmission line 434 and second transmission line 435, and has shield conductor 437 to surround first transmission line 434 and second transmission line 435. In this case, first transmission line 434, second transmission line 435, and shield conductor 437 substantially have a plane-symmetrical configuration with reference to plane 438.

As shown in FIGS. 29 and 30, when two-terminal-pair line 406 has a plane-symmetrical configuration with reference to arbitrary plane 438, a common mode signal can be prevented from being converted into a differential mode signal while being propagated through two-terminal-pair line 406. In this manner, two signals transmitted through two-terminal-pair line 406 in the differential mode and the common mode can be prevented from being interfered with each other.

Furthermore, two-terminal-pair line 406 shown in FIGS. 29 and 30 has shield conductor 437 outside two-terminal-pair line 406 to surround first transmission line 434 and second transmission line 435.

In general, when noise comes from the surrounding of two-terminal-pair line 406 to two-terminal-pair line 406, the noise is received by two-terminal-pair line 406 in the common mode. Therefore, the noise deteriorates an S/N ratio of a signal transmitted through two-terminal-pair line 406 in the common mode. In order to prevent this, as shown in FIGS. 29 and 30, two-terminal-pair line 406 has shield conductor 437, and it is regarded that noise does not leak onto two-terminal-pair line 406 by shield conductor 437. In general, a common mode signal transmitted on two-terminal-pair line 406 is easily radiated to the surrounding as an electromagnetic wave during transmission, and a loss increases during transmission. In order to also prevent this, two-terminal-pair line 406 shown in FIGS. 29 and 30 has shield conductor 437. In FIGS. 29 and 30, as shield conductor 437, a single shield conductor is shown. However, a double or more shield conductor may be replaced with shield conductor 437. For this reason, resistance to external noise can be improved, and common mode radiation can be further suppressed.

Figure 31:
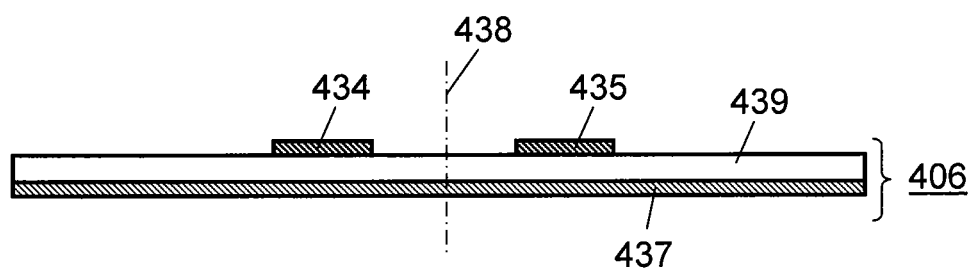
FIG. 31 is a diagram showing another sectional shape of a two-terminal-pair line used in the signal transmitting system according to Embodiment 11 of the present invention.
Figure 32:
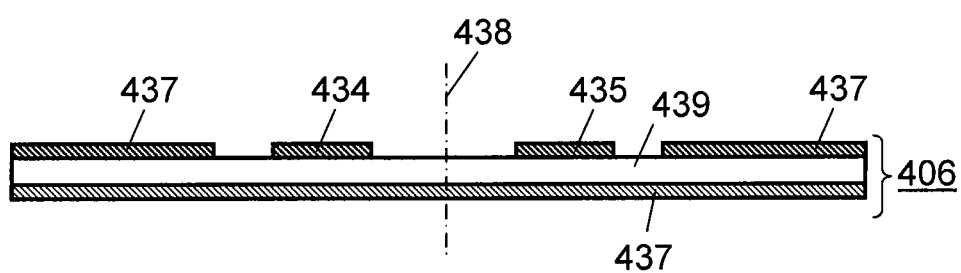
FIG. 32 is a diagram showing still another sectional shape of a two-terminal-pair line used in the transmitting system according to Embodiment 11 of the present invention.

FIGS. 31 and 32 are diagrams showing other sectional shapes of two-terminal-pair lines used in the signal transmitting system according to Embodiment 11 of the present invention. FIGS. 31 and 32 show an example in which two-terminal-pair line 406 is formed by a high-frequency substrate and a conductive pattern on the high-frequency substrate.

In FIG. 31, two-terminal-pair line 406 has first transmission line 434 and second transmission line 435 and approaches first transmission line 434 and second transmission line 435 to have shield conductor 437. First transmission line 434, second transmission line 435, and shield conductor 437 are formed on a surface layer (or an internal layer which is not electrically connected to shield conductor 437 in a DC manner) of high-frequency substrate 439. In this case, first transmission line 434, second transmission line 435, and shield conductor 437 have a plane-symmetrical configuration with reference to plane 438.

Two-terminal-pair line 406 shown in FIG. 32 is different from two-terminal-pair line 406 shown in FIG. 31 in that shield conductor 437 is also formed in a layer in which first transmission line 434 and second transmission line 435 are formed in the structure in FIG. 31. In two-terminal-pair line 406 shown in FIG. 32, first transmission line 434, second transmission line 435, and shield conductor 437 have a plane-symmetrical configuration with reference to plane 438.

As shown in FIGS. 31 and 32, when two-terminal-pair line 406 has a plane-symmetrical configuration with reference to arbitrary plane 438, a common mode signal can be prevented from being converted into a differential mode signal while being propagated through two-terminal-pair line 406. In this manner, two signals transmitted through two-terminal-pair line 406 in the differential mode and the common mode can be prevented from being interfered with each other.

Like two-terminal-pair line 406 in FIGS. 29 and 30, shield conductor 437 functions such that noise does not leak onto two-terminal-pair line 406, and functions such that a common mode signal which is being transmitted on two-terminal-pair line 406 is not radiated.

Shield conductor 437 is arranged only under first transmission line 434 and second transmission line 435 shown in FIG. 31. However, shield conductor 437 may be also arranged above first transmission line 434 and second transmission line 435. In this manner, the shield effect is more improved.

It is regarded that a common mode signal transmitted on two-terminal-pair line 406 is influenced by external noise easily more than a differential mode signal, and signals to be transmitted may be selectively used depending on the transmission modes such that signals in a modulating method (for example, 64 QAM, 16 QAM, or the like) having large transmission quantity are transmitted in the differential mode, and signals in a modulating method (for example, QPSK, BPSK, or the like) which does not require a high receiving sensitivity because of relatively small transmission quantity are transmitted in the common mode. In general, when a signal in the modulating method (for example, 64 QAM, 16 QAM, or the like) having large transmission quantity requires a high signal quality value when the signal is received. Therefore, when a signal which requires a high signal quality value corresponds to a signal transmitted in the differential mode which is more resistant to noise, as a whole, transmission quantity can be increased. In this case, the "signal quality value" denotes, for example, an index representing a ratio of a signal to noise such as a C/N ratio or an S/N ratio.

When the signal branching filter according to Embodiment 11 is used, in second load circuit 422 or fourth load circuit 433 which receives a common mode signal, an amount of noise received by two-terminal-pair line 406 can be recognized.

More specifically, the configuration in FIG. 28 which does not include second load circuit 422 will be considered. In this configuration, when signal 1 is inputted from first load circuit 421 to two-terminal-pair line 406, signal 1 is transmitted on two-terminal-pair line 406 and received by third load circuit 432. When a signal quality value of signal 1 is deteriorated because signal 1 receives external noise while being transmitted on two-terminal-pair line 406, the noise is extracted and adjusted such that absolute values of amplitudes of the received noise and the signal are equal to each other and have reversed phases. Thereafter, when the noise and signal 1 are summed up, noise mixed with signal 1 can be canceled.

Therefore, in fourth load circuit 433, external noise is received by two-terminal-pair line 406, the noise is synthesized with signal 1 received by third load circuit 432 while the amplitude and the phase of the noise are adjusted to satisfy the above condition (equal absolute values of amplitudes and the reverse phase), and noise leaking into signal 1 while signal 1 is transmitted on two-terminal-pair line 406 is canceled. In this case, signal quality of signal 1 can be improved.

When the noise canceling system is realized by the configuration in Embodiment 11 of the present invention, a ratio (noise/signal 1) of noise and signal 1 which received by fourth load circuit 433 can be made a very large value. For this reason, a very excellent noise canceling system can be structured. This is because, since external noise is mainly transmitted on two-terminal-pair line 406 in a common mode, most of the noise can be extracted by fourth load circuit 433.

Another reason why the noise canceling system having the configuration as described in Embodiment 11 of the present invention has a very excellent capability is that signal 1 is not substantially received by fourth load circuit 433. This is because, if, in fourth load circuit 433, noise is received together with signal 1, the noise operates to reduce signal 1 itself when the noise is synthesized with signal 1 received by third load circuit 432.

The frequencies of the first signal and the second signal may be equal to each other or different from each other. In FIG. 28, for example, a system which transmits and receives a signal can be configured by a pair of first signal branching filter 430 and second signal branching filter 431. However, the system according to the present invention is not limited to the above system. Three or more signal branching filters may be connected to two-terminal-pair line 406 to perform transmission and reception by a plurality of pairs of signal branching filters. The plurality of pairs of signal branching filters may have different applied frequencies or may have different transmission/reception timings. In this manner, interference between each paired signal branching filters can be reduced.

Furthermore, as the first signal transmitted from first load circuit 421 to first node 411 and the second signal transmitted from second load circuit 422 to second node 412, the same signals may be used. In this manner, the signals can be more reliably transmitted.

When the first signal and the second signal are the same signals, first signal branching filter 430 and second signal branching filter 431 may be designed such that a phase difference between a phase of a signal appearing on the first node 411 side of first line 407 and a phase of a signal appearing on the second node 412 side of third line 409 is almost 90°±180°*n (n is an integer equal to or larger than 0) when a signal is received from first terminal 402 and a phase difference between a phase of a signal appearing on the first node 411 side of second line 408 and a phase of a signal appearing on the second node 412 side of fourth line 410 is almost 90°±180°*n (n is an integer equal to or larger than 0) when a signal is received from second terminal 403. In this manner, the first signal and the second signal are synthesized with each other with a phase difference of 90°±180°*n (n is an integer equal to or larger than 0) on two-terminal-pair line 406. Therefore, as in the case in which the first signal and the second signal are synthesized with each other with a phase difference of 0°±180°*n (n is an integer equal to or larger than 0) on two-terminal-pair line 406, large amplitudes of a current and a voltage on two-terminal-pair line 406 can be prevented from being generated, and two-terminal-pair line 406 can be prevented from being broken by the voltage and the current generated by two-terminal-pair line 406.

Embodiment 12

FIGS. 33 to 42 show an example in which signal transmitting system 1901 according to Embodiment 12 is designed at 620 MHz by using two-terminal-pair line 1906 in which an input impedance obtained when two-terminal-pair line 1906 is viewed from first terminal 1902 is 50Ω and an input impedance of obtained when two-terminal-pair line 1906 is viewed from second terminal 1903 is 50Ω. In FIGS. 33 to 42, reference symbol freq denotes a frequency, and reference symbol impedance denotes an impedance.

Figure 33:
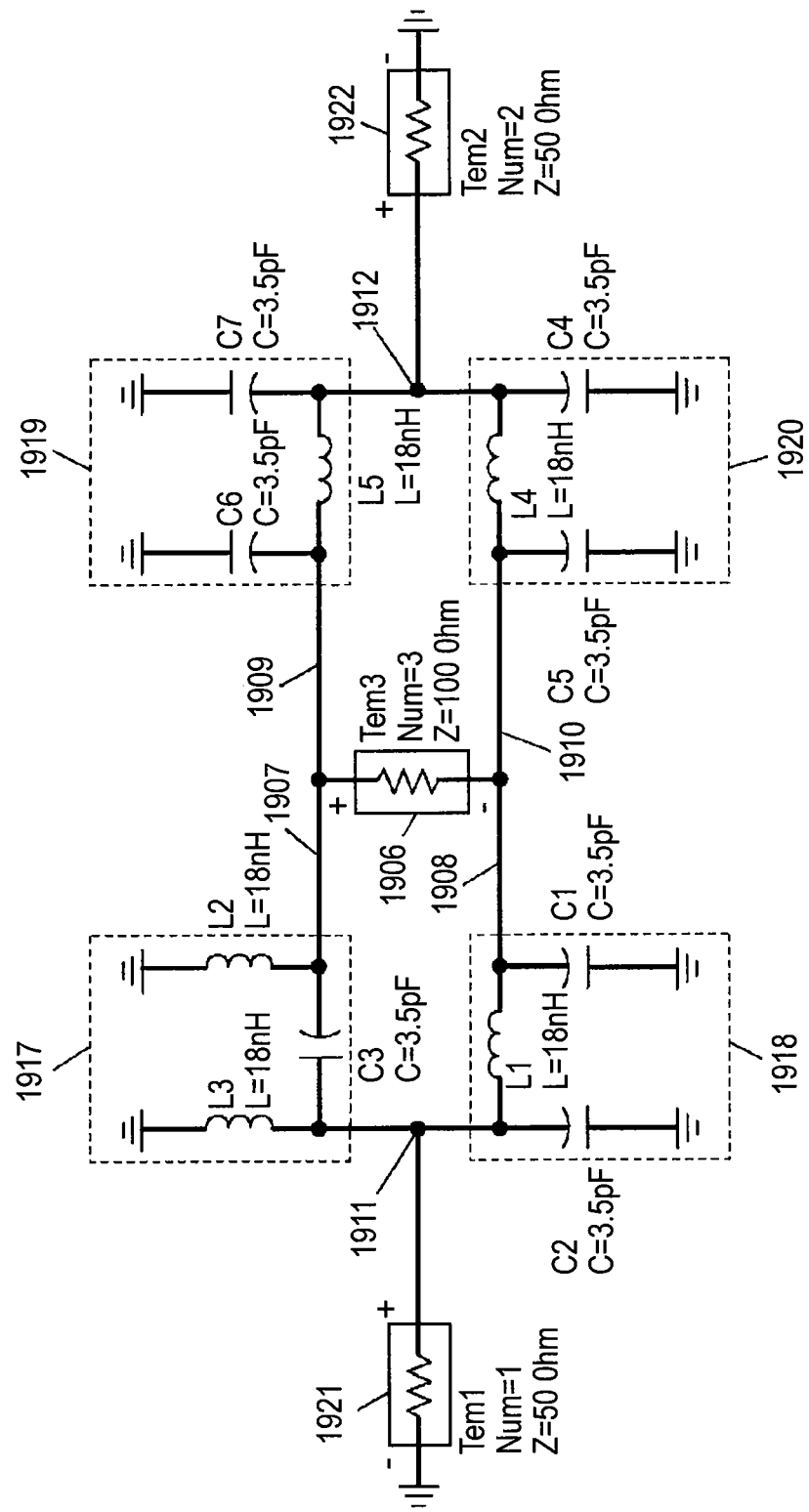
FIG. 33 is a diagram showing an example in which a signal transmitting system according to Embodiment 12 is designed at 620 MHz.
Figure 34:
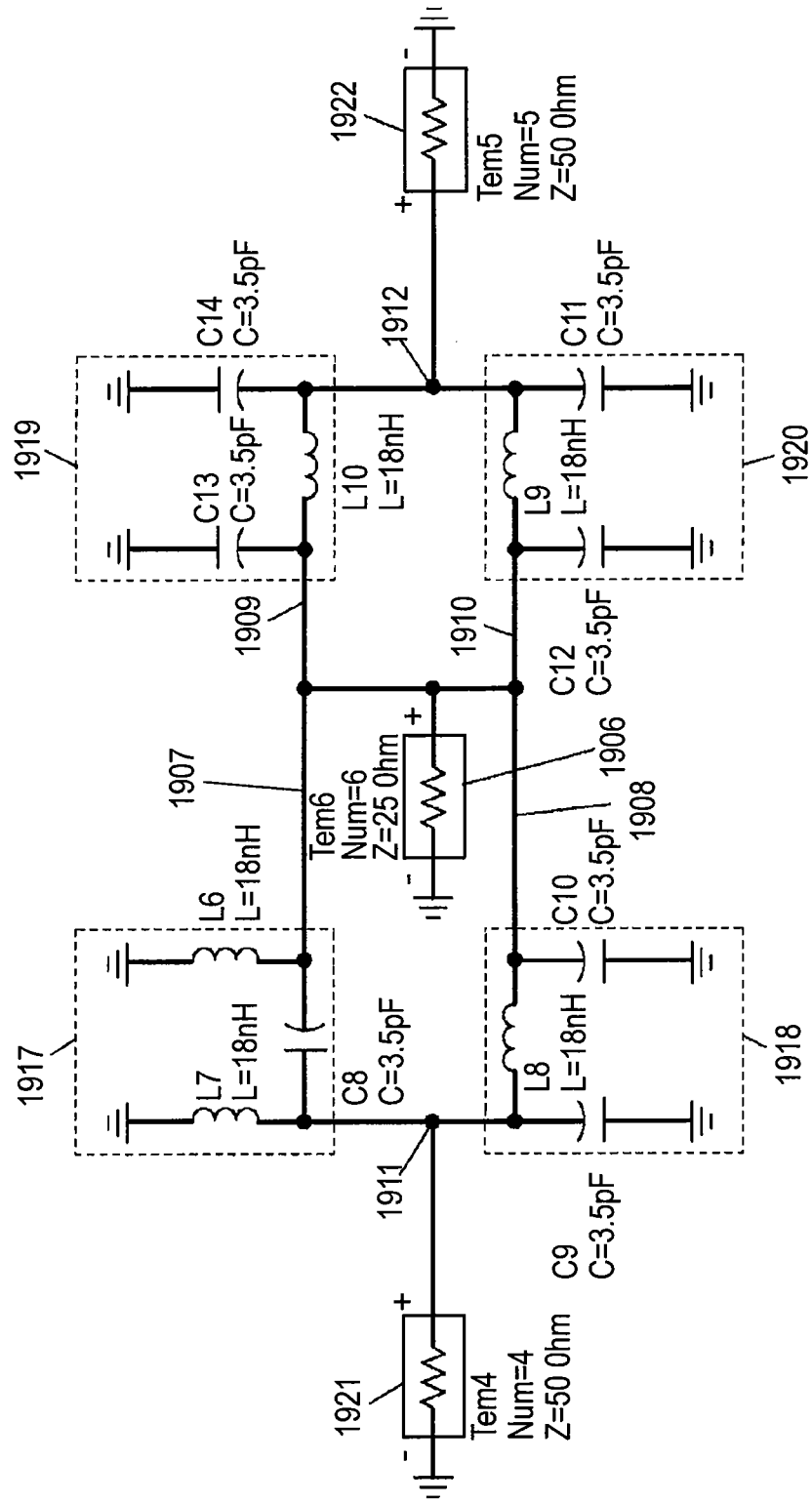
FIG. 34 is a diagram showing an example in which a signal transmitting system according to Embodiment 12 is designed at 620 MHz.

FIG. 33 shows a case in which a differential mode signal is transmitted to two-terminal-pair line 1906, and FIG. 34 shows a case in which a common mode signal is transmitted to two-terminal-pair line 1906.

When a differential mode signal is transmitted on two-terminal-pair line 1906, an input impedance of first transmission line 1934 when viewed from first terminal 1902 and an input impedance of second transmission line 1935 when viewed from second terminal 1903 are connected in series with each other. For this reason, an input impedance of two-terminal-pair line 1906 when viewed from first terminal 1902 and second terminal 1903 is 100 Ω.

When two-terminal-pair line 1906 transmits a common mode signal, an input impedance of first transmission line 1934 when viewed from first terminal 1902 and an input impedance of second transmission line 1935 when viewed from second terminal 1903 are connected in parallel with each other. For this reason, an input impedance of two-terminal-pair line 1906 when viewed from first terminal 1902 and second terminal 1903 is 25 Ω.

Since the above facts are reflected on the design, the input impedance of two-terminal-pair line 1906 (port number 3) in FIG. 33 is 100Ω, and an input impedance of two-terminal-pair line 1906 (port number 6) in FIG. 34 is 25 Ω.

Since a general high-frequency circuit is designed at 50Ω, first load circuit 1921 (port number 1) and second load circuit 1922 (port number 2) in FIG. 33, first load circuit 1921 (port number 4) in FIG. 34, and second load circuit 1922 (port number 5) are designed such that the input impedances of these circuits are 50Ω each. In FIGS. 33 and 34, first phase shifter 1917, second phase shifter 1918, third phase shifter 1919, and fourth shifter 1920 are realized by reactance elements of the three elements.

Figure 35:
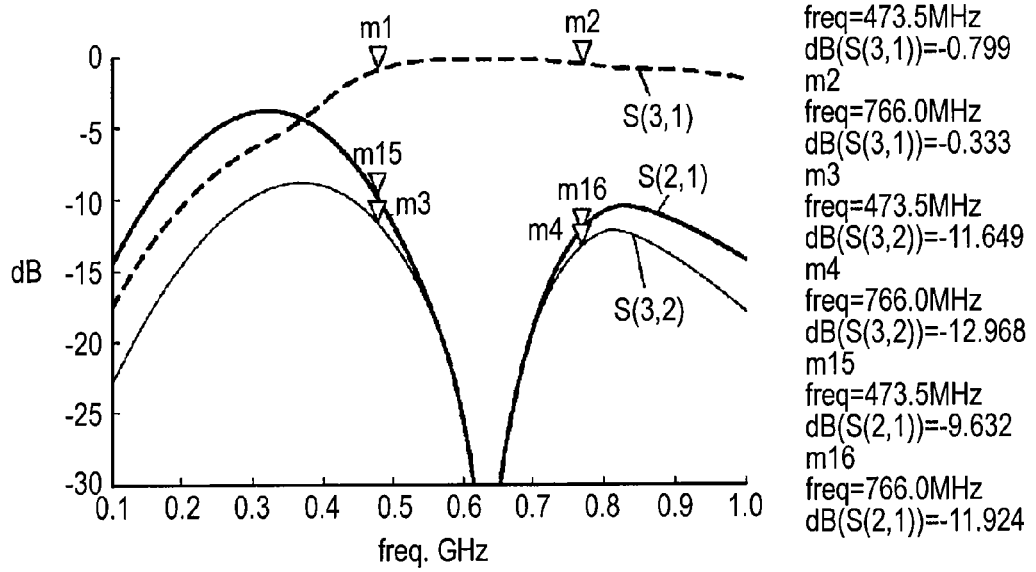
FIG. 35 is a graph showing an example in which a signal transmitting system according to Embodiment 12 is designed at 620 MHz.

FIG. 35 shows the passing characteristic between two-terminal-pair line 1906 (port number 3), first load circuit 1921 (port number 1), and second load circuit 1922 (port number 2) when two-terminal-pair line 1906 shown in FIG. 33 is caused to transmit a differential mode signal. In FIG. 35, for example, S(3,1) denotes a passing characteristic from first load circuit 1921 (port number 1) to two-terminal-pair line 1906 (port number 3). As is apparent from FIG. 35, passing characteristic S(3,1) from first load circuit 1921 (port number 1) to two-terminal-pair line 1906 (port number 3) is almost 0 dB at 620 MHz, and a conduction state is set.

In contrast to this, passing characteristic S(3,2) from second load circuit 1922 (port number 2) to two-terminal-pair line 1906 (port number 3) is −30 dB or less at 620 MHz, and it is understood that high isolation can be obtained. Passing characteristic S(2,1) from first load circuit 1921 (port number 1) to second load circuit 1922 (port number 2) is also −30 dB or less at 620 MHz, and it is understood that high isolation can be obtained.

Figure 36:
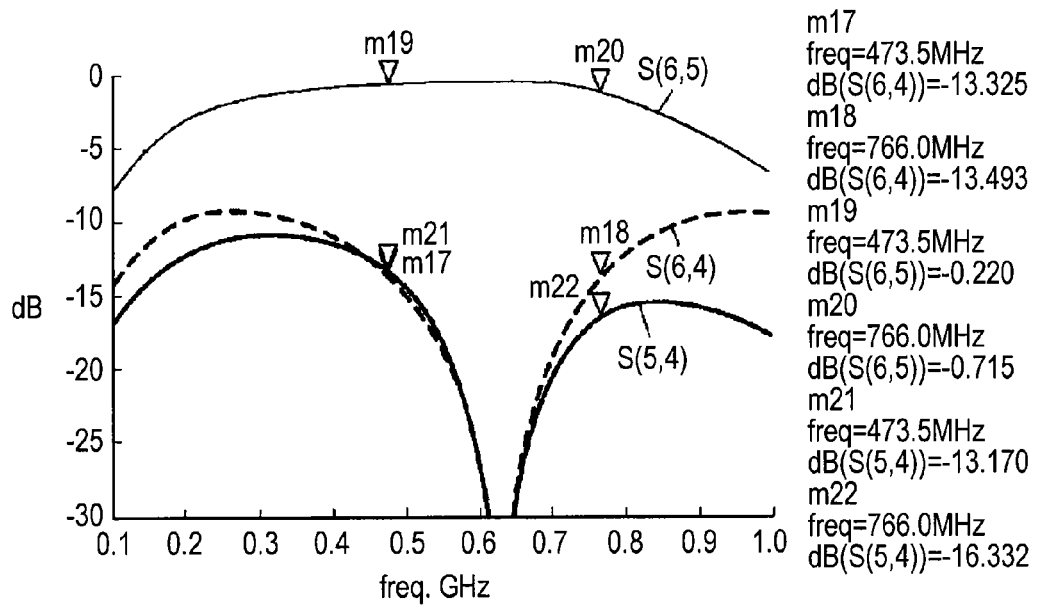
FIG. 36 is a graph showing an example in which a signal transmitting system according to Embodiment 12 is designed at 620 MHz.
Figure 37:
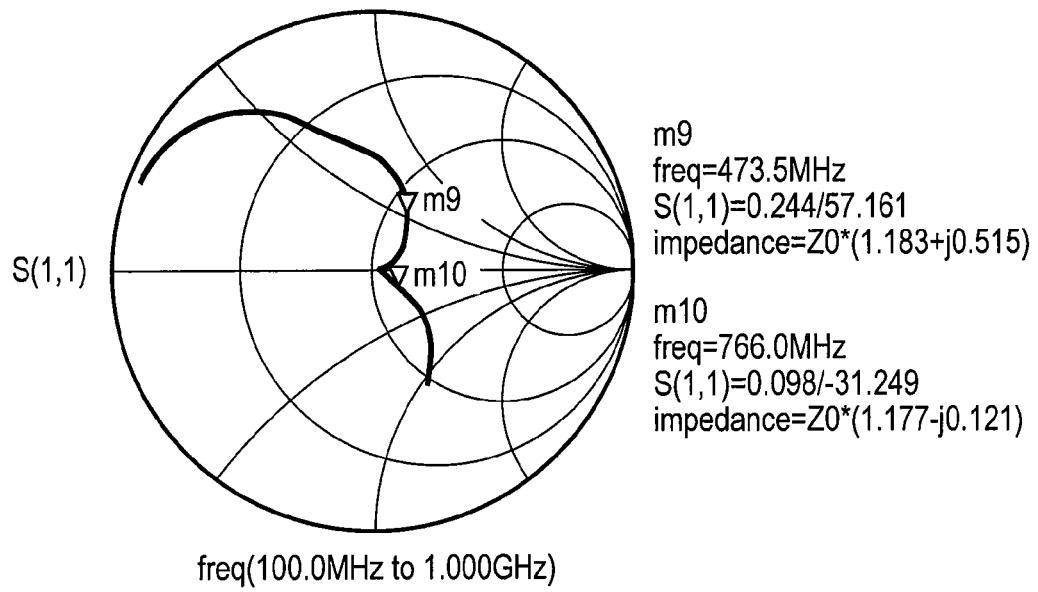
FIG. 37 is a diagram showing an example in which a signal transmitting system according to Embodiment 12 is designed at 620 MHz.
Figure 38:
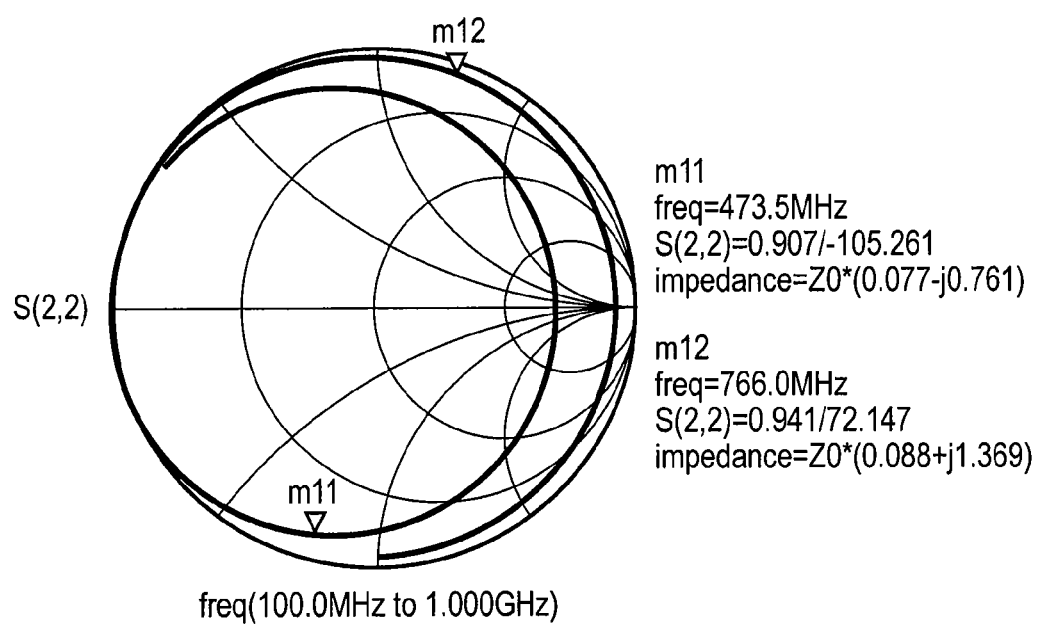
FIG. 38 is a diagram showing an example in which a signal transmitting system according to Embodiment 12 is designed at 620 MHz.
Figure 39:
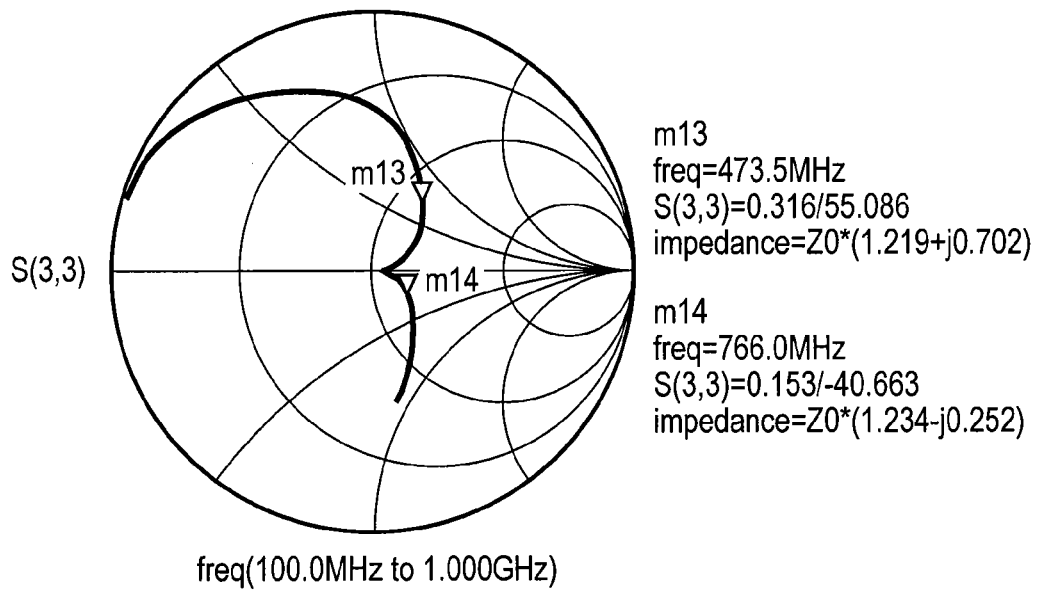
FIG. 39 is a diagram showing an example in which a signal transmitting system according to Embodiment 12 is designed at 620 MHz.
Figure 40:
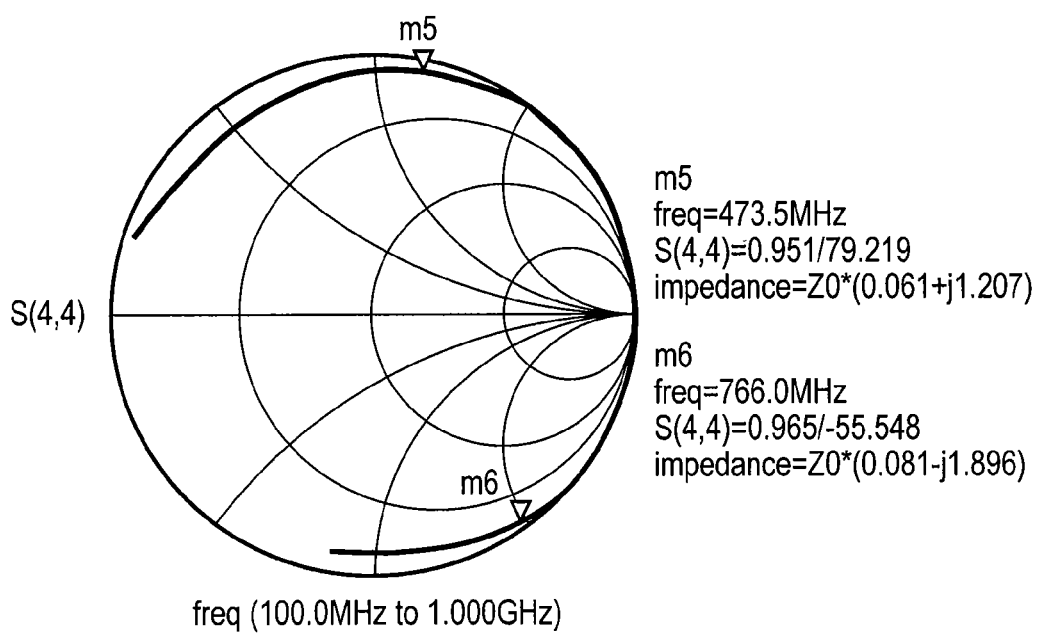
FIG. 40 is a diagram showing an example in which a signal transmitting system according to Embodiment 12 is designed at 620 MHz.
Figure 41:
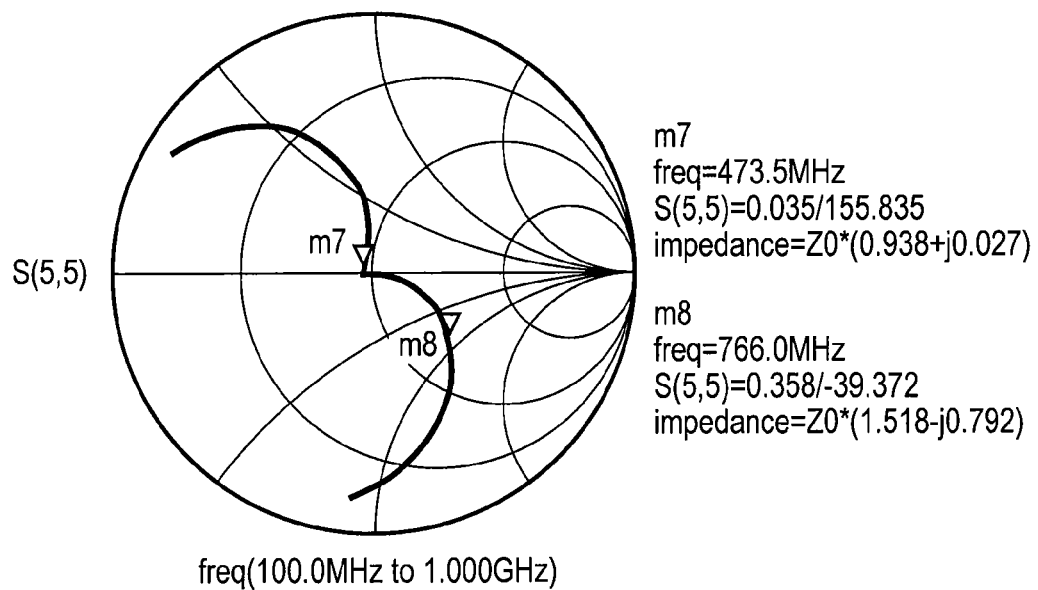
FIG. 41 is a diagram showing an example in which a signal transmitting system according to Embodiment 12 is designed at 620 MHz.
Figure 42:
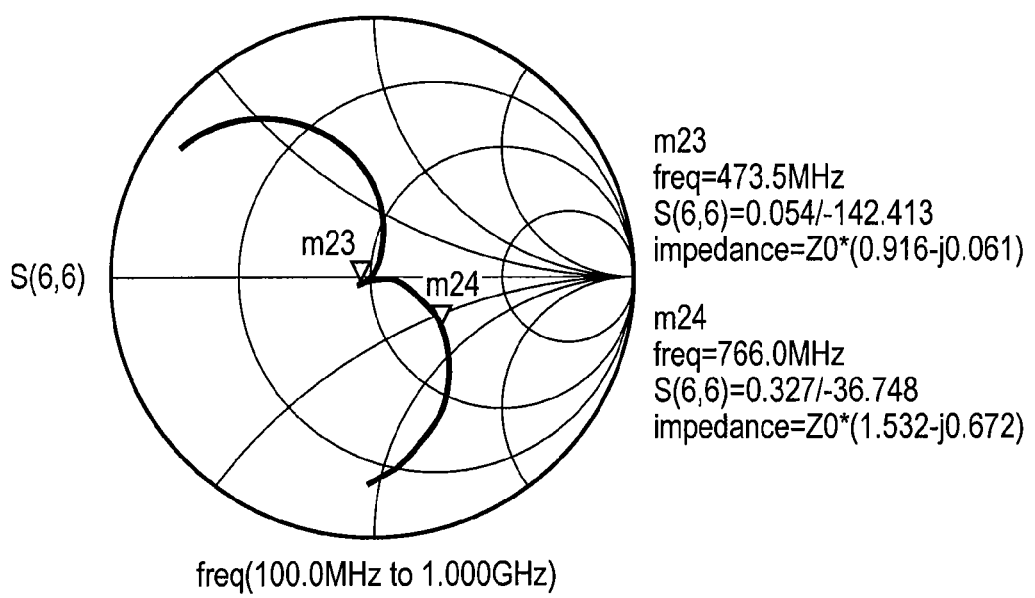
FIG. 42 is a diagram showing an example in which a signal transmitting system according to Embodiment 12 is designed at 620 MHz.
Figure 43:
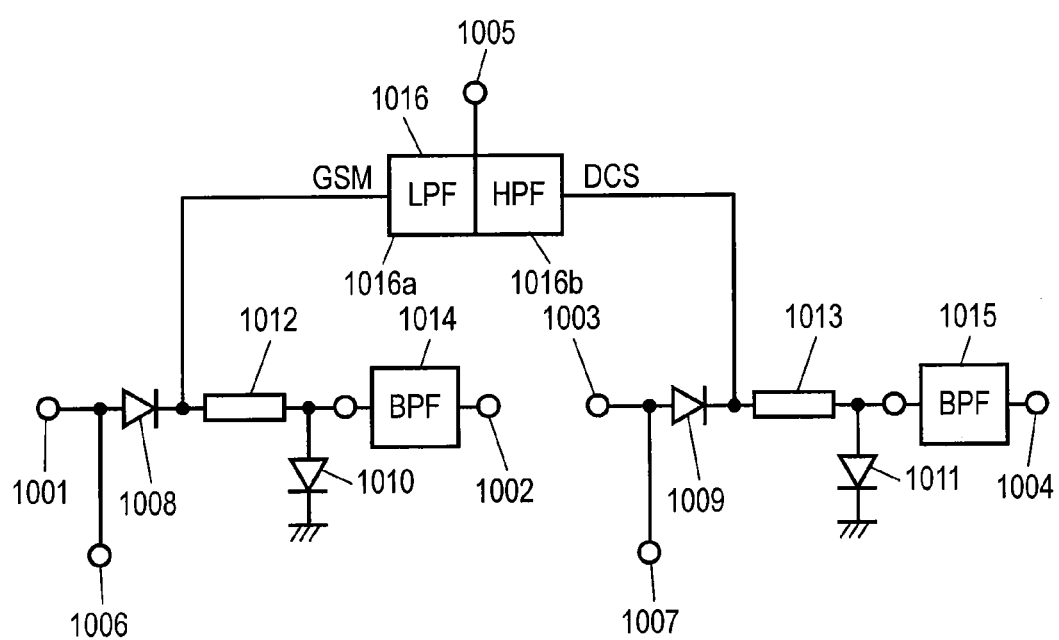
FIG. 43 is a block diagram of a conventional switch duplexer.

FIG. 36 shows the passing characteristic between two-terminal-pair line 1906 (port number 6), first load circuit 1921 (port number 4), and second load circuit 1922 (port number 5) when two-terminal-pair line 1906 shown in FIG. 34 is caused to transmit a common mode signal. In FIG. 36, for example, S(6,4) denotes a passing characteristic from first load circuit 1921 (port number 4) to two-terminal-pair line 1906 (port number 6). As is apparent from FIG. 36, passing characteristic S(6,5) from second load circuit 1922 (port number 5) to two-terminal-pair line 1906 (port number 6) is almost 0 dB at 620 MHz, and a conduction state is set. In contrast to this, passing characteristic S(6,4) from first load circuit 1921 (port number 4) to two-terminal-pair line 1906 (port number 6) is −30 dB or less at 620 MHz, and it is understood that high isolation can be obtained. Passing characteristic S(5,4) from first load circuit 1921 (port number 4) to second load circuit 1922 (port number 5) is also −30 dB or less at 620 MHz, and it is understood that high isolation can be obtained.

As described above, it can be understood that an operation of the antenna apparatus described in FIGS. 28 to 32 can be actually realized. For reference, in FIGS. 37 to 42, impedance characteristics at the ports of port number 1 to port number 6. In FIGS. 37 to 42, for example, S(1,1) denotes an input impedance characteristic when the first node 1911 side is viewed from first load circuit 1921 in FIG. 33.

Signal transmitting system 1901 according to Embodiment 12 of the present invention may be designed such that characteristic impedances of a first line, a second line, a third line, and a fourth line are Zo each, and an input impedance viewed from a first node of a first load circuit connected to the first node, an input impedance viewed from a second node of a second load circuit connected to the second node, an input impedance of a first transmission line viewed from the first terminal, and an input impedance of a second transmission line viewed from the second terminal are almost Zo/2 each. For this reason, impedance matching between two-terminal-pair line 1906, first signal branching filter 1930, and first load circuit 1921 or second load circuit 1922 can be easily obtained, and a reflection loss can be reduced.

FIGS. 33 and 34 satisfy the above impedance relations. As a result, as shown in FIGS. 35 to 42, preferable electric characteristics can be realized.

The first load circuit, the second load circuit, the third load circuit, and the fourth load circuit in Embodiments 9 to 11 described above actually represent communication circuits which receive and transmit signals and signal processing units, and are mounted on mounting boards or the like installed in electronic appliances. The "signal processing unit" mentioned here represents, for example, a circuit which performs demodulation, amplification, band limiting, frequency conversion, and the like to a signal to be transmitted or a circuit which performs amplification, band limiting, frequency conversion, and the like to a received signal to receive a signal and performs an operation such as data extraction after demodulation.

In FIGS. 26 to 28, first line 1907 serving as one line, one first matching circuit 1913, and one first phase shifter 1917 are arranged between first terminal 1902 and first node 1911. However, a plurality of lines, a plurality of matching circuits, and a plurality of phase shifting circuit may be arranged between first terminal 1902 and first node 1911. This is also applied to configurations between second terminal 1903 and first node 1911, between third terminal 1904 and second node 1912, and between fourth terminal 1905 and second node 1912. The "first line", the "second line", the "third line, and the "fourth line" include lines each configured by a plurality of lines. Similarly, the "first matching circuit", the "second matching circuit", the "third matching circuit", and the "fourth matching circuit" include matching circuits each configured by a plurality of matching circuits, and the "first phase shifter", the "second phase shifter", the "third phase shifter, and the "fourth phase shifter" include phase shifters each configured by a plurality of phase shifters.

INDUSTRIAL APPLICABILITY

As described above, the antenna apparatus using the signal branching filter according to the present invention can generally obtain isolation between the first node and the second node. For this reason, the first node and the second node can mutually independently perform signal exchanges through the antenna element. Therefore, a diversity antenna which can transmit/receive signals each having the same frequency for the same time can be realized. The diversity antenna can be used in a compact mobile communication terminal or the like.

Furthermore, as described above, the signal transmitting system using the signal branching filter according to the present invention can transmit/receive signals each having the same frequency for the same time by using one two-terminal-pair line. The signal transmitting system can be used in a communication apparatus or the like which is needed to be improved in data transmission quantity.

The invention claimed is:

1. A signal branching filter comprising:
a first line one end of which is connected to a first terminal;
a third line one end of which is connected to the first terminal;
a second line one end of which is connected to a second terminal; and
a fourth line one end of which is connected to the second terminal, wherein
the other end of the first line and the other end of the second line are connected to a first node,
the other end of the third line and the other end of the fourth line are connected to a second node, and
when a signal is received from the first node,
a phase difference between a phase of a signal appearing on the second node side of the third line and a phase of a signal appearing on the second node side of the fourth line is 180°.

2. The signal branching filter according to claim 1, wherein the first terminal and the second terminal are connected to a network.

3. An antenna apparatus comprising
the signal branching filter according to claim 2, wherein
the network is an antenna element having the first terminal and the second terminal.

4. The antenna apparatus according to claim 3, wherein
the antenna element has an axisymmetrical shape or a plane-symmetrical shape to a second straight line or a first plane both of which connect at a middle point that exists between the first terminal and the second terminal on a first straight line and is perpendicular to the first straight line.

5. The antenna apparatus according to claim 3, wherein
characteristic impedances of the first line, the second line, the third line, and the fourth line are Zo each, and
an input impedance viewed from the first node of a first load circuit connected to the first node,
an input impedance viewed from the second node of a second load circuit connected to the second node,
an input impedance of the antenna element viewed from the first terminal, and
an input impedance of the antenna element viewed from the second terminal are Zo/2 each.

6. The signal branching filter according to claim 1, wherein
an absolute value of an amplitude of a signal which corresponds to the signal received from the first node and appears on the second node side of the third line and an absolute value of an amplitude of a signal which corresponds to the signal received from the first node and appears on the second node side of the fourth line are equal to each other.

7. The signal branching filter according to claim 1, wherein
when a phase of a signal inputted to the first terminal is same as a phase of a signal inputted to the second terminal, and an amplitude of the signal inputted to the first terminal is same as an amplitude of the signal inputted to the second terminal,
a phase difference between a phase of a signal appearing on the first node side of the first line and a phase of a signal appearing on the first node side of the second line is 180.

8. The signal branching filter according to claim 1, wherein
when a phase of a signal inputted to the first terminal is same as a phase of a signal inputted to the second terminal, and an amplitude of the signal inputted to the first terminal is same as an amplitude of the signal inputted to the second terminal,
an absolute value of an amplitude of a signal appearing on the first node side of the first line and an absolute value of an amplitude of a signal appearing on the first node side of the second line are equal to each other.

9. An electronic appliance comprising:
the signal branching filter according to claim 1;
a network connected to the signal branching filter; and
a signal processing unit connected to the signal branching filter.

10. A signal branching filter comprising:
a first line one end of which is connected to a first terminal;
a third line one end of which is connected to the first terminal;
a second line one end of which is connected to a second terminal; and a fourth line one end of which is connected to the second terminal, wherein the other end of the first line and the other end of the second line are connected to a first node, the other end of the third line and the other end of the fourth line are connected to a second node, when a signal is received from the first node, a phase difference between a phase of a signal appearing on the second node side of the third line and a phase of a signal appearing on the second node side of the fourth line is 180°, a change in phase from the first terminal to the first node is 90°±360°*n (n is an integer equal to or larger than 0), and a change in phase from the second terminal to the first node is −90°±360°*n (n is an integer equal to or larger than 0).

11. A signal branching filter comprising:

a first line one end of which is connected to a first terminal;

a third line one end of which is connected to the first terminal;

a second line one end of which is connected to a second terminal; and a fourth line one end of which is connected to the second terminal, wherein the other end of the first line and the other end of the second line are connected to a first node, the other end of the third line and the other end of the fourth line are connected to a second node, when a signal is received from the first node, a phase difference between a phase of a signal appearing on the second node side of the third line and a phase of a signal appearing on the second node side of the fourth line is 180°, a change in phase from the first terminal to the second node is +90°±180°*n (n is an integer equal to or larger than 0), and a change in phase from the second terminal to the second node is +90°±180°*n (n is an integer equal to or larger than 0).

12. A signal branching filter comprising:

a first line one end of which is connected to a first terminal;

a third line one end of which is connected to the first terminal;

a second line one end of which is connected to a second terminal; and a fourth line one end of which is connected to the second terminal, wherein the other end of the first line and the other end of the second line are connected to a first node, the other end of the third line and the other end of the fourth line are connected to a second node, when a signal is received from the first node, a phase difference between a phase of a signal appearing on the second node side of the third line and a phase of a signal appearing on the second node side of the fourth line is 180°, and when signals having a phase difference of 180° and each having the same amplitude are inputted to the first terminal and the second terminal, respectively, an absolute value of an amplitude of a signal appearing on the second node side of the third line and an absolute value of an amplitude of a signal appearing on the second node side of the fourth line are equal to each other.

* * * * *